United States Patent
Hsiung et al.

(10) Patent No.: US 11,581,218 B2
(45) Date of Patent: Feb. 14, 2023

(54) ETCH PROFILE CONTROL OF GATE CONTACT OPENING

(71) Applicant: TAIWAN SEMICONDUCTOR MANUFACTURING CO., LTD., Hsinchu (TW)

(72) Inventors: Te-Chih Hsiung, Taipei (TW); Jyun-De Wu, New Taipei (TW); Peng Wang, Hsinchu (TW); Huan-Just Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 35 days.

(21) Appl. No.: 17/196,686

(22) Filed: Mar. 9, 2021

(65) Prior Publication Data

US 2022/0102199 A1 Mar. 31, 2022

Related U.S. Application Data

(60) Provisional application No. 63/084,997, filed on Sep. 29, 2020.

(51) Int. Cl.
| | |
|---|---|
| *H01L 21/768* | (2006.01) |
| *H01L 23/535* | (2006.01) |
| *H01L 29/78* | (2006.01) |
| *H01L 29/06* | (2006.01) |
| *H01L 29/786* | (2006.01) |
| *H01L 21/311* | (2006.01) |
| *H01L 29/423* | (2006.01) |

(52) U.S. Cl.
CPC .. *H01L 21/76805* (2013.01); *H01L 21/31116* (2013.01); *H01L 21/76825* (2013.01); *H01L 21/76828* (2013.01); *H01L 21/76895* (2013.01); *H01L 23/535* (2013.01); *H01L 29/0673* (2013.01); *H01L 29/42392* (2013.01); *H01L 29/7851* (2013.01); *H01L 29/78696* (2013.01)

(58) Field of Classification Search
CPC ......... H01L 29/41775; H01L 29/42376; H01L 21/76825
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |

(Continued)

*Primary Examiner* — Changhyun Yi
(74) *Attorney, Agent, or Firm* — Maschoff Brennan

(57) ABSTRACT

A method comprises forming a gate structure between gate spacers; etching back the gate structure to fall below top ends of the gate spacers; forming a gate dielectric cap over the etched back gate structure; performing an ion implantation process to form a doped region in the gate dielectric cap; depositing a contact etch stop layer over the gate dielectric cap and an ILD layer over the contact etch stop layer; performing a first etching process to form a gate contact opening extending through the ILD layer and terminating prior to reaching the doped region of the gate dielectric cap; performing a second etching process to deepen the gate contact opening, wherein the second etching process etches the doped region of the gate dielectric cap at a slower etch rate than etching the contact etch stop layer; and forming a gate contact in the deepened gate contact opening.

20 Claims, 49 Drawing Sheets

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2021/0233847 A1* | 7/2021 | Kim .................. H01L 23/535 |

* cited by examiner

ETCH PROFILE CONTROL OF GATE CONTACT OPENING

PRIORITY CLAIM AND CROSS-REFERENCE

This application claims priority to U.S. Provisional Application Ser. No. 63/084,997, filed Sep. 29, 2020, which is herein incorporated by reference.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
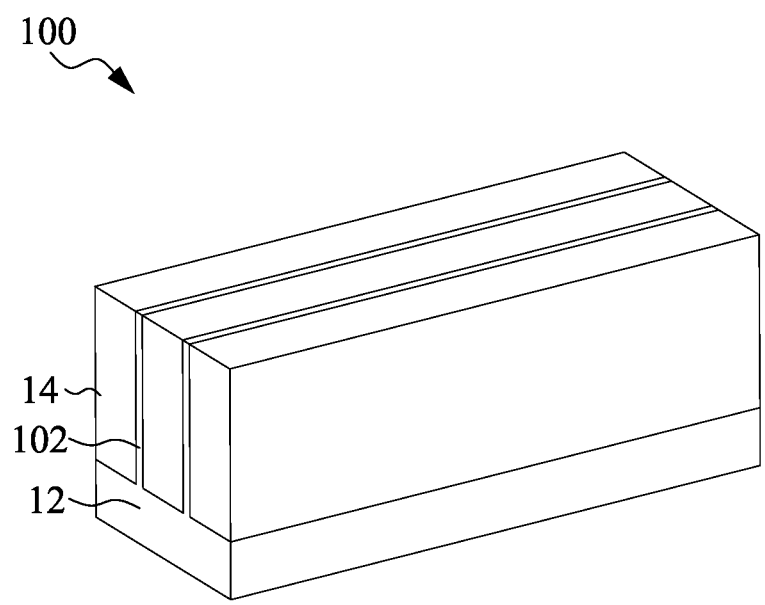
FIGS. 1 through 20B illustrate perspective views and cross-sectional views of intermediate stages in the formation of an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit structures and methods of forming the same, and more particularly to fabricating transistors (e.g., fin field-effect transistors (FinFETs), gate-all-around (GAA) transistors) and gate contacts over gate structures of the transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFETs, on account of their fin-like structure. A FinFET has a gate structure formed on three sides of a channel region (e.g., wrapping around an upper portion of a channel region in a semiconductor fin). Also presented herein are embodiments of a type of multi-gate transistor referred to as a GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration.

After a front-end-of-line (FEOL) processing for fabricating transistors is completed, gate contacts are formed over the gate structures of the transistors. Formation of the gate contacts generally includes, by way of example and not limitation, depositing an interlayer dielectric (ILD) layer over gate dielectric caps capping the high-k/metal gate (HKMG) structures, forming gate contact openings extending through the ILD layer and the gate dielectric caps by using one or more etching processes, and then depositing one or more metal layers in the gate contact openings to serve as the gate contacts.

In some embodiments, an additional etch stop layer (also called middle contact etch stop layer (MCESL)) is blanket formed over the gate dielectric caps prior to formation of the ILD layer. The MCESL has a different etch selectivity than the ILD layer, and thus the MCESL can slow down the etching process of etching through the ILD layer. After performing a contact etching process to form gate contact openings extending through the ILD layer, another etching process (sometimes called liner removal (LRM) etching because the MCESL and gate dielectric caps may in combination serve as a liner over top surfaces of gate structures) is performed to break through the MCESL and gate dielectric caps.

The contact etching process may form the gate contact openings with different sizes depending on circuit functions and/or design rules. Alternatively, the size difference of gate contact openings may be inadvertently formed due to inaccuracies of contact etching process. The size difference formed in the contact etching process may result in that wider gate contact openings extend deeper into the MCESL than the narrower gate contact openings. This difference in depths of the openings is called a depth loading issue.

Because of the depth loading issue, the wider gate contact openings may sometimes punch through the MCESL and even the gate dielectric caps before performing the LRM etching process. Therefore, the LRM etching process may further deepen the wider gate contact openings into, e.g., gate spacers alongside the gate structures, resulting in a tiger tooth-like recess in the gate spacers, which in turn leads to an increased risk of leakage current (e.g., leakage current from gate contacts to source/drain contacts). Moreover, the narrower gate contact openings may sometimes have a more tapered profile than the wider gate contact openings due to the depth loading, which in turn leads to a reduced gate contact area and hence an increased contact resistance.

Therefore, the present disclosure in various embodiments provides an additional ion implantation step performed on the gate dielectric caps. The ion implantation step creates doped regions in the gate dielectric caps with a different material composition and hence a different etch selectivity than un-doped regions in the gate dielectric caps. The doped regions thus allow for slowing down the LRM etching process when gate contact openings reach the doped regions. Slowing down the LRM etching can prevent the tiger-tooth like pattern formed in the larger opening, which in turn reduces the risk of leakage current. Moreover, slowing down the LRM etching allows for forming contact openings with a more vertical profile, which in turn results in an increased the gate contact area and hence a decreased contact resistance.

FIGS. 1 through 20B illustrate perspective views and cross-sectional views of intermediate stages in the formation of an integrated circuit structure 100 in accordance with some embodiments of the present disclosure. The formed transistors may include a p-type transistor (such as a p-type FinFET) and an n-type transistor (such as an n-type FinFET) in accordance with some exemplary embodiments. Throughout the various views and illustrative embodiments, like reference numbers are used to designate like elements. It is understood that additional operations can be provided before, during, and after the processes shown by FIGS. 1-20B, and some of the operations described below can be replaced or eliminated, for additional embodiments of the method. The order of the operations/processes may be interchangeable.

FIG. 1 illustrates a perspective view of an initial structure. The initial structure includes a substrate 12. The substrate 12 may be a semiconductor substrate (also called wafer in some embodiments), which may be a silicon substrate, a silicon germanium substrate, or a substrate formed of other semiconductor materials. In accordance with some embodiments of the present disclosure, the substrate 12 includes a bulk silicon substrate and an epitaxy silicon germanium (SiGe) layer or a germanium layer (without silicon therein) over the bulk silicon substrate. The substrate 12 may be doped with a p-type or an n-type impurity. Isolation regions 14 such as shallow trench isolation (STI) regions may be formed to extend into the substrate 12. The portions of substrate 12 between neighboring STI regions 14 are referred to as semiconductor strips 102.

STI regions 14 may include a liner oxide (not shown). The liner oxide may be formed of a thermal oxide formed through a thermal oxidation of a surface layer of substrate 12. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 14 may also include a dielectric material over the liner oxide, and the dielectric material may be formed using flowable chemical vapor deposition (FCVD), spin-on coating, or the like.

Figure 2:
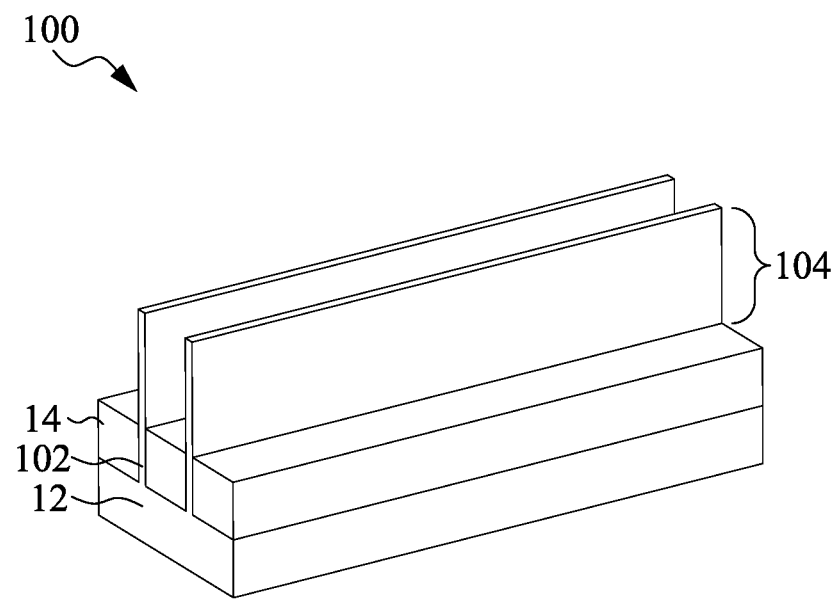

Referring to FIG. 2, the STI regions 14 are recessed, so that the top portions of semiconductor strips 102 protrude higher than the top surfaces of the neighboring STI regions 14 to form protruding fins 104. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the STI regions 14 is performed using a wet etch process. The etching chemical may include diluted HF, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 104 may also be replaced with materials different from that of substrate 12. For example, if the protruding fins 104 serve for n-type transistors, protruding fins 104 may be formed of Si, SiP, SiC, SiPC, or a III-V compound semiconductor such as InP, GaAs, AlAs, InAs, InAlAs, InGaAs, or the like. On the other hand, if the protruding fins 104 serve for p-type transistors, the protruding fins 104 may be formed of Si, SiGe, SiGeB, Ge, or a III-V compound semiconductor such as InSb, GaSb, InGaSb, or the like.

Figure 3A:
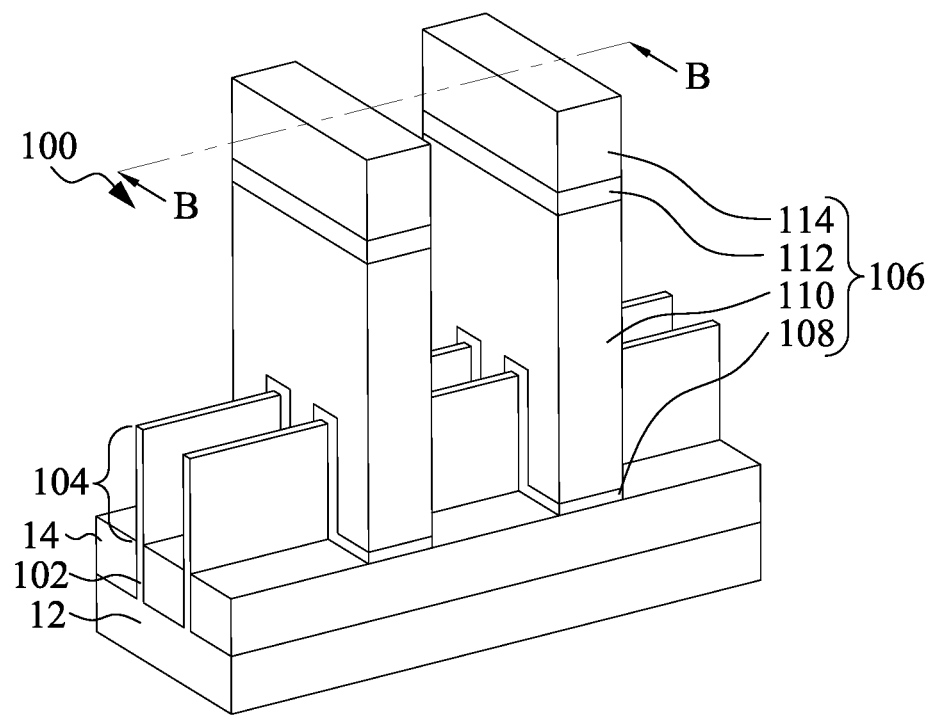
Figure 3B:
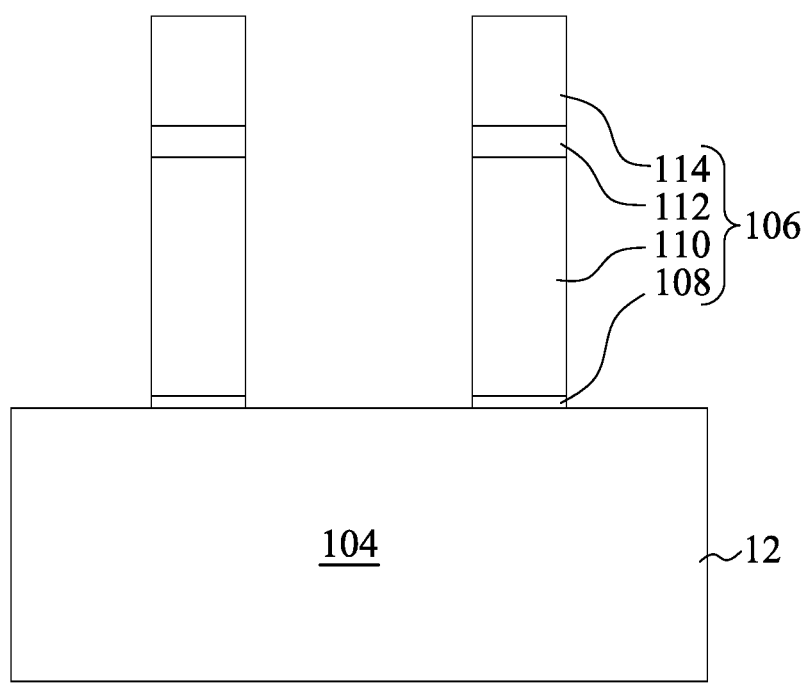

Referring to FIGS. 3A and 3B, dummy gate structures 106 are formed on the top surfaces and the sidewalls of protruding fins 104. FIG. 3B illustrates a cross-sectional view obtained from a vertical plane containing line B-B in FIG. 3A. Formation of the dummy gate structures 106 includes depositing in sequence a gate dielectric layer and a dummy gate electrode layer across the fins 104, followed by patterning the gate dielectric layer and the dummy gate electrode layer. As a result of the patterning, the dummy gate structure 106 includes a gate dielectric layer 108 and a dummy gate electrode 110 over the gate dielectric layer 108. The gate dielectric layers 108 can be any acceptable dielectric layer, such as silicon oxide, silicon nitride, the like, or a combination thereof, and may be formed using any acceptable process, such as thermal oxidation, a spin process, CVD, or the like. The dummy gate electrodes 110 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate structures 106 crosses over a single one or a plurality of protruding fins 104. Dummy gate structures 106 may have lengthwise directions perpendicular to the lengthwise directions of the respective protruding fins 104.

A mask pattern may be formed over the dummy gate electrode layer to aid in the patterning. In some embodiments, a hard mask pattern including bottom masks 112 over a blanket layer of poly silicon and top masks 114 over the bottom masks 112. The hard mask pattern is made of one or more layers of $SiO_2$, SiCN, SiON, $Al_2O_3$, SiN, or other suitable materials. In certain embodiments, the bottom masks 112 include silicon nitride, and the top masks 114 include silicon oxide. By using the mask pattern as an etching mask, the dummy electrode layer is patterned into the dummy gate electrodes 110, and the blanket gate dielectric layer is patterned into the gate dielectric layers 108.

Figure 4:
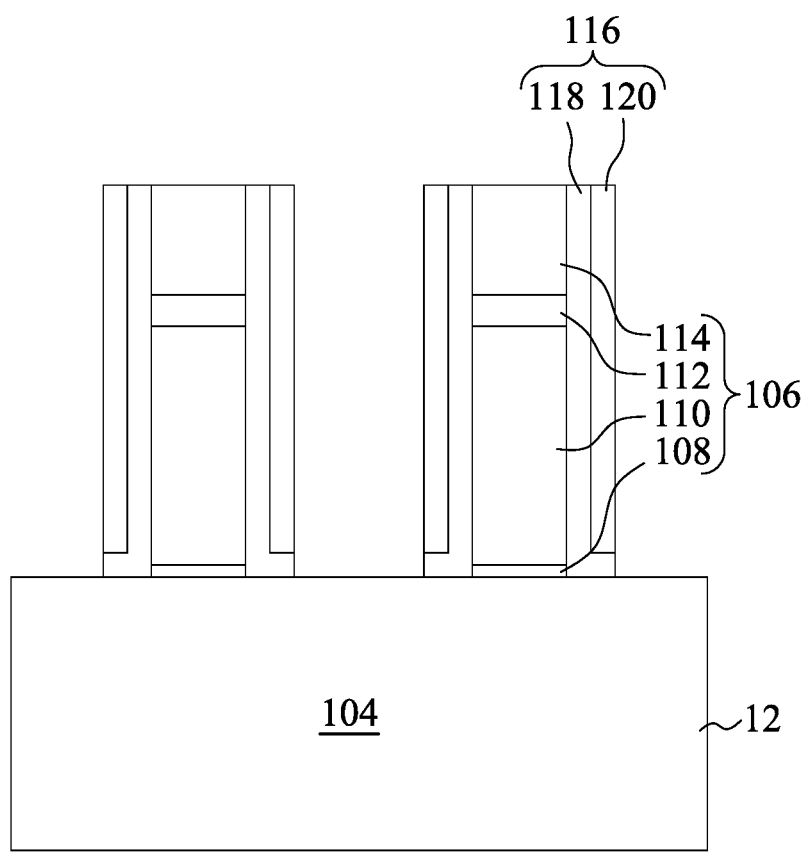

Next, as illustrated in FIG. 4, gate spacers 116 formed on sidewalls of the dummy gate structures 106. In some embodiments of the gate spacer formation step, a spacer material layer is deposited on the substrate 12. The spacer material layer may be a conformal layer that is subsequently etched back to form gate sidewall spacers 116. In some embodiments, the spacer material layer includes multiple layers, such as a first spacer layer 118 and a second spacer layer 120 formed over the first spacer layer 118. The first and second spacer layers 118 and 120 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 118 and 120 may be formed by depositing in sequence two different dielectric materials over the dummy gate structures 106 using processes such as, CVD process, a subatmospheric CVD (SACVD) process, a flowable CVD process, an ALD process, a PVD process, or other suitable process. An anisotropic etching process is then performed on the deposited spacer layers 118 and 120 to expose portions of the fins 104 not covered by the dummy gate structures 106 (e.g., in source/drain regions of the fins 104). Portions of the spacer layers 116 and 118 directly above the dummy gate structures 106 may be completely removed by this anisotropic etching process. Portions of the spacer layer 118 and 120 on sidewalls of the dummy gate structures 106 may remain, forming gate sidewall spacers, which are denoted as the gate spacers 116, for the sake of simplicity. In some embodiments, the first spacer layer 118 is formed of silicon oxide that has a lower dielectric constant than silicon nitride, and the second spacer layer 120 is formed of silicon nitride that has a higher etch resistance against subsequent etching processing (e.g., etching source/drain recesses in the fin 104) than silicon oxide. In some embodiments, the gate sidewall spacers 116 may be used to offset subsequently formed doped regions, such as source/drain regions. The gate spacers 116 may further be used for designing or modifying the source/drain region profile.

Figure 5:
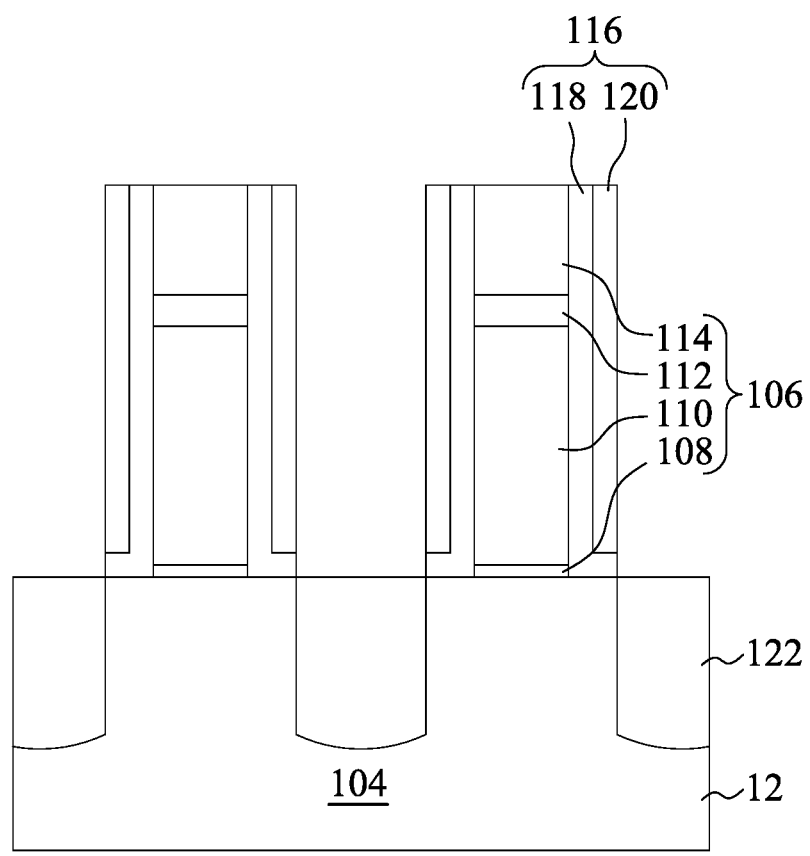

In FIG. 5, after formation of the gate sidewall spacers 116 is completed, source/drain epitaxial structures 122 are formed on source/drain regions of the fin 104 that are not covered by the dummy gate structures 106 and the gate sidewall spacers 116. In some embodiments, formation of the source/drain epitaxial structures 122 includes recessing source/drain regions of the fin 104, followed by epitaxially growing semiconductor materials in the recessed source/drain regions of the fin 104.

The source/drain regions of the fin 104 can be recessed using suitable selective etching processing that attacks the semiconductor fin 104, but hardly attacks the gate spacers 116 and the top masks 114 of the dummy gate structures 106. For example, recessing the semiconductor fin 104 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a wet chemical etch, such as ammonium peroxide mixture (APM), $NH_4OH$, tetramethylammonium hydroxide (TMAH), combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a combination of a dry chemical etch and a wet chemical etch.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the semiconductor fin 104. During the epitaxial growth process, the gate spacers 116 limit the one or more epitaxial materials to source/drain regions in the fin 104. In some embodiments, the lattice constants of the epitaxial structures 122 are different from the lattice constant of the semiconductor fin 104, so that the channel region in the fin 104 and between the epitaxial structures 122 can be strained or stressed by the epitaxial structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 104.

In some embodiments, the source/drain epitaxial structures 122 may include Ge, Si, GaAs, AlGaAs, SiGe, GaAsP, SiP, or other suitable material. The source/drain epitaxial structures 122 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 122 are not in-situ doped, an implantation process (i.e., a junction implant process) is performed to dope the source/drain epitaxial structures 122. In some exemplary embodiments, the source/drain epitaxial structures 122 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 122 are formed, an annealing process can be performed to activate the p-type dopants or n-type dopants in the source/drain epitaxial structures 122. The annealing process may be, for example, a rapid thermal anneal (RTA), a laser anneal, a millisecond thermal annealing (MSA) process or the like.

Figure 6:
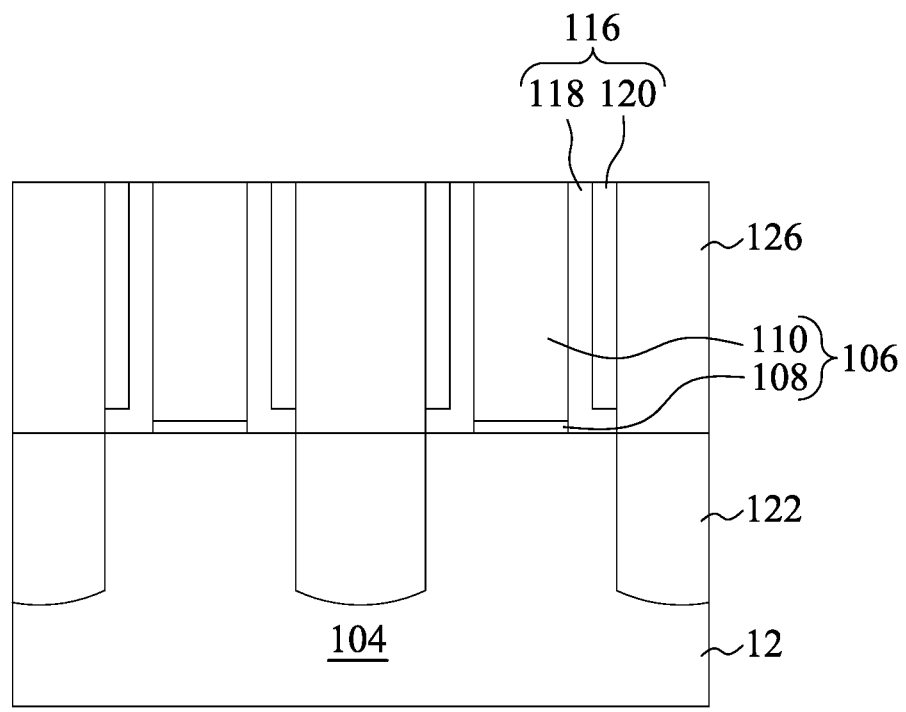

Next, in FIG. 6, an interlayer dielectric (ILD) layer 126 is formed on the substrate 12. In some embodiments, a contact etch stop layer (CESL) is optionally formed prior to forming the ILD layer 126. In some examples, the CESL includes a silicon nitride layer, silicon oxide layer, a silicon oxynitride layer, and/or other suitable materials having a different etch selectivity than the ILD layer 126. The CESL may be formed by plasma-enhanced chemical vapor deposition (PECVD) process and/or other suitable deposition or oxidation processes. In some embodiments, the ILD layer 126 includes materials such as tetraethylorthosilicate (TEOS) oxide, un-doped silicate glass, or doped silicon oxide such as boro-phosphosilicate glass (BPSG), fused silica glass (FSG), phosphosilicate glass (PSG), boron doped silicon glass (BSG), and/or other suitable dielectric materials having a different etch selectivity than the CESL. The ILD layer 126 may be deposited by a PECVD process or other suitable deposition technique. In some embodiments, after formation of the ILD layer 126, the wafer may be subject to a high thermal budget process to anneal the ILD layer 126.

In some examples, after forming the ILD layer 126, a planarization process may be performed to remove excessive materials of the ILD layer 126. For example, a planarization process includes a chemical mechanical planarization (CMP) process which removes portions of the ILD layer 126 (and CESL layer, if present) overlying the dummy gate structures 106. In some embodiments, the CMP process also removes hard mask layers 112, 114 (as shown in FIG. 5) and exposes the dummy gate electrodes 110.

Figure 7:
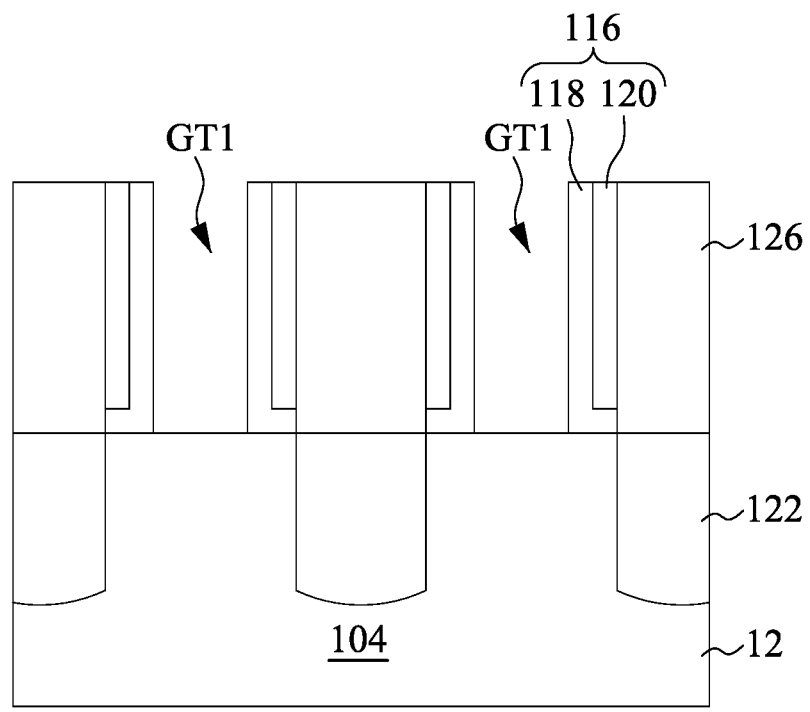

Next, as illustrates in FIG. 7, the remaining dummy gate structures 106 are removed, resulting in gate trenches GT1 between corresponding gate sidewall spacers 116. The dummy gate structures 106 are removed using a selective etching process (e.g., selective dry etching, selective wet etching, or a combination thereof) that etches materials in the dummy gate structures 106 at a faster etch rate than it etches other materials (e.g., gate sidewall spacers 116 and/or the ILD layer 126).

Figure 8:
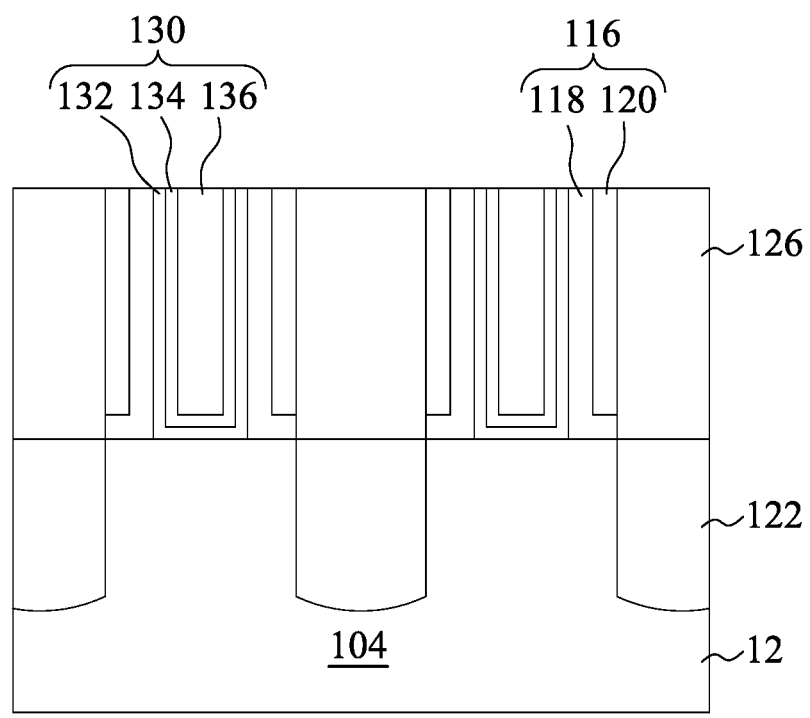

Thereafter, replacement gate structures 130 are respectively formed in the gate trenches GT1, as illustrated in FIG. 8. The gate structures 130 may be the final gates of FinFETs. The final gate structures each may be a high-k/metal gate (HKMG) stack, however other compositions are possible. In some embodiments, each of the gate structures 130 forms the gate associated with the three-sides of the channel region provided by the fin 104. Stated another way, each of the gate structures 130 wraps around the fin 104 on three sides. In various embodiments, the high-k/metal gate structure 130 includes a gate dielectric layer 132 lining the gate trench GT1, a work function metal layer 134 formed over the gate dielectric layer 132, and a fill metal 136 formed over the work function metal layer 134 and filling a remainder of gate trenches GT1. The gate dielectric layer 132 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 134 and/or fill metal layer 136 used within high-k/metal gate structures 130 may include a metal, metal alloy, or metal silicide. Formation of the high-k/metal gate structures 130 may include multiple deposition processes to form various gate materials, one or more liner layers, and one or more CMP processes to remove excessive gate materials.

In some embodiments, the interfacial layer of the gate dielectric layer 132 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 132 may include hafnium oxide ($HfO_2$). Alternatively, the gate dielectric layer 132 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 134 may include work function metals to provide a suitable work function for the high-k/metal gate structures 130. For an n-type FinFET, the work function metal layer 134 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 134 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 136 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 9:
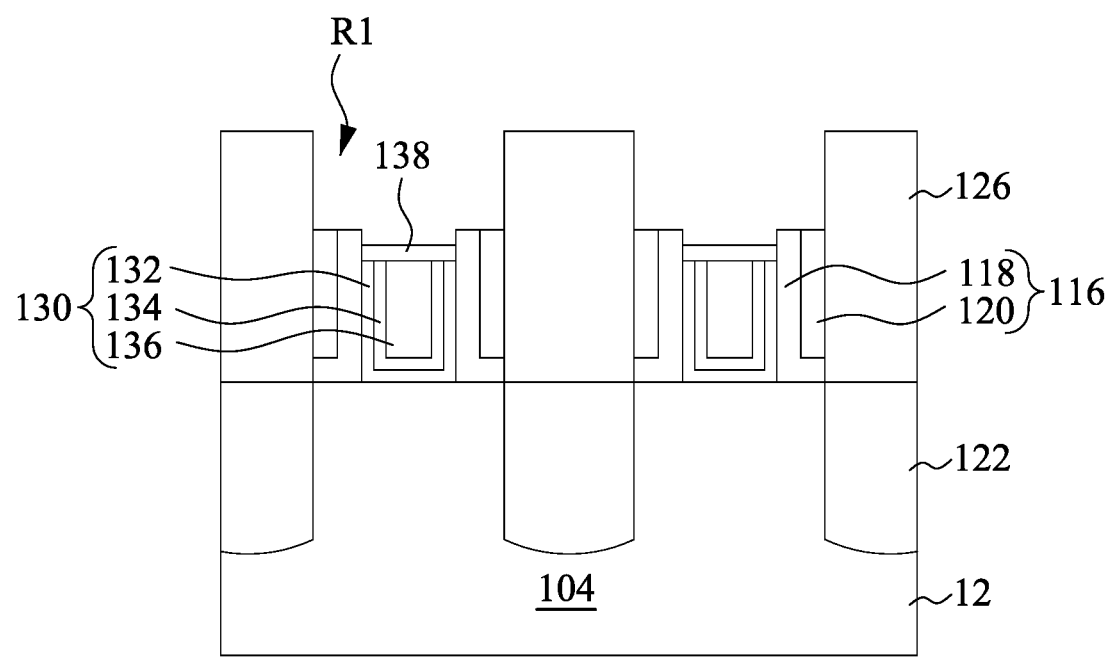

Reference is then made to FIG. 9. An etching back process is performed to etch back the replacement gate structures 130 and the gate spacers 116, resulting in recesses R1 over the etched-back gate structures 130 and the etched-back gate spacers 116. In some embodiments, because the materials of the replacement gate structures 130 have a different etch selectivity than the gate spacers 116, a first selective etching process may be initially performed to etch back the replacement gate structures 130, thus lowering the replacement gate structures 130 to fall below the gate spacers 116. Then, a second selective etching process is performed to lower the gate spacers 116. As a result, the top surfaces of the replacement gate structures 130 may be at a different level than the top surfaces of the gate spacers 116. For example, in the depicted embodiment as illustrated in FIG. 9, the replacement gate structures 130's top surfaces are lower than the top surfaces of the gate spacers 116. However, in some other embodiments, the top surfaces of the replacement gate structures 130 may be level with or higher than the top surfaces of the gate spacers 116.

Then, gate metal caps 138 are optionally formed respectively atop the replacement gate structures 130 by suitable process, such as CVD or ALD. In some embodiments, the metal caps 138 are formed on the replacement gate structures 130 using a bottom-up approach. For example, the metal caps 138 are selectively grown on the metal surface, such as the work function metal layer 134 and the fill metal 136, and thus the sidewalls of the gate spacers 116 are substantially free from the growth of the metal caps 138. The metal caps 138 may be, by way of example and not limitation, substantially fluorine-free tungsten (FFW) films having an amount of fluorine contaminants less than 5 atomic percent and an amount of chlorine contaminants greater than 3 atomic percent in some embodiments where the FFW is formed using chlorine-containing precursors. For example, the FFW films or the FFW-comprising films may be formed by ALD or CVD using one or more non-fluorine based tungsten precursors such as, but not limited to, tungsten pentachloride ($WCl_5$), tungsten hexachloride ($WCl_6$). In some embodiments, portions of the metal caps 138 may extend over the gate dielectric layer 132, such that the metal caps 138 may also cover the exposed surface of the gate dielectric layers 132. Since the metal caps 138 are formed in a bottom-up manner, the formation thereof may be simplified by, for example, reducing repeated etching back processes which are used to remove unwanted metal materials resulting from conformal growth.

In some embodiments where the metal caps 138 are formed using a bottom-up approach, the growth of the metal caps 138 has a different nucleation delay on metal surfaces (i.e., metals in gate structures 130) as compared to dielectric surfaces (i.e., dielectrics in gate spacers 116 and/or ILD layer 126). The nucleation delay on the metal surface is shorter than on the dielectric surface. The nucleation delay difference thus allows selective growth on the metal surface. The present disclosure in various embodiments utilizes such selectivity to allow metal growth from gate structures 130 while inhibiting the metal growth from the spacers 116 and/or the ILD layer 126. As a result, the deposition rate of the metal caps 138 on the gate structures 130 is faster than on the spacers 116 and the ILD layer 126. In some embodiments, the resulting metal caps 138 have top surfaces lower than top surfaces of the etched-back gate spacers 116. However, in some other embodiments, the top surfaces of the metal caps 138 may be level with or higher than the top surfaces of the etched-back gate spacers 116.

Figure 10:
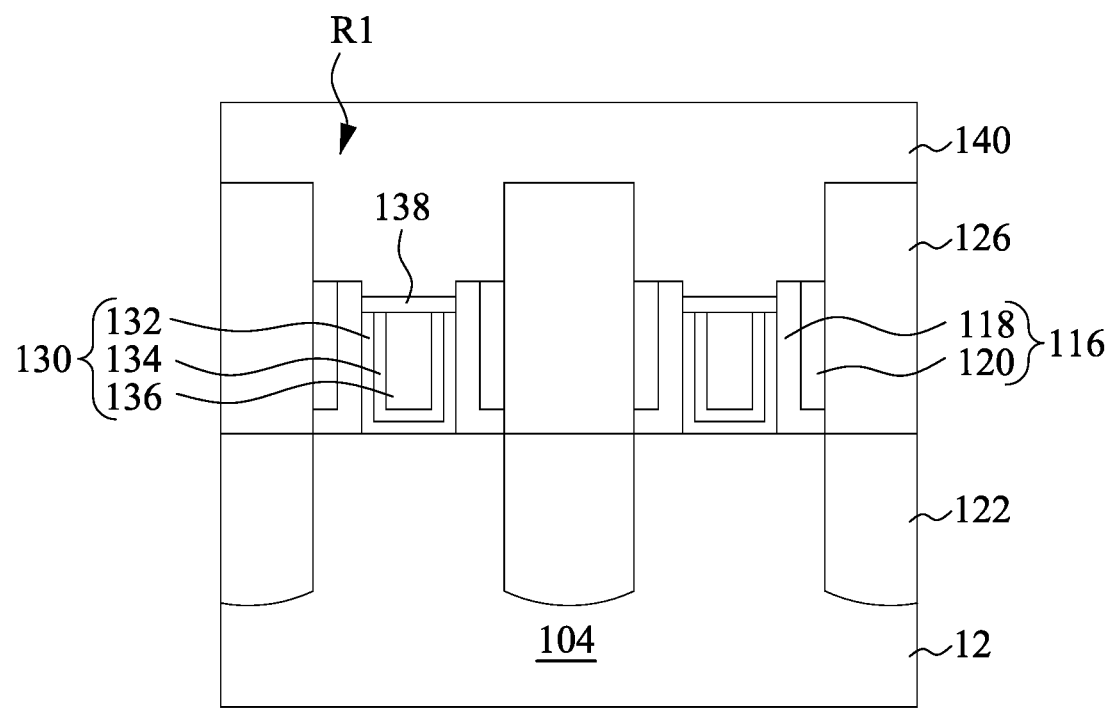
Figure 11:
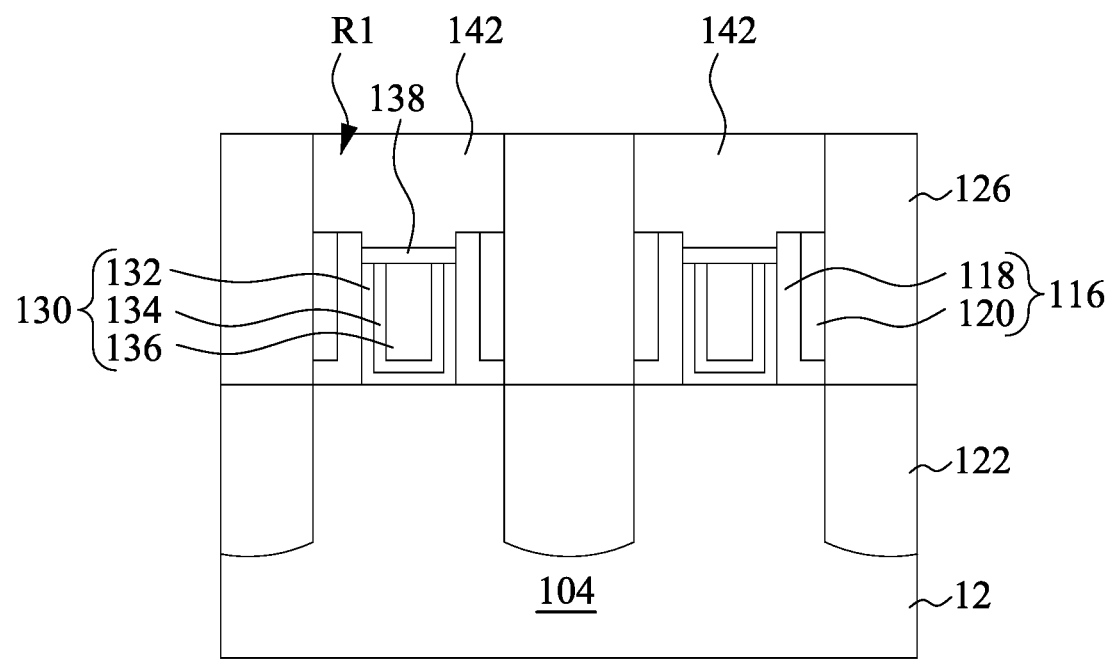

Next, a dielectric cap layer 140 is formed deposited over the substrate 12 until the recesses R1 are overfilled, as illustrated in FIG. 10. The dielectric cap layer 140 includes SiN, SiC, SiCN, SiON, SiCON, a combination thereof or the like, and is formed by a suitable deposition technique such as CVD, plasma-enhanced CVD (PECVD), ALD, remote plasma ALD (RPALD), plasma-enhanced ALD (PEALD), a combination thereof or the like. A CMP process is then performed to remove the cap layer outside the recesses R1, leaving portions of the dielectric cap layer 140 in the recesses R1 to serve as gate dielectric caps 142. The resulting structure is illustrated in FIG. 11.

Figure 12:
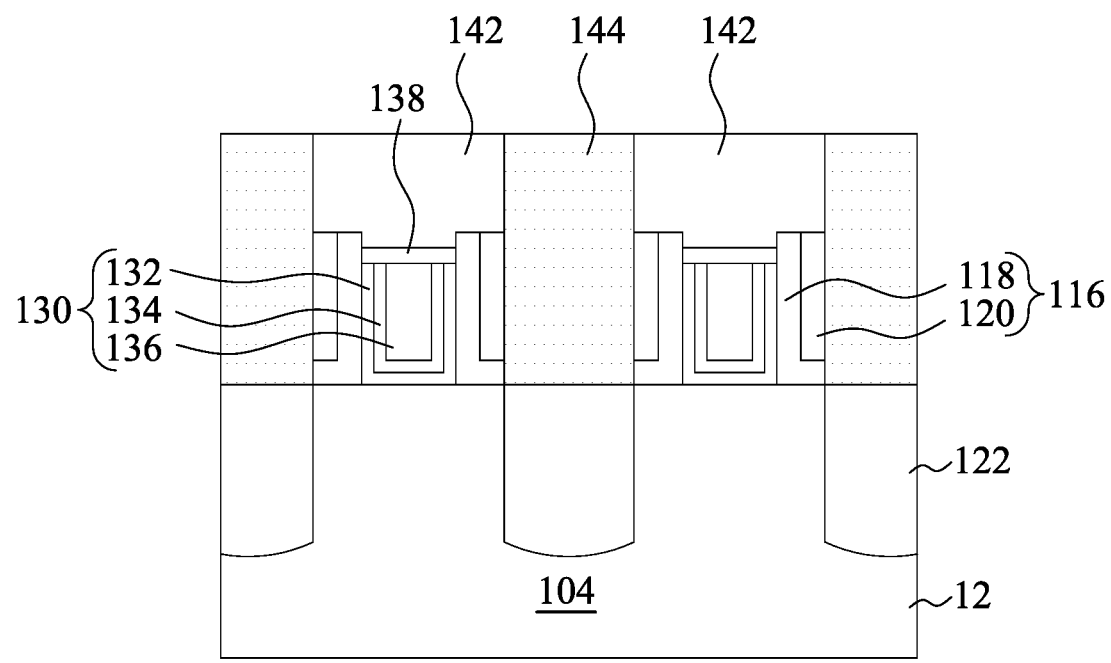

Referring to FIG. 12, source/drain contacts 144 are formed extending through the ILD layer 126. Formation of the source/drain contacts 144 includes, by way of example and not limitation, performing one or more etching processes to form contact openings extending through the ILD layer 126 (and CESL, if present) to expose the source/drain epitaxial structures 122, depositing one or more metal materials overfilling the contact openings, and then performing a CMP process to remove excessive metal materials outside the contact openings. In some embodiments, the one or more etching processes are selective etching that etches the ILD layer 126 at a faster etch rate than etching the gate dielectric caps 142 and the gate spacers 116. As a result, the selective etching is performed using the dielectric caps 142 and the gate spacers 116 as an etch mask, such that the contact openings and hence source/drain contacts 144 are formed self-aligned to the source/drain epitaxial structures 122 without using an additional photolithography process. In that case, the source/drain contacts 144 can be called self-aligned contacts (SAC), and the gate dielectric caps 142 allowing for forming the self-aligned contacts 144 can be called SAC caps 142. As a result of the self-aligned contact formation, the SAC caps 142 each have opposite sidewalls respectively in contact with source/drain contacts 144.

Figure 13:
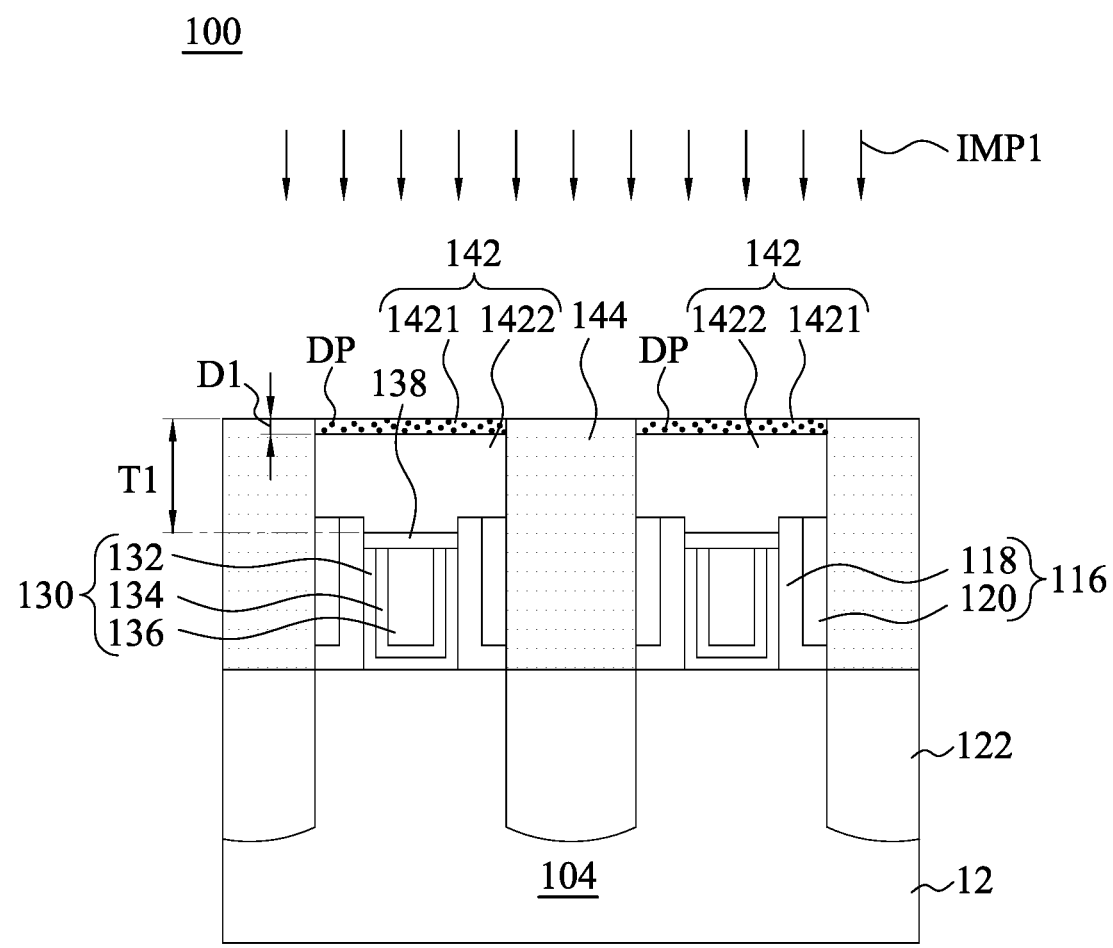

In FIG. 13, an ion implantation process IMP1 is performed to dope one or more impurities (e.g., dopant ions) into the gate dielectric caps 142. For example, ionized dopants DP (e.g., oxygen, germanium, argon, xenon, boron and/or other suitable species that is able to create a different etch selectivity than a material of gate dielectric caps 142) can be implanted into the gate dielectric caps 142, thus forming doped regions 1421 in the gate dielectric caps 142. In some embodiments, a patterned mask (e.g., patterned photoresist) may be formed by using suitable photolithography processes to cover the exposed surfaces of the source/drain contacts 144 before performing the ion implantation process IMP1, the implantation process IMP1 is performed using the patterned mask as an implantation mask, and the patterned mask is then removed (e.g., by ashing) after the ion implantation process IMP1 is completed. In this scenario, the source/drain contacts 144 are substantially free of the dopants DP. Alternatively, the ion implantation process IMP1 may also implant some ionized dopants DP into the source/drain contacts 144 and thus form doped regions in the source/drain contacts 144. In this scenario, the doped regions in the source/drain contacts 144 may then be punched through in a subsequent etching process for forming source/drain vias over the source/drain contacts 144.

In some embodiments, the ion implantation process IMP1 is performed at a dose of about 1E15 ions/$cm^2$ to about 5E20 ions/$cm^2$, at an energy of about 1 keV to about 180 keV, and at a temperature from about 20° C. to about 450° C. Dopant concentration and/or dopant depth of the resultant doped regions 1421 depend on the process conditions of the ion implantation process IMP1. If the process conditions of the ion implantation process IMP1 are out of the above selected ranges, the dopant concentration and/or dopant depth in the resultant doped regions 1421 may be unsatisfactory for slowing down the subsequent LRM etching process.

In some embodiments, the ion implantation process IMP1 implants molecular oxygen ions ($O_2^+$) or atomic oxygen ions ($O^+$) into the gate dielectric caps 142, resulting in oxygen-doped regions 1421 in the gate dielectric caps 142, while leaving lower regions 1422 of the gate dielectric caps 142 substantially un-doped. As a result, the oxygen-doped regions 1421 have a higher oxygen concentration (or oxygen atomic percentage) than the un-doped regions 1422. By way of example and not limitation, the oxygen-doped regions 1421 have an oxygen concentration in a range from about 1E18 atoms/$cm^3$ to about 5E23 atoms/$cm^3$, and the un-doped regions 1422 have a substantial zero oxygen concentration. If the oxygen-doped regions 1421 have an excessively high oxygen concentration, an etch rate of the oxygen-doped regions 1421 may be too slow to be punched through within an expected duration time in the subsequent LRM etching process. If the oxygen-doped regions 1421 have an excessively low oxygen concentration, an etch rate of the oxygen-doped regions 1421 may be too fast to slow down the subsequent LRM etching process.

In some embodiments, the oxygen-doped regions 1421 have an oxygen concentration gradient due to the ion implantation process IMP1. In greater detail, the oxygen concentration of the oxygen-doped regions 1421 changes as a function of depth inside the oxygen-doped regions 1421. For example, the oxygen concentration may decrease as a distance from top surfaces of the oxygen-doped regions 1421 increases. In some embodiments where the gate dielectric caps 142 are silicon nitride, the oxygen-to-nitrogen atomic ratio in the oxygen-doped regions 1421 is gradient as well. For example, the oxygen-to-nitrogen atomic ratio in the oxygen-doped regions 1421 may decrease as a distance from top surfaces of the oxygen-doped regions 1421 increases.

In some embodiments, the doped regions 1421 have a dopant depth D1 that extends from top surfaces of the gate dielectric caps 142 into the gate dielectric caps 142. In some embodiments, for 3 nm technology node the dopant depth D1 is in a range from about 1 Angstroms to about 50 Angstroms. In some further embodiments, a ratio of the dopant depth D1 to a maximal thickness T1 of the gate dielectric caps 142 is in a range from about 3% to about 60%. If the dopant depth D1 and/or the D1/T1 ratio are excessively small, the doped regions 1421 may be too thin to slow down the subsequent LRM etching process. If the dopant depth D1 and/or the D1/T1 ratio are excessively large, the doped regions 1421 may be too thick to be punched through within an expected duration time. For other technology nodes, such as 20 nm node, 16 nm node, 10 nm node, 7 nm node, and/or 5 nm node, the dopant depth D1 may be in a range from about 1 nm to about 20 nm.

In some embodiments, after the ion implantation process IMP1 is completed, an annealing process may be performed to repair implant damage in the gate dielectric caps 142 and/or the source/drain contacts 144. In some other embodiments, the annealing process can be skipped so that the doped regions 1421 may experience no annealing.

Figure 14:
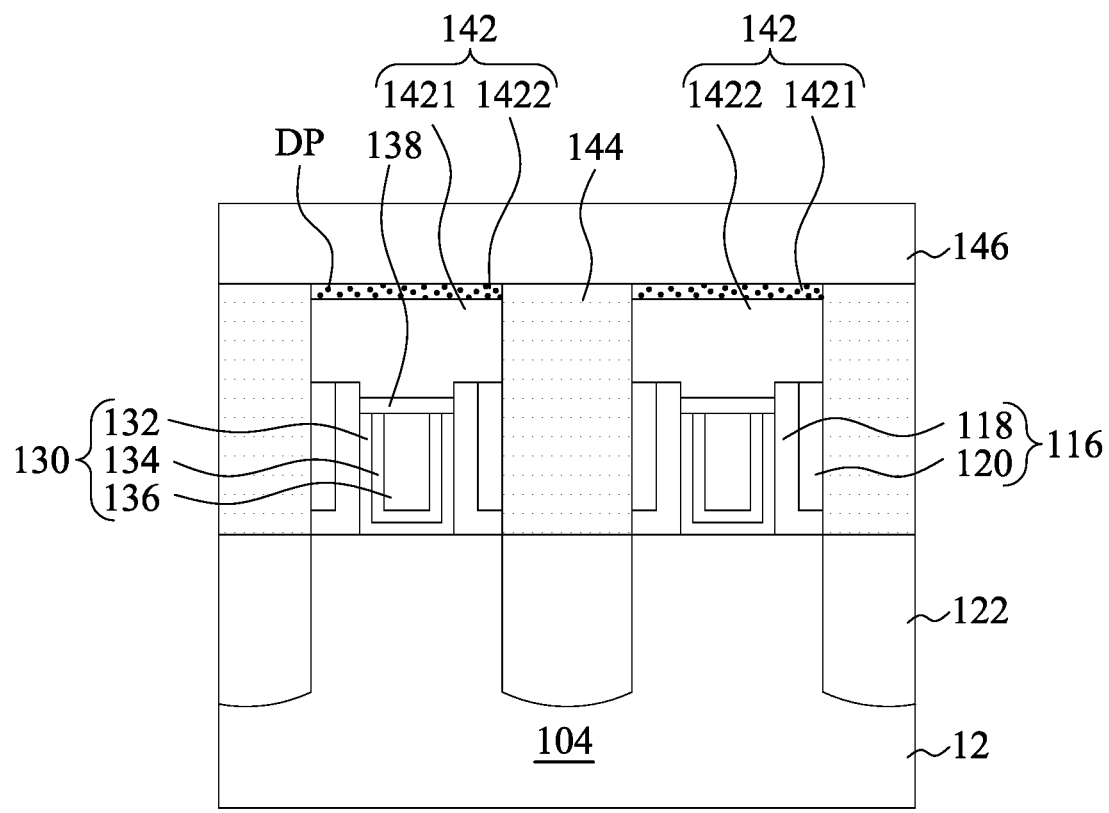
Figure 15:
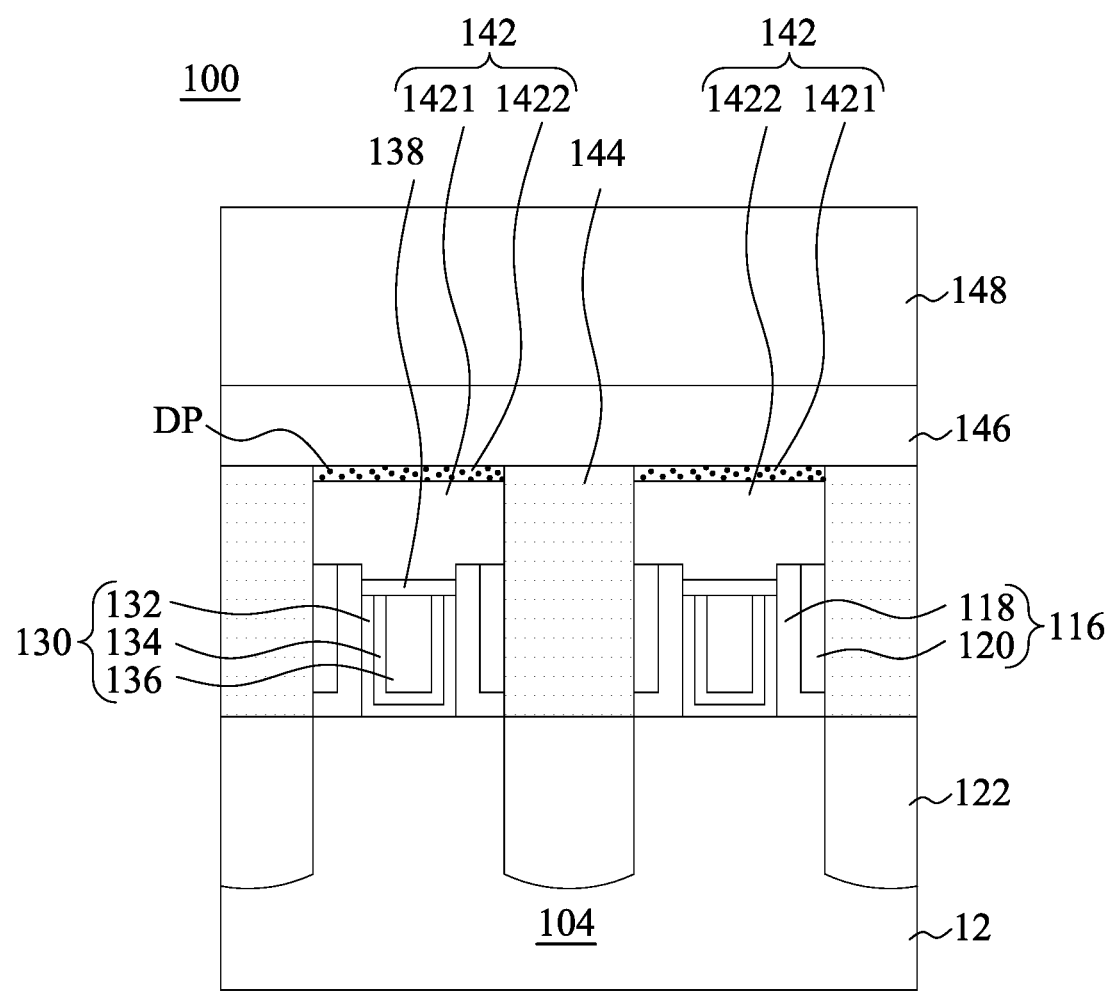

In FIG. 14, once the doped regions 1421 have been formed in the gate dielectric caps 142, a middle contact etch stop layer (MCESL) 146 is then formed over the source/drain contacts 144 and the gate dielectric caps 142. The MCESL 146 may be formed by a PECVD process and/or other suitable deposition processes. In some embodiments, the MCESL 146 is a silicon nitride layer and/or other suitable materials having a different etch selectivity than a subsequently formed ILD layer (as illustrated in FIG. 15). In some embodiments, the un-doped regions 1422 of the gate dielectric caps 142 and the MCESL 146 are both silicon nitride (SiN), and thus the doped regions 1421 (e.g., oxygen-doped regions) in the gate dielectric caps 142 have a different etch selectivity than both the un-doped regions 1422 and the MCESL 146.

Referring to FIG. 15, another ILD layer 148 is formed over the MCESL 146. In some embodiments, the ILD layer 148 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the MCESL 146 (e.g., silicon nitride). In certain embodiments, the ILD layer 148 is formed of silicon oxide ($SiO_x$). The ILD layer 148 may be deposited by a PECVD process or other suitable deposition technique.

Figure 16:
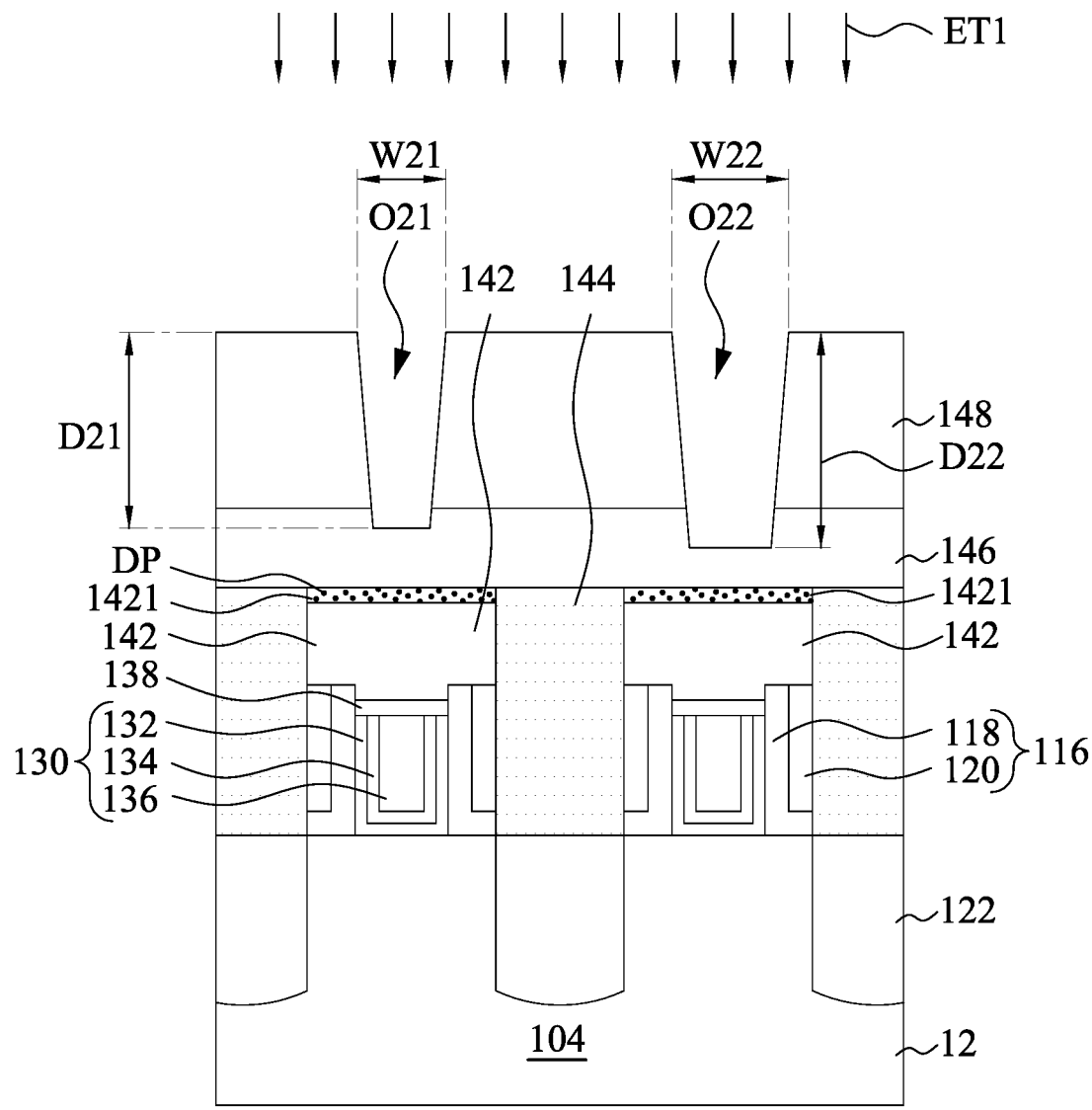

Referring to FIG. 16, the ILD layer 148 is patterned to form gate contact openings O21 and O22 extending through the ILD layer 148 by using a first etching process (also called contact etching process) ET1. In some embodiments, the contact etching process ET1 is an anisotropic etching process, such as a plasma etching. Take plasma etching for example, the semiconductor substrate 12 having the structure illustrated in FIG. 15 is loaded into a plasma tool and exposed to a plasma environment generated by RF or microwave power in a gaseous mixture of a fluorine containing gas, such as $C_4F_8$, $C_5F_8$, $C_4F_6$, $CHF_3$ or similar species, an inert gas, such as argon or helium, an optional weak oxidant, such as $O_2$ or CO or similar species, for a duration time sufficient to etch through the ILD layer 148 and recess exposed portions of the MCESL 146 at bottoms of the gate contact openings O21 and O22. A plasma generated in a gaseous mixture comprising $C_4F_6$, $CF_4$, $CHF_3$, $O_2$ and argon can be used to etch through the ILD layer 148 and recess exposed portions of the MCESL 146 at bottoms of the gate contact openings O21 and O22. The plasma etching environment has a pressure between about 10 and about 100 mTorr and the plasma is generated by RF power between about 50 and about 1000 Watts.

In some embodiments, the foregoing etchants and etching conditions of the contact etching process ET1 are selected in such a way that MCESL 146 (e.g., SiN) exhibits a slower etch rate than the ILD layer 148 (e.g., $SiO_x$). In this way, the MCESL 146 can act as a detectable etching end point, which in turn prevents over-etching and thus prevents punching or breaking through the MCESL 146. Stated differently, the contact etching process ET1 is tuned to etch silicon oxide at a faster etch rate than etching silicon nitride. It has been observed that the etch rate of silicon nitride increases when the etching plasma is generated from a gaseous mixture containing a hydrogen ($H_2$) gas. As a result, the contact etching process ET1 is performed using a hydrogen-free gaseous mixture in accordance with some embodiments of the present disclosure. Stated differently, the plasma in the contact etching process ET1 is generated in a gaseous mixture without hydrogen ($H_2$) gas. In this way, etch rate of silicon nitride keeps low in the contact etching process ET1, which in turn allows for etching silicon oxide (i.e., ILD material) at a faster etch rate than etching silicon nitride (i.e., MCESL and gate dielectric cap material).

In some embodiments, before the contact etching process ET1, a photolithography process is performed to define expected top-view patterns of the gate contact openings O21 and O22. For example, the photolithography process may include spin-on coating a photoresist layer over ILD layer 148 as illustrated in FIG. 15, performing post-exposure bake processes, and developing the photoresist layer to form a patterned mask with the top-view patterns of the gate contact openings O21 and O22. In some embodiments, patterning the photoresist to form the patterned mask may be performed using an electron beam (e-beam) lithography process or an extreme ultraviolet (EUV) lithography process.

In some embodiments as illustrated in FIG. 16, a gate contact opening O21 of a first lateral dimension (e.g., first maximal width W21) and a gate contact opening O22 of a second lateral dimension (e.g., second maximal width W22) are formed simultaneously in the contact etching process ET1. The second maximal width W22 may be greater than the first maximal width W21. The width difference between the gate contact openings O21 and O22 may be intentionally formed depending on circuit functions and/or design rules. Alternatively, the width difference between the gate contact openings O21 and O22 may be inadvertently formed due to inaccuracies of the contact etching process ET1. For example, one or more of the gate contact openings O21 and O22 may be confined by other features (e.g., patterned mask formed over the ILD layer 148) and have different size than the original design when the formed gate contact openings O21 and O22 are misaligned with respect to the original designed location. While the figures through the description show that the integrated circuit structure 100 structure includes only a narrower gate contact opening O21 and a wider gate contact opening O21, this is merely an example.

The integrated circuit structure 100 may accommodate any number of gate contacts with different sizes depending on different applications.

It has been observed that the difference in widths of gate contact openings O21 and O22 affects the result of contact etching process ET1, such that the narrower gate contact opening O21 is shallower than the wider gate contact opening O22. More specifically, once the contact etching process ET1 is completed, the narrower gate contact opening O21 has a depth D21, and the wider gate contact opening O22 has a greater depth D22 than the depth D21. This difference in the depths of gate contact openings O21 and O22 is called a depth loading resulting from width difference in gate contact openings.

Figure 17:
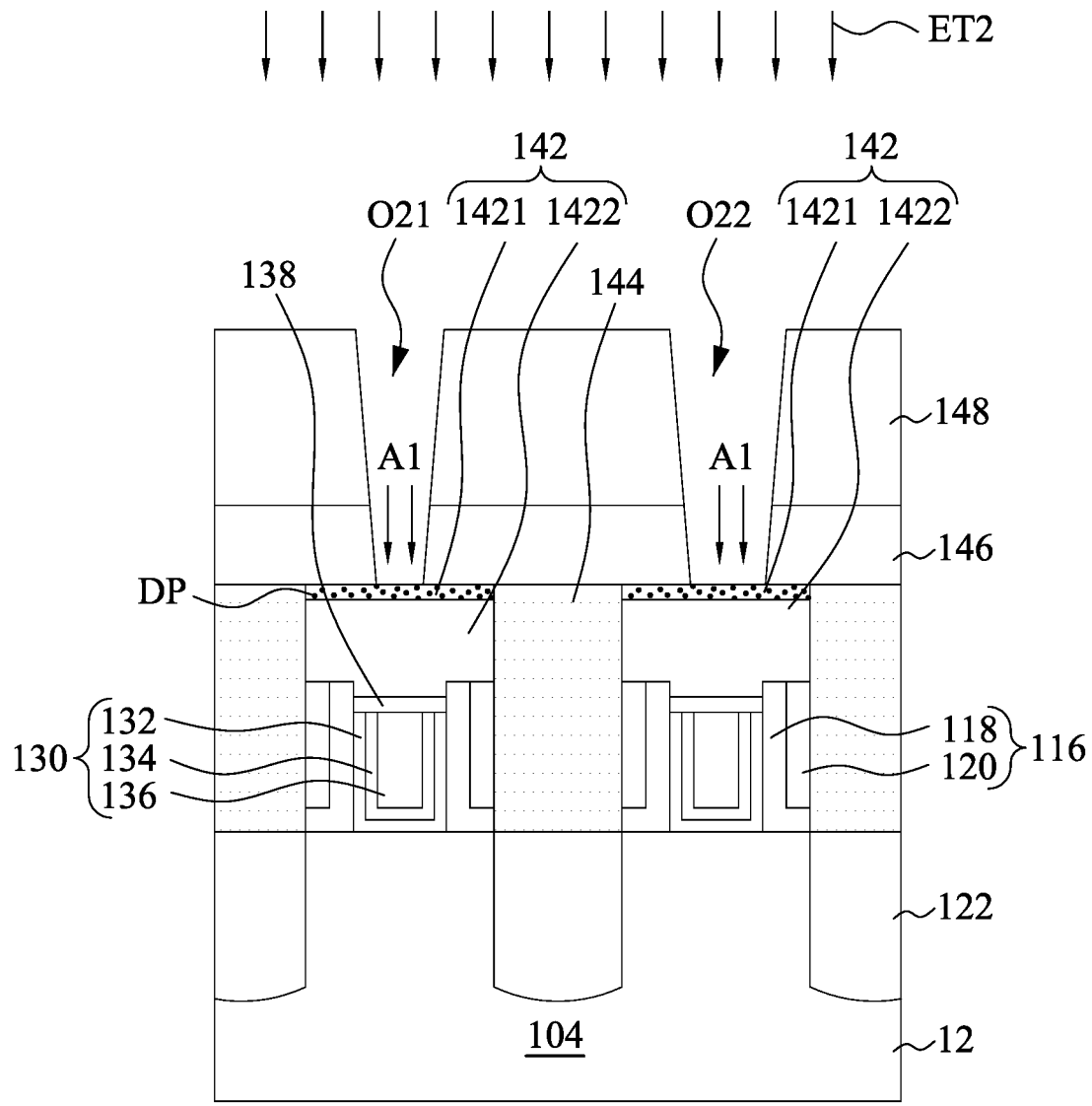
Figure 18:
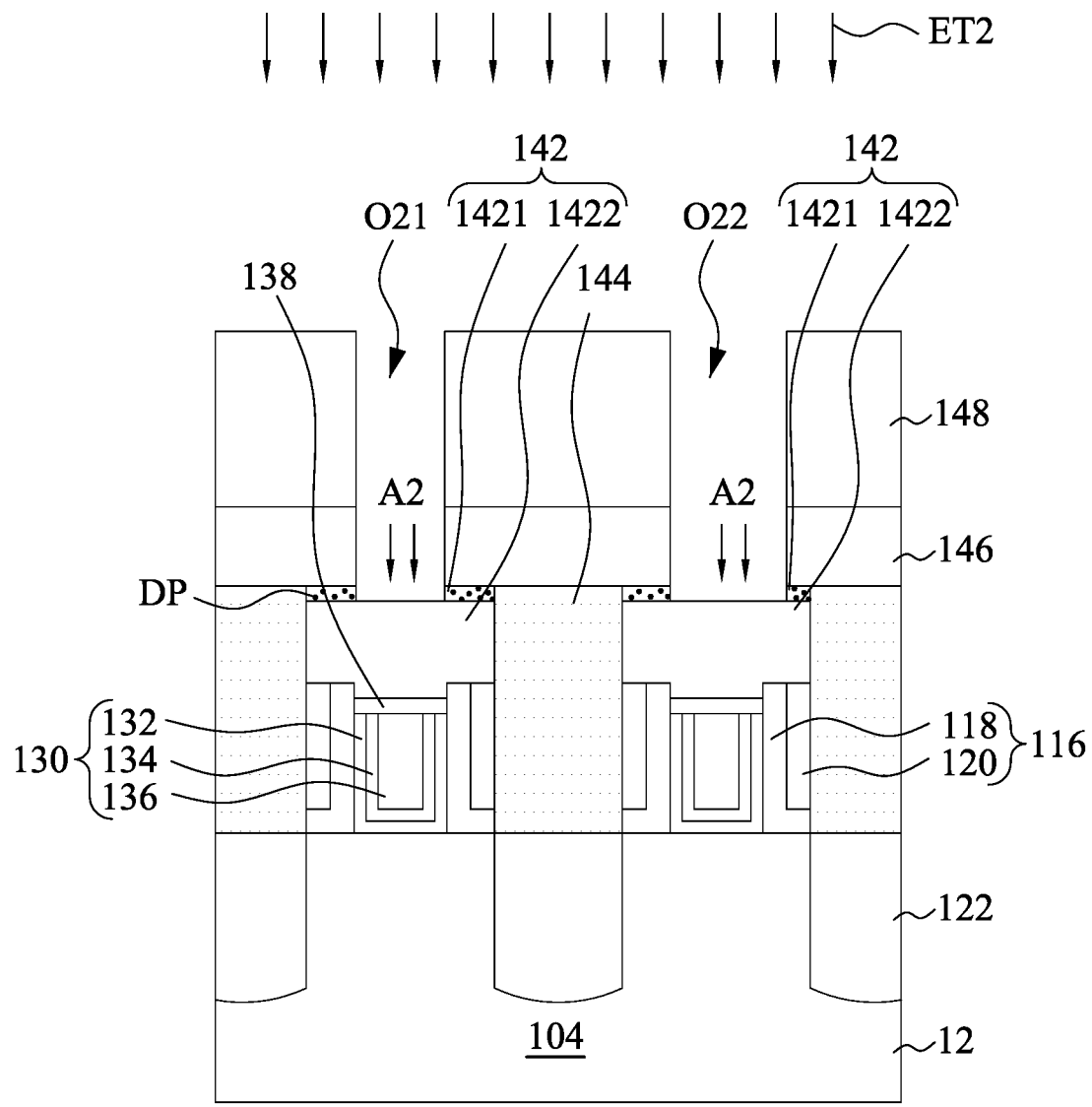
Figure 19A:
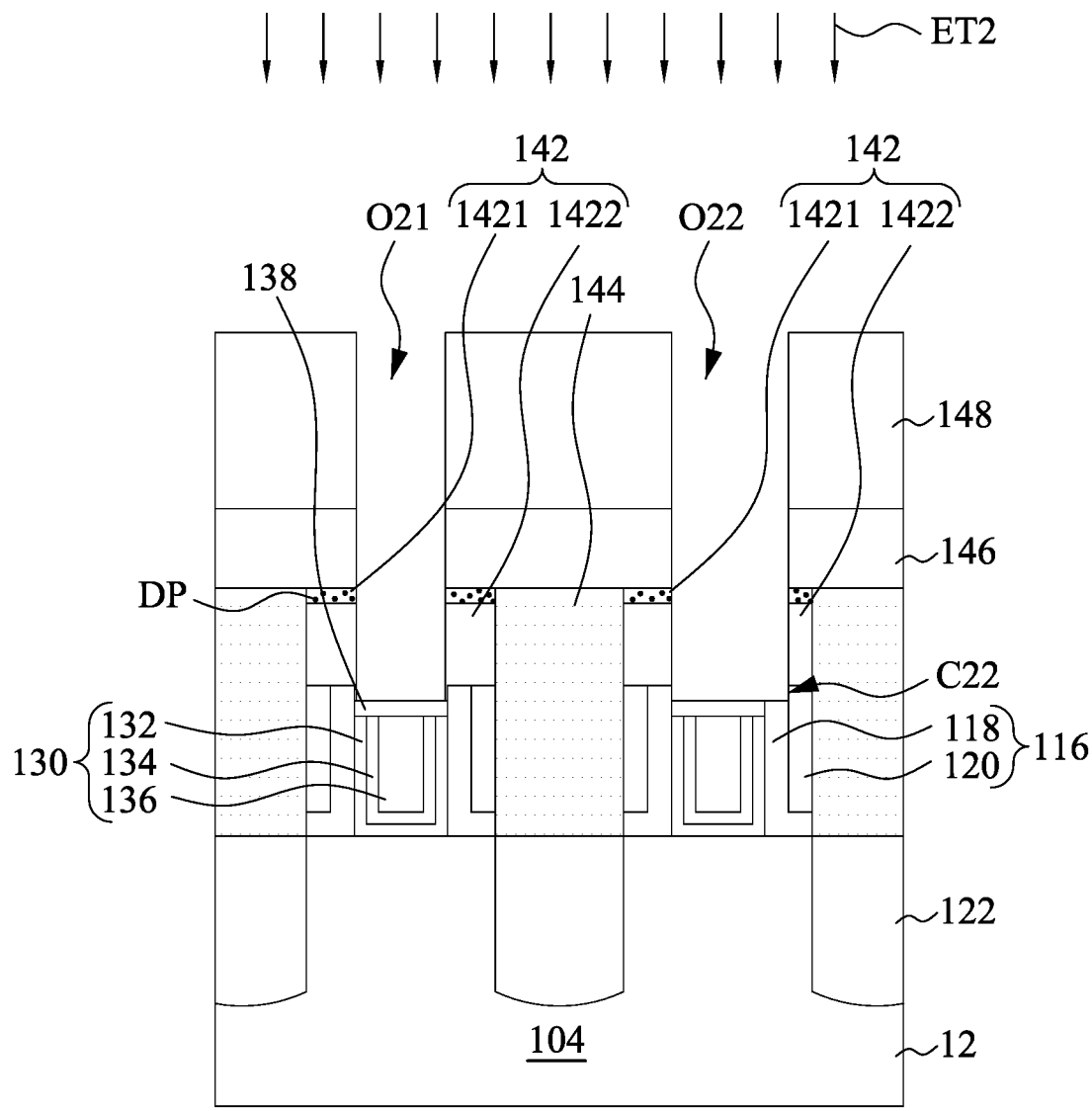

FIG. 17 illustrates a cross-sectional view of an initial stage of a second etching process (also called LRM etching process) ET2 in accordance with some embodiments of the present disclosure, FIG. 18 illustrates a cross-sectional view of a following stage of the LRM etching process ET2 in accordance with some embodiments of the present disclosure, and FIG. 19A illustrates a cross-sectional view of a final stage of the LRM etching process ET2 in accordance with some embodiments of the present disclosure. The etching time duration of the LRM etching process ET2 is controlled to break through (or called punching through) the MCESL 146 and the gate dielectric caps 142, thus deepening or extending the gate contact openings O21 and O22 down to the gate metal caps 138 over the gate structures 130. As a result of the LRM etching process ET2, the gate metal caps 138 get exposed at bottoms of the deepened gate contact openings O21 and O22.

In some embodiments, the LRM etching process ET2 is an anisotropic etching process, such as a plasma etching (e.g., inductively coupled plasma (ICP), capacitively coupled plasma (CCP), or the like), using a different etchant and/or etching conditions than the contact etching process ET1. The etchant and/or etching conditions of the LRM etching process ET2 are selected in such a way that the doped regions 1421 exhibit a slower etch rate than the MCESL 146 and the un-doped regions 1422. Stated differently, the doped regions 1421 have a higher etch resistance than the MCESL 146 and the un-doped regions 1422 in the LRM etching process ET2. In this way, the doped regions 1421 can slow down LRM etching process ET2, which in turn will slow down the vertical etch rate and the depth increasing in the gate contact openings O21 and O22 when the gate contact openings O21 and O22 reach the doped regions 1421. Therefore, the depth difference between the narrower gate contact opening O21 and the wider gate contact opening O22 can be reduced by the doped regions 1421. The reduced depth loading thus prevents the tigertooth like pattern formed in the wider gate contact opening O22, which in turn reduces the risk of leakage current (e.g., leakage current from gate contacts to source/drain contacts). Moreover, because the doped regions 1421 slow down the vertical etch rate but not the lateral etch rate at lower portions of the gate contact openings O21 and O22 when the gate contact openings O21 and O22 reach the doped regions 1421, the LRM etching process ET2 can laterally expand lower portions of the gate contact openings O21 and O22 during etching the etch-resistant layer 145, such that the bottom widths of the gate contact openings O21 and O22 can be increased, and the gate contact opening O21 and O22 can become more vertical than before the doped regions 1421 are punched through, as illustrated in FIGS. 17-18.

Take plasma etching as an example of the LRM etching process ET2, the semiconductor substrate 12 having the structure illustrated in FIG. 16 is loaded into a plasma tool and exposed to a plasma environment generated by RF or microwave power in a gaseous mixture of one or more of a fluorine-containing gas (e.g., $CHF_3$, $CF_4$, $C_2F_2$, $C_4F_6$, $C_xH_yF_z$ (x,y,z=0-9), or similar species), a hydrogen-containing gas (e.g., $H_2$), a nitrogen-containing gas (e.g., $N_2$), and an inert gas (e.g., argon or helium), for a duration time sufficient to etch through the doped regions 1421 and underlying un-doped regions 1422 of the gate dielectric caps 142. The plasma etching environment has a pressure between about 10 and about 100 mTorr and the plasma is generated by RF power between about 50 and about 1000 Watts.

Plasma generated from a hydrogen-containing gas mixture can etch silicon nitride at a faster etch rate than etching doped silicon nitride (e.g., oxygen-doped silicon nitride), and thus the LRM etching process ET2 using a hydrogen-containing gas mixture etches doped regions 1421 at a slower etch rate than etching the MCESL 146. In this way, the doped regions 1421 can slow down the LRM etching process ET2. In some embodiments, the LRM etching process ET2 uses a gas mixture of $CHF_3$ gas and $H_2$ gas with a flow rate ratio of $CHF_3$ gas to $H_2$ gas from about 1:1 to about 1:100. In some embodiments, the LRM etching process ET2 uses a gas mixture of $CF_4$ gas and $H_2$ gas with a flow rate ratio of $CF_4$ gas to $H_2$ gas from about 1:1 to about 1:100. In some embodiments, the LRM etching process ET2 uses a gas mixture of $CH_2F_2$ gas and $H_2$ gas with a flow rate ratio of $CH_2F_2$ gas to $H_2$ gas from about 1:1 to about 1:100. An excessively high $H_2$ gas flow rate may lead to an excessively fast etch rate in etching through the un-doped regions 1422 of the gate dielectric caps 142, which in turn may lead to non-negligible tiger tooth-like recess in the wider gate contact opening O22. An excessively low $H_2$ gas flow rate may lead to insufficient etch selectivity between the doped regions 1421 and MCESL 146. In some embodiments, a ratio of the etch rate of the doped regions 1421 to the etch rate of the MCESL 146 and/or the un-doped regions 1422 is in a range from about 2 and to about 10.

At initial stage of the LRM etching process ET2, as illustrated in FIG. 17, the plasma etchant etches the MCESL 146 at a first vertical etch rate A1. At a following stage of the LRM etching process ET2, once the gate contact openings O21 and O22 punch through the MCESL 146, the doped regions 1421 of the gate dielectric caps 142 get exposed, and then the plasma etchant etches the doped regions 1421 at a second vertical etch rate A2 slower than the first vertical etch rate A1, as illustrated in FIG. 18. As a result, the depth difference between the narrower gate contact opening O21 and the wider gate contact opening O22 can be reduced by the doped regions 1421. Moreover, the LRM etching process ET2 can laterally expand lower portions of the gate contact openings O21 and O22 during etching the doped regions 1421, such that the gate contact openings O21 and O22 have increased bottom widths and a more vertical sidewall profile, as illustrated in FIG. 18. As a result of the LRM etching process ET2 as illustrated in FIG. 19A, gate contact openings O21 and O22 have substantially vertical sidewalls and without a tiger tooth-like recess.

Figure 19B:
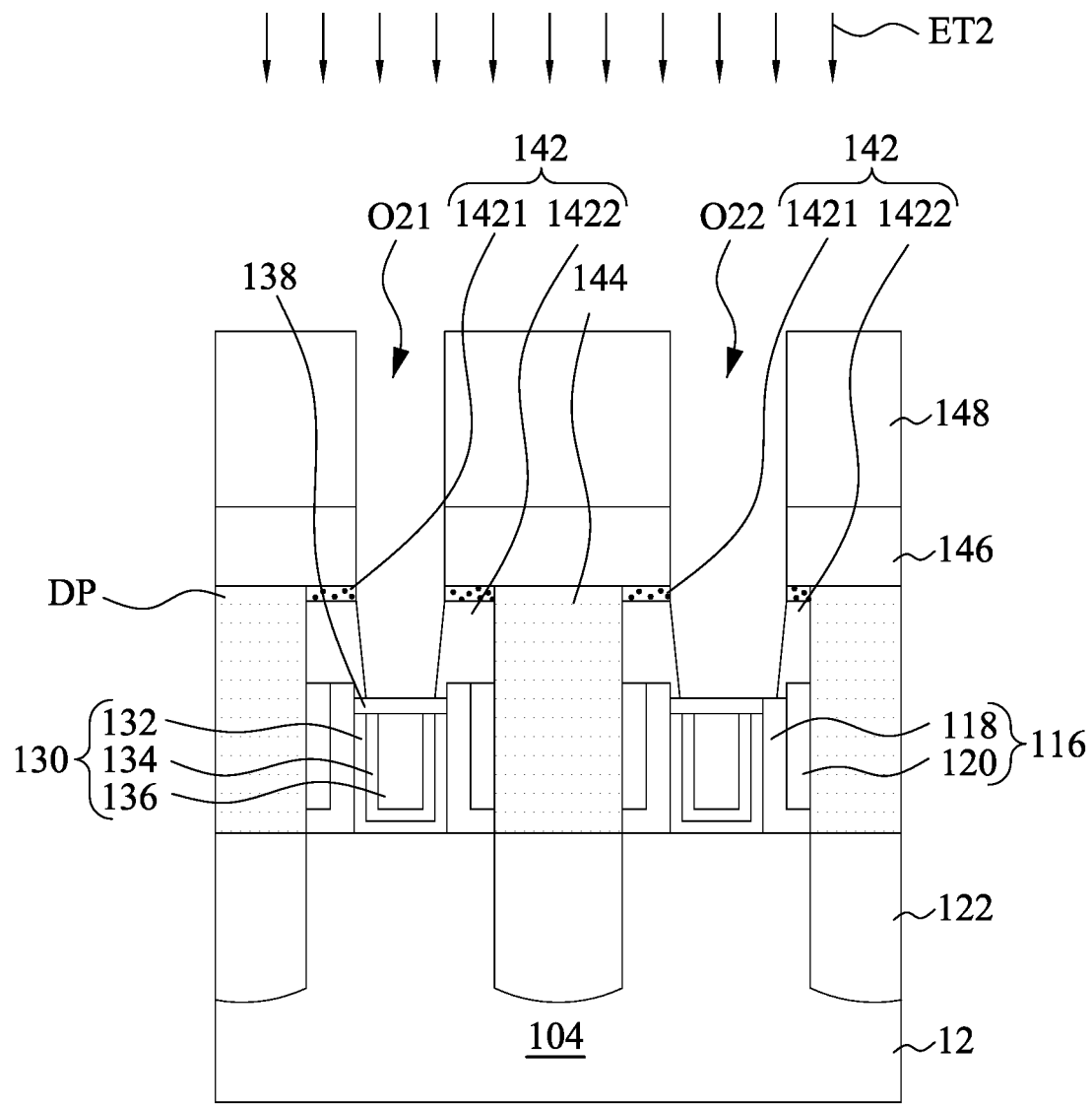

In some embodiments, the sidewalls of the gate contact openings O21 and O22 extend linearly and vertically through an entire thickness of the ILD layer 148, an entire thickness of the MCESL 146, and an entire thickness of the dielectric caps 142, without a slope change. In some other embodiments as illustrated in FIG. 19B, the sidewalls of lower portions of the gate contact openings O21 and O22 may become tapered because the LRM etching process ET2 may etch the un-doped regions 1422 of the gate dielectric caps 142 at a faster vertical etch rate than etching the doped regions 1421, especially when the gate dielectric caps 142 are formed of the same material as the MCESL 146 (e.g., silicon nitride). In this scenario, sidewalls of the gate contact openings O21 and O22 may be more vertical (or steeper) within upper portions of the gate contact openings O21 and O22 than within lower portions of the gate contact openings O21 and O22, and the slope change in sidewalls of the gate contact openings O21 and O22 may be located at interfaces between the doped regions 1421 and the un-doped regions 1422.

In some embodiments as depicted in FIG. 19A, the wider gate contact opening O22 may extend into a neighboring gate spacer 116, resulting in a notched corner C22 in the gate spacer 116. This notched corner C22 may be inadvertently formed due to inaccuracies of the contact etching process ET1 and/or the LRM etching process ET2. However, even in this case, the gate spacer 116 would not be inadvertently over-etched to form a tiger tooth-like recess, because the depth increasing in the wider gate contact opening O22 is slowed down during punching through the doped regions 1421 as discussed previously. Given that the wider gate contact opening O22 has no or negligible tiger tooth-like recess, the risk of leakage current (e.g., leakage current between the source/drain contact and the gate contact subsequently formed in the gate contact opening O22) can be reduced. In some embodiments where the gate spacer 116 is a bi-layered structure, the notched gate spacer 116 has a stepped top surface structure, wherein a lower step of the stepped top surface structure is a top surface of the first spacer layer 118 recessed by the LRM etching process ET2, and an upper step of the stepped top surface structure is a top surface of the second spacer layer 120 not recessed by the LRM etching process ET2.

In some embodiments, the contact etching process ET1 and the LRM etching process ET2 discussed above are in-situ performed (e.g., using the same plasma etching tool without vacuum break). In some embodiments, the contact etching process ET1 and the LRM etching process ET2 are in combination an in-situ etching including four stages: 1) etching through ILD layer 148 (e.g., silicon oxide), 2) etching through MCESL 146 (e.g., silicon nitride), 3) etching through doped regions 1421 (e.g., oxygen-doped regions) of SAC caps 142, and 4) etching through un-doped regions 1422 (e.g., silicon nitride) of SAC caps 142. In some embodiments, the contact etching process ET1 and the LRM etching process ET2 discussed above are ex-situ performed. The contact etching process ET1 including two stages: 1) etching through ILD layer 148 (e.g., silicon oxide), and 2) etching through MCESL 146 (e.g., silicon nitride). The LRM etching process ET2 including two stages: 1) etching through doped regions 1421 (e.g., oxygen-doped regions) of SAC caps 142, and 2) etching through un-doped regions 1422 (e.g., silicon nitride) of SAC caps 142. The gas ratio and/or power of these stages can be the same or different according with various embodiments of the present disclosure. In some embodiments, because the doped regions 1421 of the SAC caps 142 has a thickness not greater than about 50 Angstroms, it can be naturally punched through without etch stop concern (i.e., without concerning that the etching process may be stopped by the doped regions 1421).

Figure 20A:
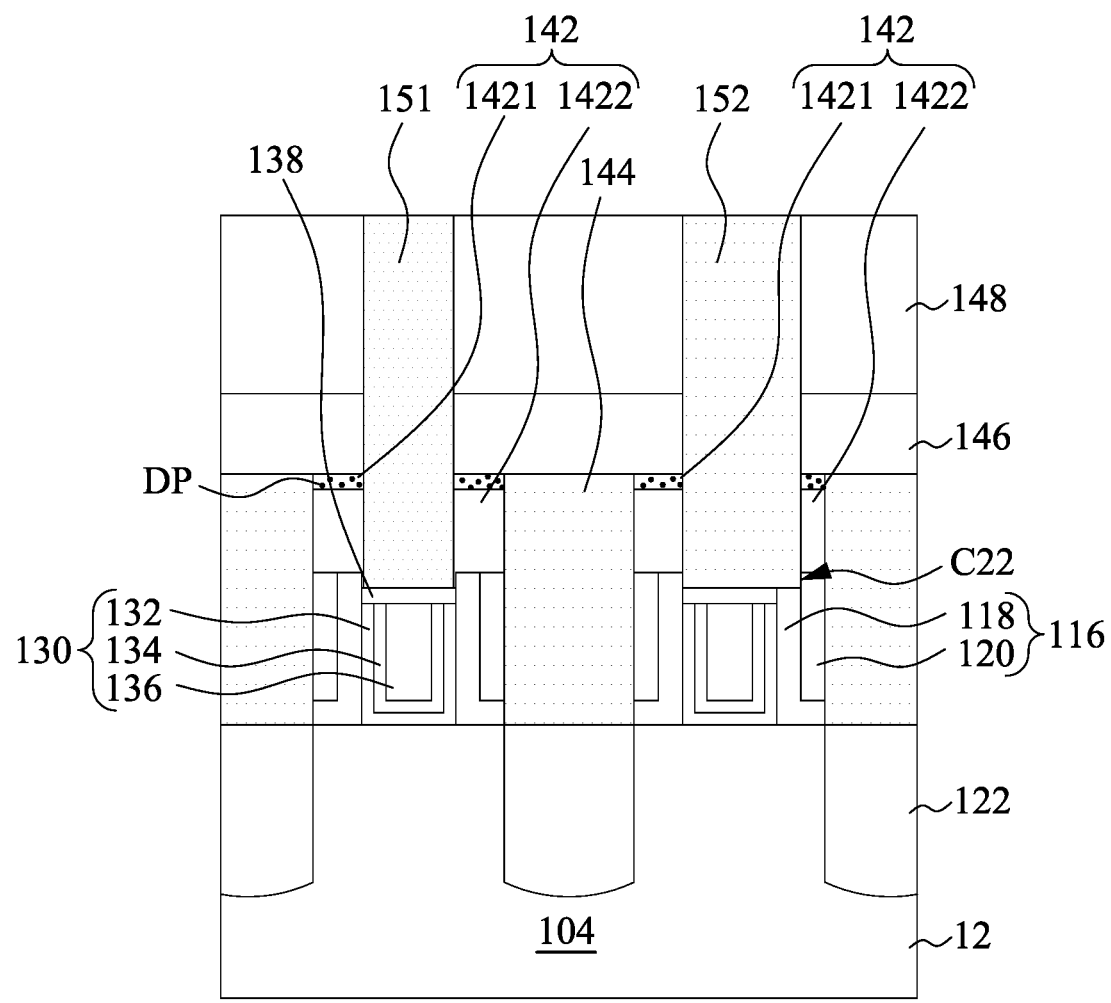

Referring to FIG. 20A, gate contacts 151 and 152 are then formed in the gate contact openings O21 and O22 to make electrical connection to the HKMG structures 130 through the gate metal caps 138. The gate contacts 151 and 152 are formed using, by way of example and not limitation, depositing one or more metal materials overfilling the gate contact openings O21 and O22, followed by a CMP process to remove excessive metal material(s) outside the gate contact openings O21 and O22. As a result of the CMP process, the gate contacts 151 and 152 have top surfaces substantially coplanar with the ILD layer 148. The gate contacts 151 and 152 may comprise metal materials such as copper, aluminum, tungsten, combinations thereof, or the like, and may be formed using PVD, CVD, ALD, or the like. In some embodiments, the gate contacts 151 and 152 may further comprise one or more barrier/adhesion layers (not shown) to protect the ILD layer 148, the MCESL 146 and/or gate dielectric caps 142 from metal diffusion (e.g., copper diffusion). The one or more barrier/adhesion layers may comprise titanium, titanium nitride, tantalum, tantalum nitride, or the like, and may be formed using PVD, CVD, ALD, or the like.

Figure 20B:
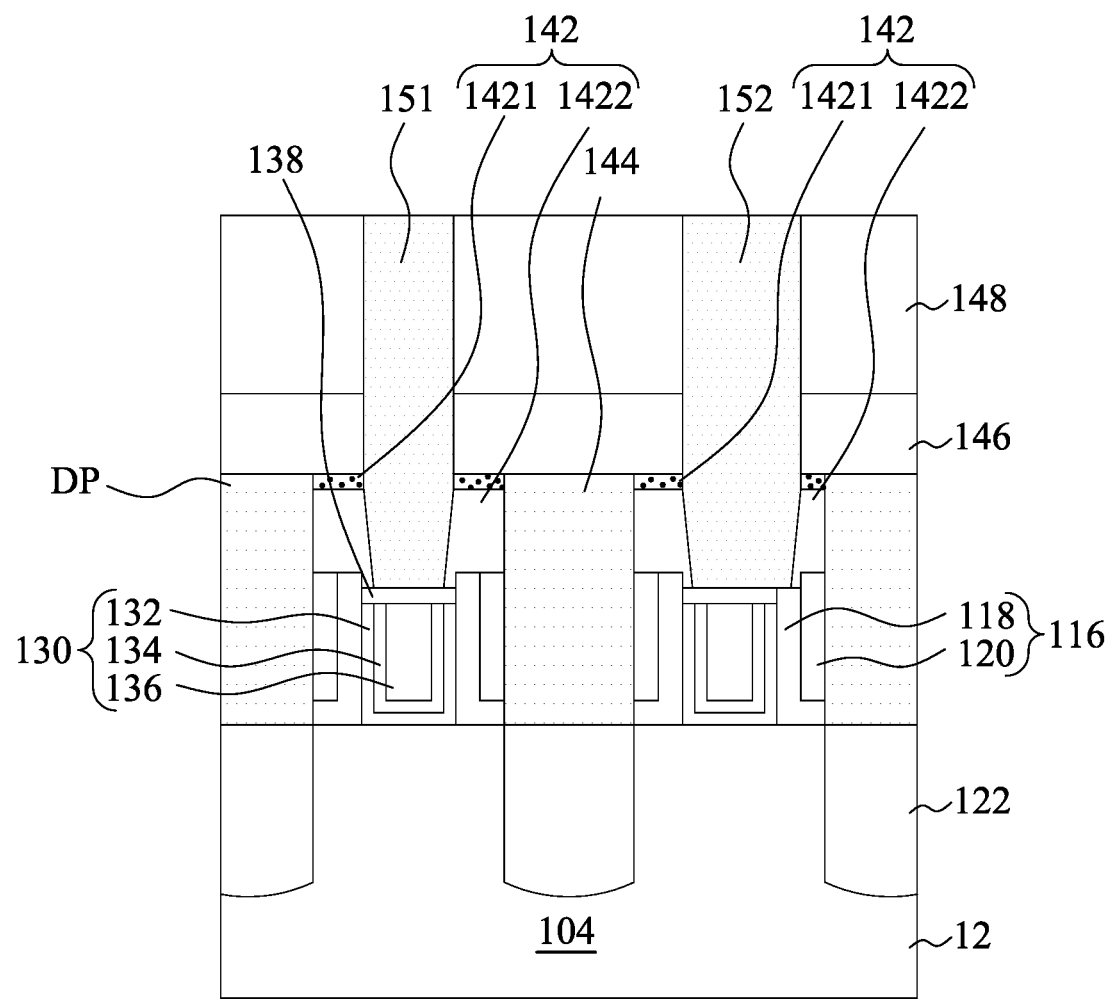

In some embodiments, the gate contacts 151 and 152 inherit the geometry of the gate contact openings O21 and O22 with vertical sidewall profile and no tiger tooth-like profile, and thus the gate contacts 151 and 152 also have vertical sidewall profile and no tiger tooth-like profile. In greater detail, the sidewalls of the gate contacts 151 and 152 extend linearly and vertically through an entire thickness of the ILD layer 148, an entire thickness of the MCESL 146, and an entire thickness of the doped regions 1421 of the dielectric caps 142, and an entire thickness of the un-doped regions 1422 of the dielectric caps 142, without a slope change. In some other embodiments as illustrated in FIG. 20B, the sidewalls of lower portions of the gate contacts 151 and 152 may become tapered because the LRM etching process ET2 may etch the un-doped regions 1422 of gate dielectric caps 142 at a faster vertical etch rate than etching the doped regions 1421, especially when the gate dielectric caps 142 are formed of the same material as the MCESL 146 (e.g., silicon nitride). In this scenario, the sidewalls of the gate contacts 151 and 152 may be more vertical (or steeper) within upper portions of the gate contacts 151 and 152 than within lower portions of the gate contacts 151 and 152, and the slope change in sidewalls of the gate contacts 151 and 152 may be located at interfaces between the doped regions 1421 and the un-doped regions 1422.

FIGS. 21 through 39B illustrate perspective views and cross-sectional views of intermediate stages in the formation of an integrated circuit structure 200 in accordance with some embodiments of the present disclosure. The formed transistors may include a p-type transistor (such as a p-type GAA FET) and an n-type transistor (such as an n-type FAA FET) in accordance with some exemplary embodiments. Throughout the various views and illustrative embodiments, like reference numbers are used to designate like elements. It is understood that additional operations can be provided before, during, and after the processes shown by FIGS. 21 through 39B, and some of the operations described below can be replaced or eliminated, for additional embodiments of the method. The order of the operations/processes may be interchangeable.

FIGS. 21, 22, 23, 24A, 25A, 26A, and 27A are perspective views of some embodiments of the integrated circuit structure 200 at intermediate stages during fabrication. FIGS. 24B, 25B, 26B, 27B, 28-30, 31A, and 32-39B are cross-sectional views of some embodiments of the integrated circuit structure 200 at intermediate stages during fabrication along a first cut (e.g., cut X-X in FIG. 24A), which is along a lengthwise direction of the channel and perpendicular to a top surface of the substrate. FIG. 31B is a cross-sectional view of some embodiments of the integrated circuit structure 200 at intermediate stages during fabrication along a second cut (e.g., cut Y-Y in FIG. 24A), which is in the gate region and perpendicular to the lengthwise direction of the channel.

Figure 21:
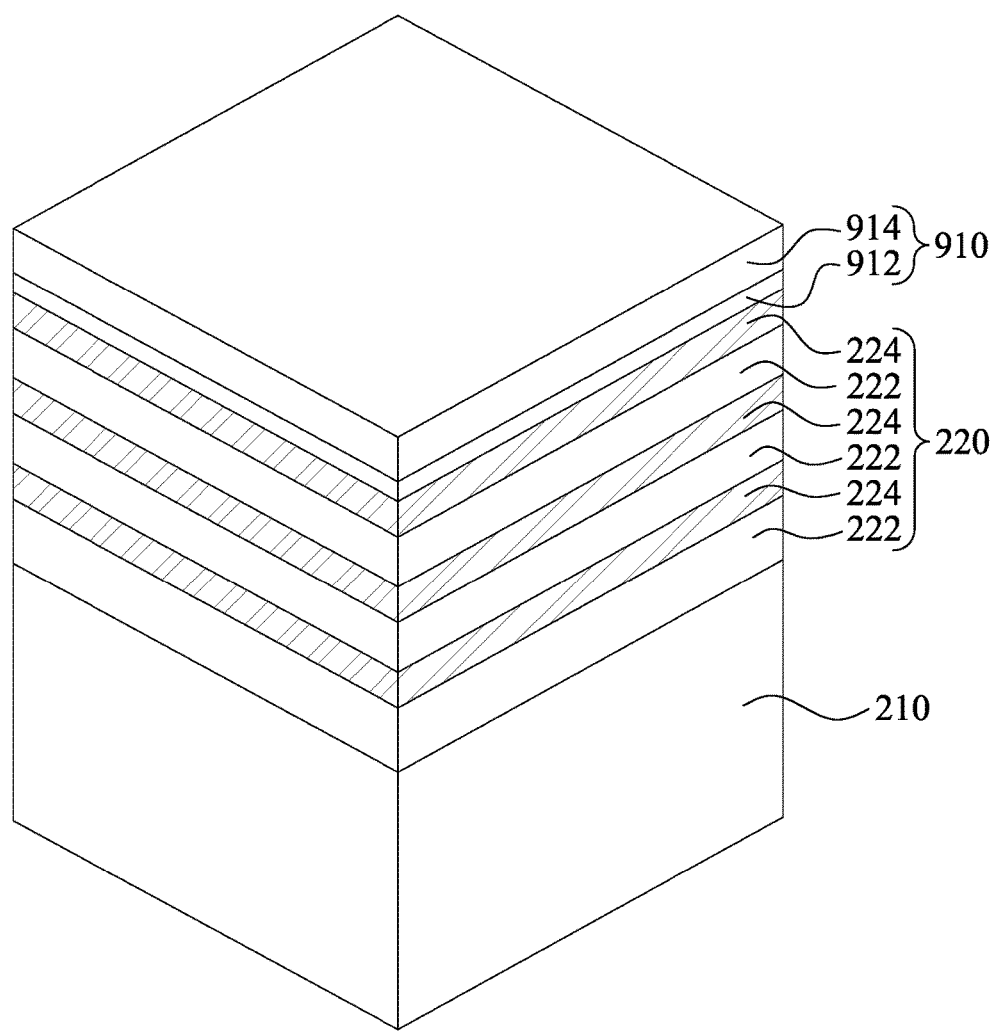
FIGS. 21 through 39B illustrate perspective views and cross-sectional views of intermediate stages in the formation of an integrated circuit structure in accordance with some embodiments of the present disclosure.

Referring to FIG. 21, an epitaxial stack 220 is formed over the substrate 210. In some embodiments, the substrate 210 may include silicon (Si). Alternatively, the substrate 210 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 220 includes epitaxial layers 222 of a first composition interposed by epitaxial layers 224 of a second composition. The first and second compositions can be different. In some embodiments, the epitaxial layers 222 are SiGe and the epitaxial layers 224 are silicon (Si). However, other embodiments are possible including those that provide for a first composition and a second composition having different oxidation rates and/or etch selectivity. In some embodiments, the epitaxial layers 222 include SiGe and where the epitaxial layers 224 include Si, the Si oxidation rate of the epitaxial layers 224 is less than the SiGe oxidation rate of the epitaxial layers 222.

The epitaxial layers 224 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 224 to define a channel or channels of a device is further discussed below.

It is noted that three layers of the epitaxial layers 222 and three layers of the epitaxial layers 224 are alternately arranged as illustrated in FIG. 21, which is for illustrative purposes only and not intended to be limiting beyond what is specifically recited in the claims. It can be appreciated that any number of epitaxial layers can be formed in the epitaxial stack 220; the number of layers depending on the desired number of channels regions for the transistor. In some embodiments, the number of epitaxial layers 224 is between 2 and 10.

As described in more detail below, the epitaxial layers 224 may serve as channel region(s) for a subsequently-formed multi-gate device and the thickness is chosen based on device performance considerations. The epitaxial layers 222 may eventually be removed and serve to define a vertical distance between adjacent channel region(s) for a subsequently-formed multi-gate device and the thickness is chosen based on device performance considerations. Accordingly, the epitaxial layers 222 may also be referred to as sacrificial layers, and epitaxial layers 224 may also be referred to as channel layers.

By way of example, epitaxial growth of the layers of the stack 220 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 224 include the same material as the substrate 210. In some embodiments, the epitaxially grown layers 222 and 224 include a different material than the substrate 210. As stated above, in at least some examples, the epitaxial layers 222 include an epitaxially grown silicon germanium (SiGe) layer and the epitaxial layers 224 include an epitaxially grown silicon (Si) layer. Alternatively, in some embodiments, either of the epitaxial layers 222 and 224 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 222 and 224 may be chosen based on providing differing oxidation and/or etching selectivity properties. In some embodiments, the epitaxial layers 222 and 224 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

Figure 22:
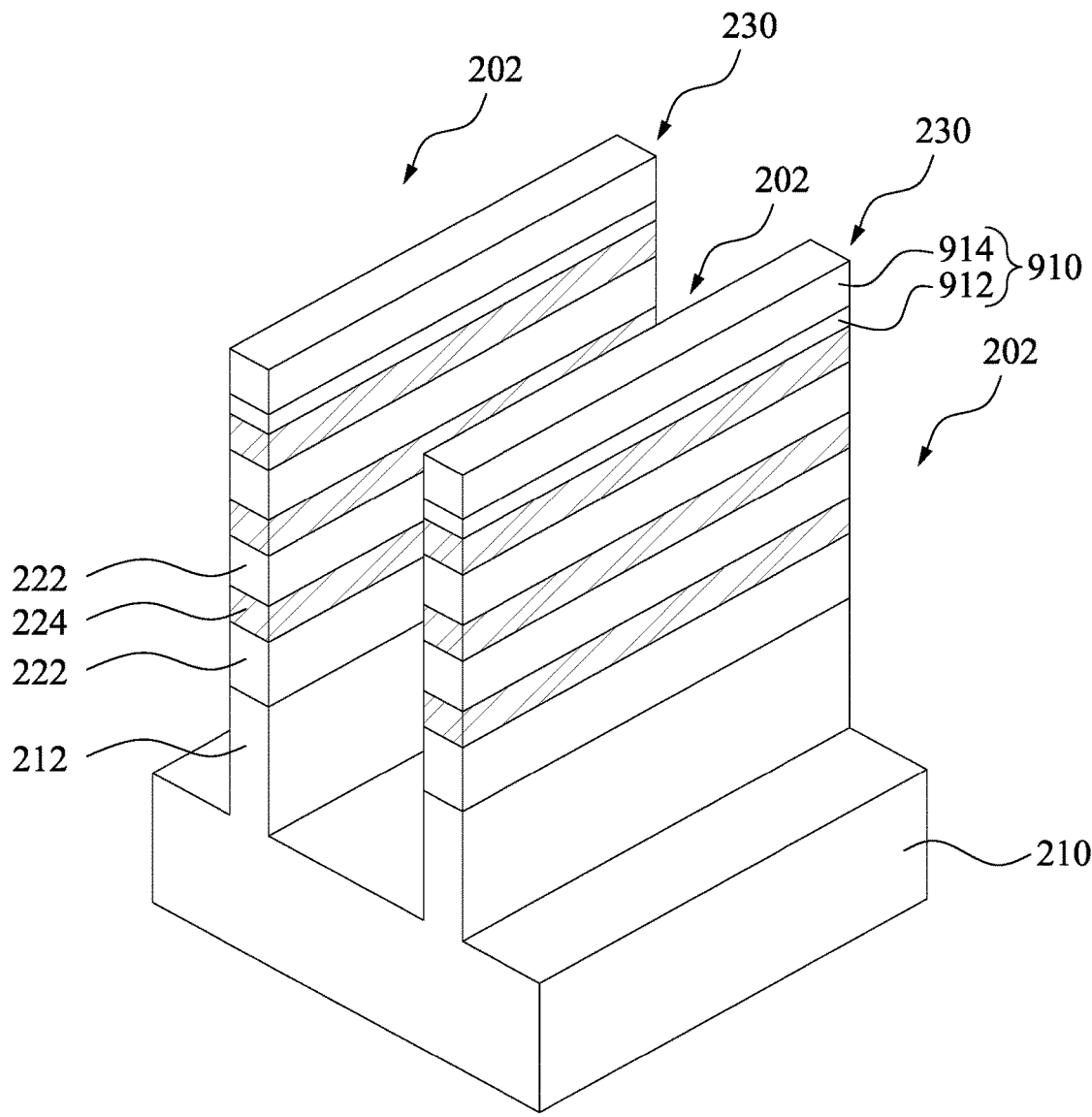

Referring to FIG. 22, a plurality of semiconductor fins 230 extending from the substrate 210 is formed. In various embodiments, each of the fins 230 includes a substrate portion 212 formed from the substrate 210 and portions of each of the epitaxial layers of the epitaxial stack including epitaxial layers 222 and 224. The fins 230 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 230 by etching initial epitaxial stack 220. The etching process can include dry etching, wet etching, reactive ion etching (RIE), and/or other suitable processes.

In the illustrated embodiment as illustrated in FIGS. 21 and 22, a hard mask (HM) layer 910 is formed over the epitaxial stack 220 prior to patterning the fins 230. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 220 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 230 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-200 nm. The patterned mask may then be used to protect regions of the substrate 210, and layers formed thereupon, while an etch process forms trenches 202 in unprotected regions through the HM layer 910, through the epitaxial stack 220, and into the substrate 210, thereby leaving the plurality of extending fins 230. The trenches 202 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 220 in the form of the fins 230.

Figure 23:
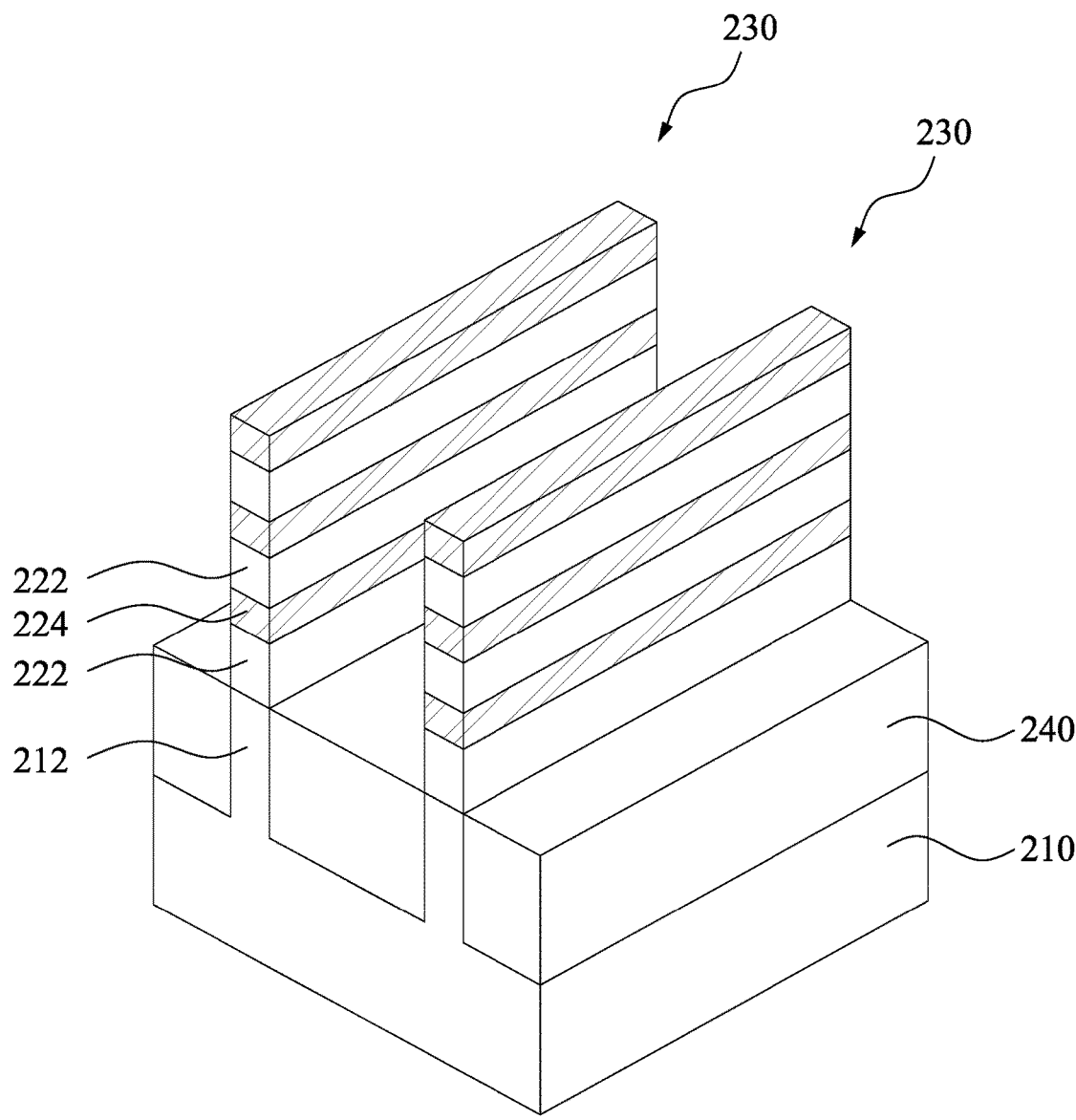

Next, as illustrated in FIG. 23, STI regions 240 are formed interposing the fins 230. Materials and process details about the STI regions 240 are similar to that of the STI regions 14 discussed previous, and thus they are not repeated for the sake of brevity.

Figure 24A:
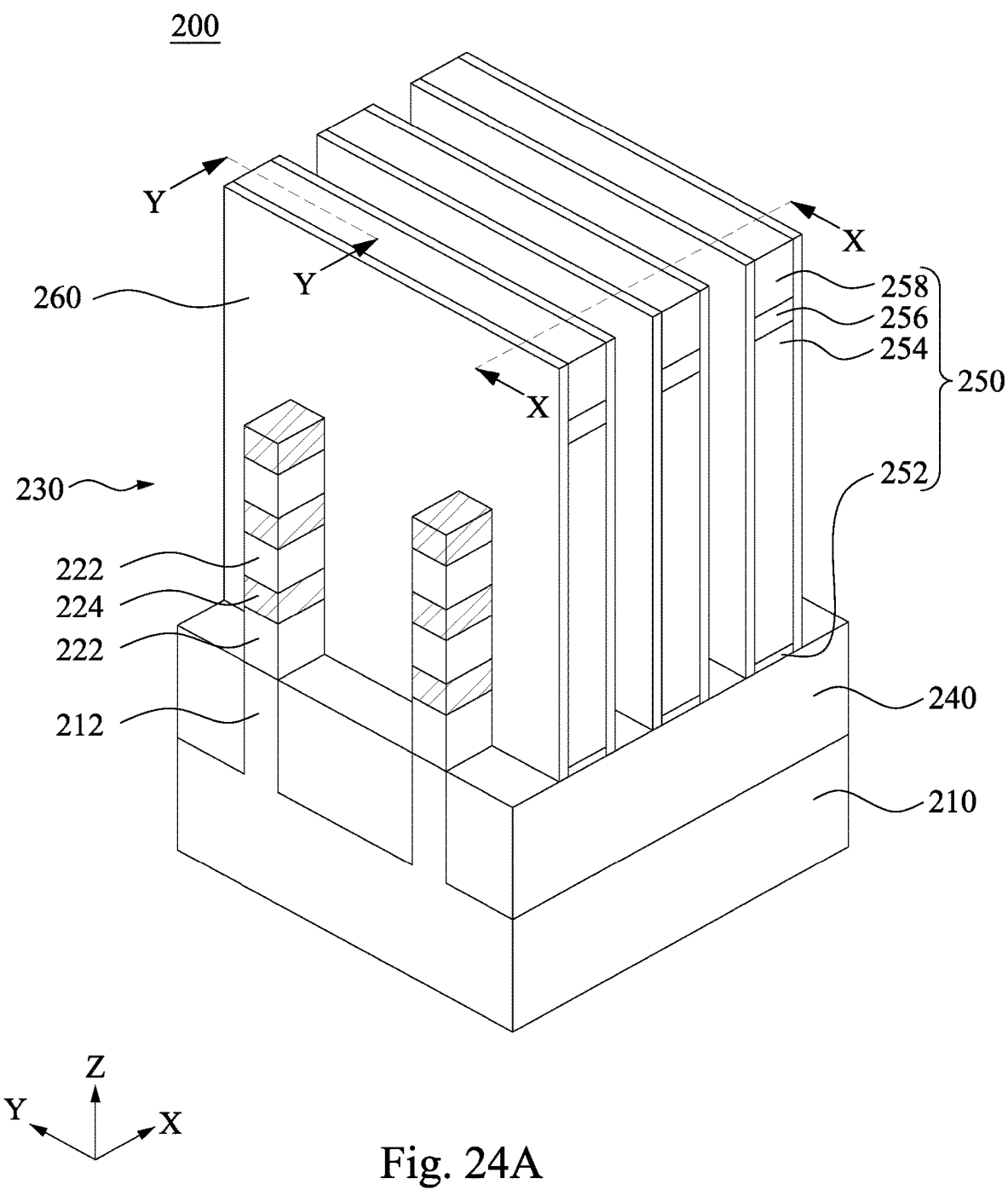
Figure 24B:
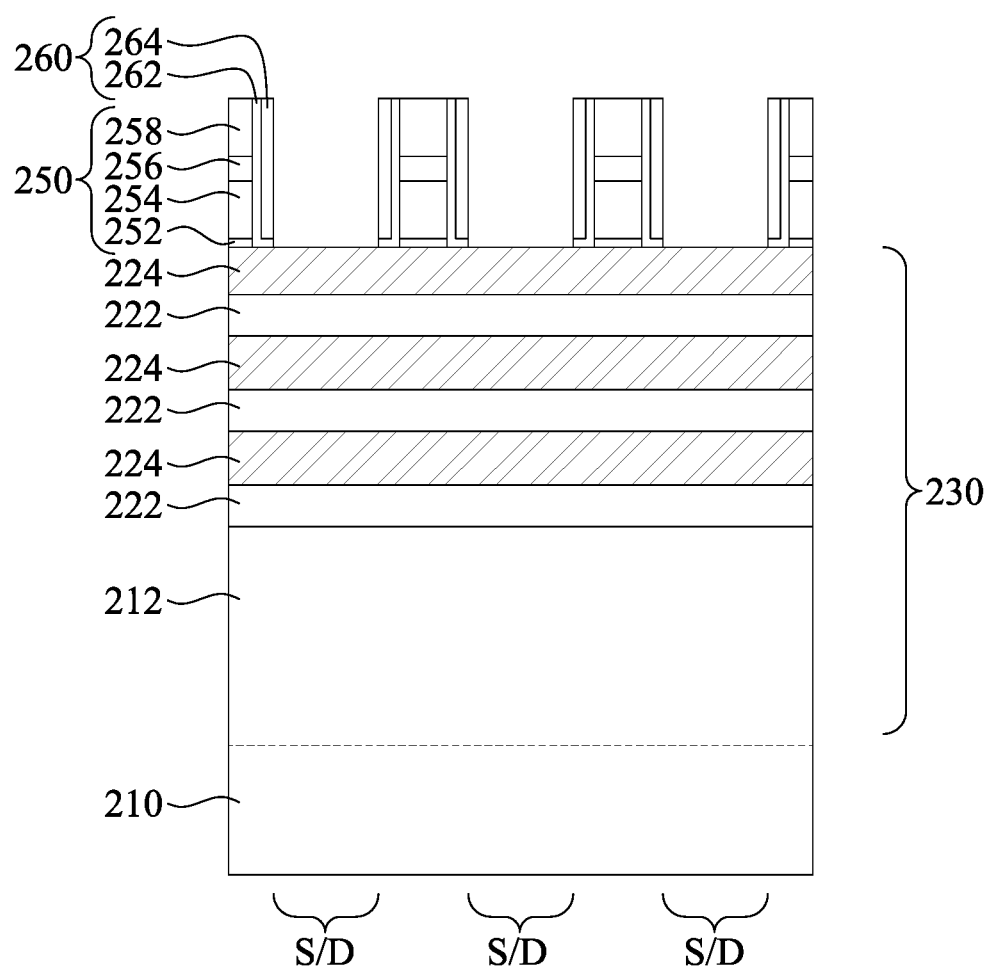

Reference is made to FIGS. 24A and 24B. Dummy gate structures 250 are formed over the substrate 210 and are at least partially disposed over the fins 230. The portions of the fins 230 underlying the dummy gate structures 250 may be referred to as the channel regions. The dummy gate structures 250 may also define source/drain (S/D) regions of the fins 230, for example, the regions of the fins 230 adjacent and on opposing sides of the channel regions.

Dummy gate formation step first forms a dummy gate dielectric layer 252 over the fins 230. Subsequently, a dummy gate electrode layer 254 and a hard mask which may include multiple layers 256 and 258 (e.g., an oxide layer 256 and a nitride layer 258) are formed over the dummy gate dielectric layer 252. The hard mask is then patterned, followed by patterning the dummy gate electrode layer 252 by using the patterned hard mask as an etch mask. In some embodiments, after patterning the dummy gate electrode layer 254, the dummy gate dielectric layer 252 is removed from the S/D regions of the fins 230. The etch process may include a wet etch, a dry etch, and/or a combination thereof. The etch process is chosen to selectively etch the dummy gate dielectric layer 252 without substantially etching the fins 230, the dummy gate electrode layer 254, the oxide mask layer 256 and the nitride mask layer 258. Materials of the dummy gate dielectric layer and dummy gate electrode layer are similar to that of the dummy gate dielectric layer 108 and dummy gate electrode layer 110 discussed previously, and thus they are not repeated for the sake of brevity.

After formation of the dummy gate structures 250 is completed, gate spacers 260 are formed on sidewalls of the dummy gate structures 250. For example, a spacer material layer is deposited on the substrate 210. The spacer material layer may be a conformal layer that is subsequently etched back to form gate sidewall spacers. In the illustrated embodiment, a spacer material layer 260 is disposed conformally on top and sidewalls of the dummy gate structures 250. The spacer material layer 260 may include a dielectric material such as silicon oxide, silicon nitride, silicon carbide, silicon oxynitride, SiCN films, silicon oxycarbide, SiOCN films, and/or combinations thereof. In some embodiments, the spacer material layer 260 includes multiple layers, such as a first spacer layer 262 and a second spacer layer 264 (illustrated in FIG. 24B) formed over the first spacer layer 262. By way of example, the spacer material layer 260 may be formed by depositing a dielectric material over the gate structures 250 using suitable deposition processes. An anisotropic etching process is then performed on the deposited spacer material layer 260 to expose portions of the fins 230 not covered by the dummy gate structure 250 (e.g., in source/drain regions of the fins 230). Portions of the spacer material layer directly above the dummy gate structure 250 may be completely removed by this anisotropic etching process. Portions of the spacer material layer on sidewalls of the dummy gate structure 250 may remain, forming gate sidewall spacers, which are denoted as the gate spacers 260, for the sake of simplicity. It is noted that although the gate spacers 260 are multi-layer structures in the cross-sectional view of FIG. 24B, they are illustrated as single-layer structures in the perspective view of FIG. 24A for the sake of simplicity.

Figure 25A:
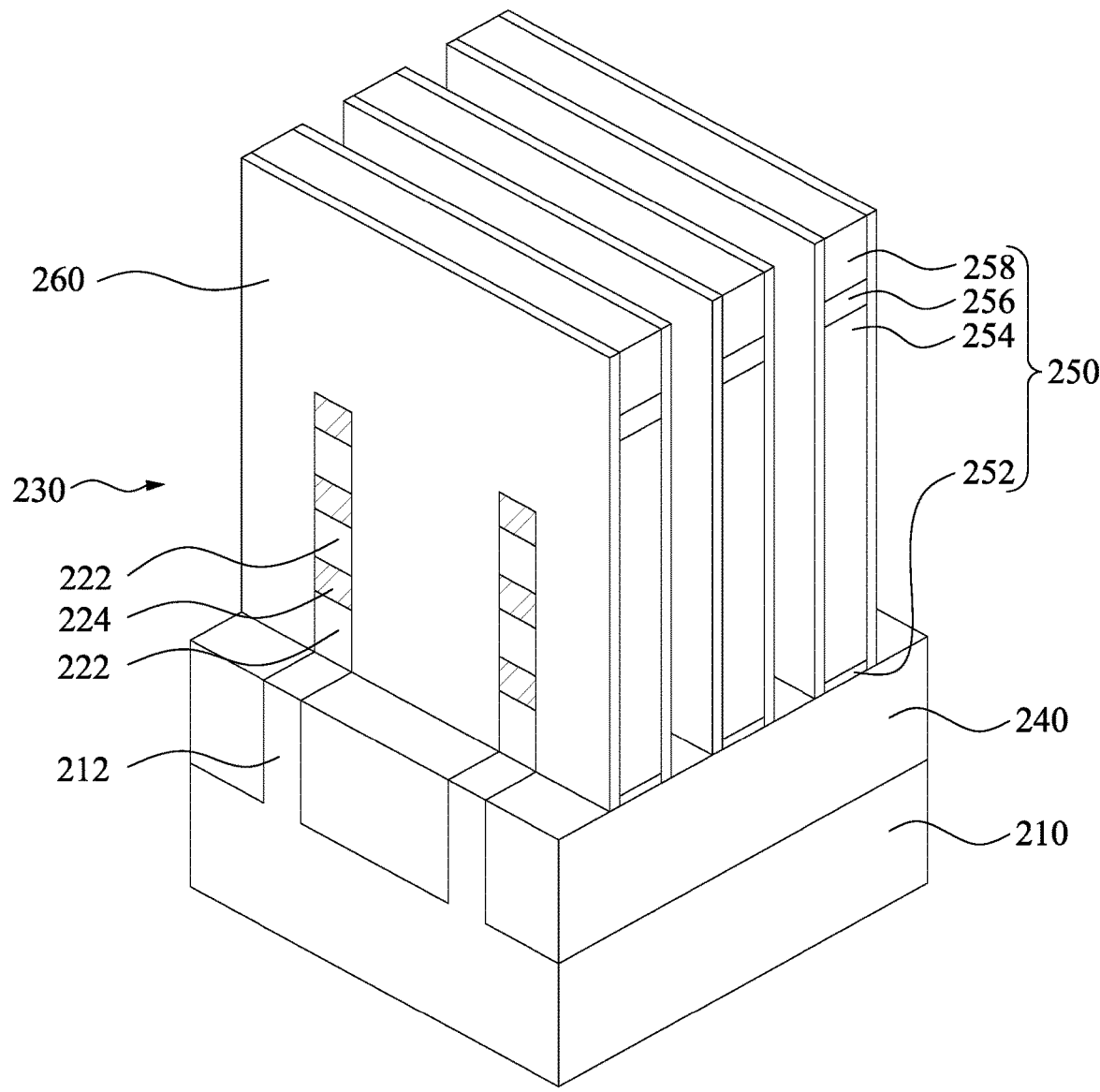
Figure 25B:
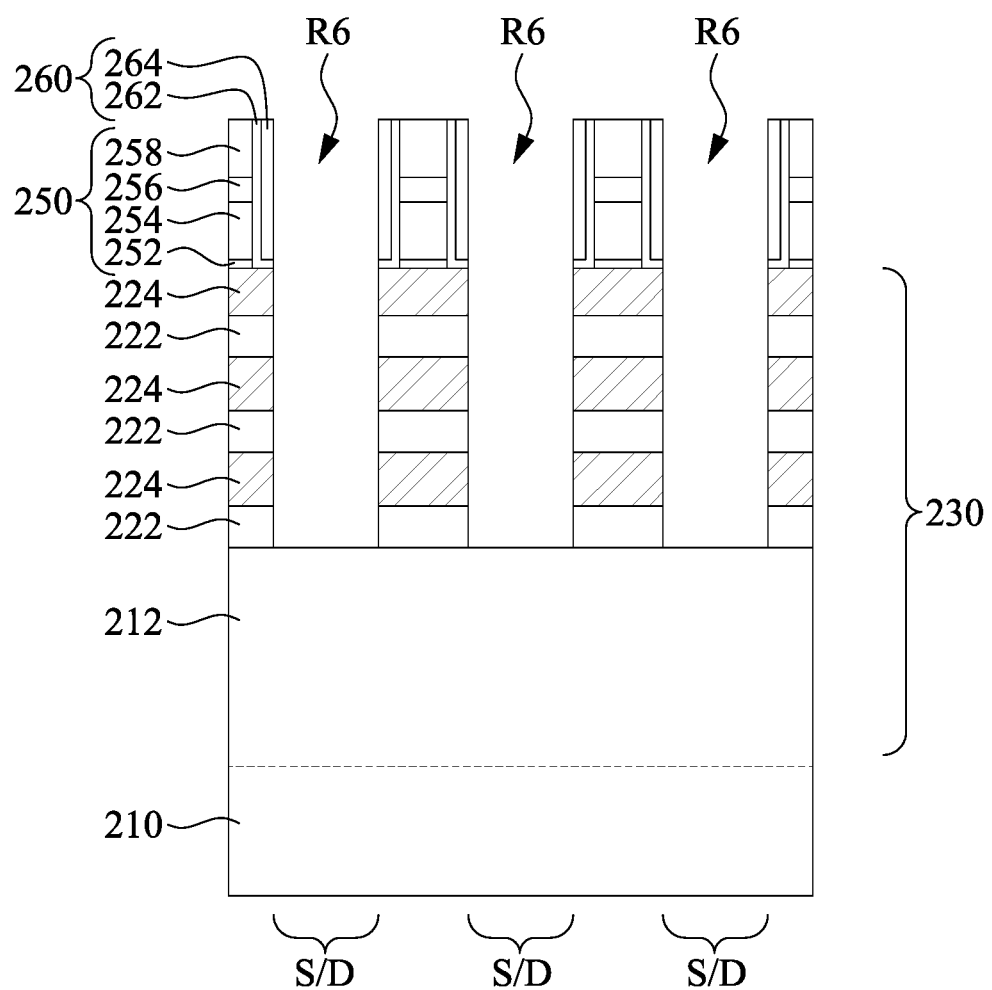

Next, as illustrated in FIGS. 25A and 25B, exposed portions of the semiconductor fins 230 that extend laterally beyond the gate spacers 260 (e.g., in source/drain regions of the fins 230) are etched by using, for example, an anisotropic etching process that uses the dummy gate structure 250 and the gate spacers 260 as an etch mask, resulting in recesses R6 into the semiconductor fins 230 and between corresponding dummy gate structures 250. After the anisotropic etching, end surfaces of the sacrificial layers 222 and channel layers 224 are aligned with respective outermost sidewalls of the gate spacers 260, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 26A:
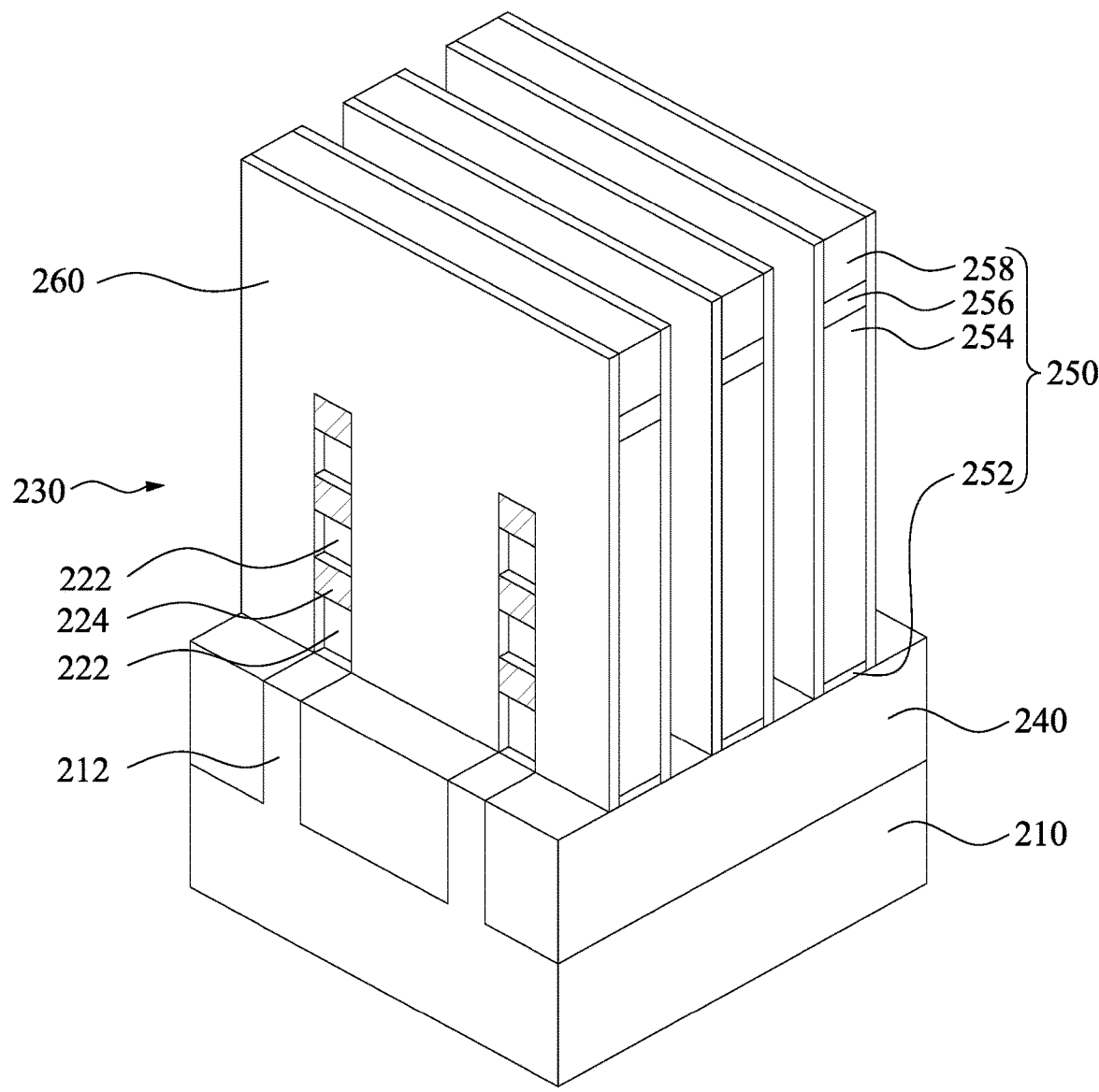
Figure 26B:
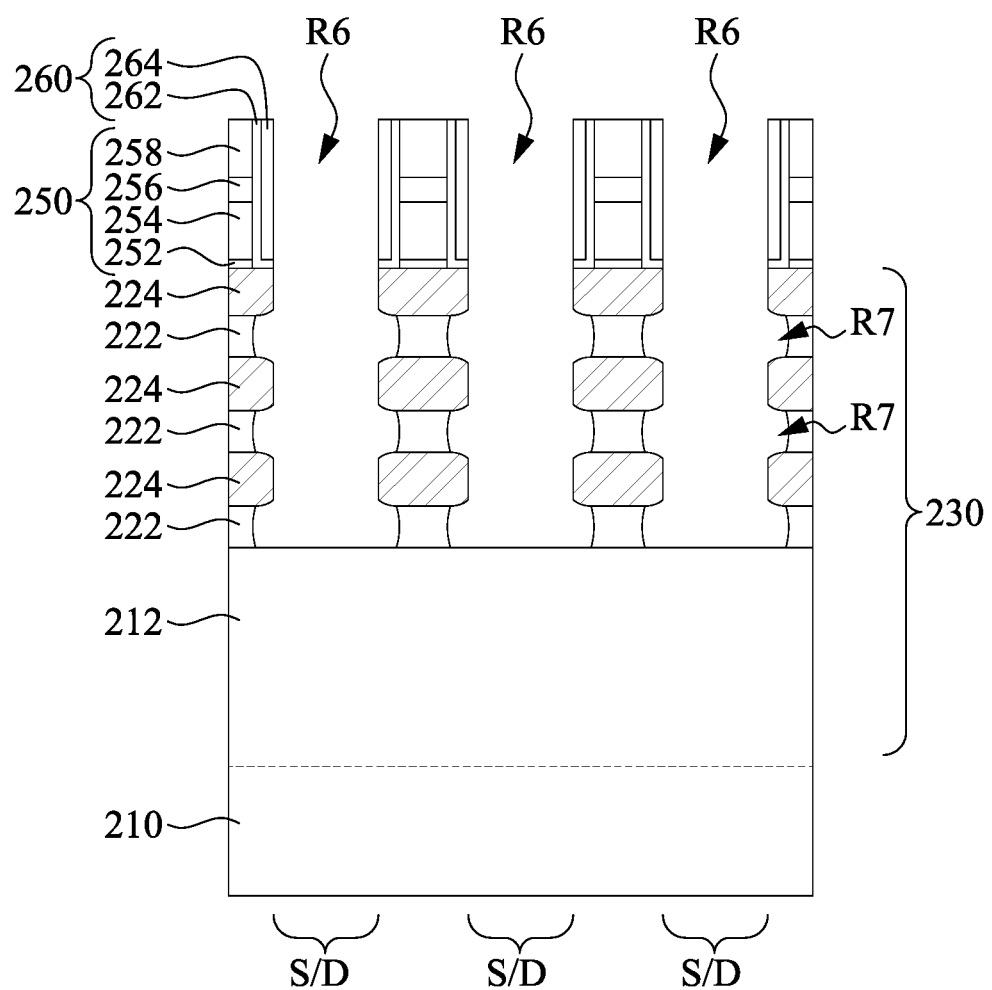

Next, in FIGS. 26A and 26B, the sacrificial layers 222 are laterally or horizontally recessed by using suitable etch techniques, resulting in lateral recesses R7 each vertically between corresponding channel layers 224. This step may be performed by using a selective etching process. By way of example and not limitation, the sacrificial layers 222 are SiGe and the channel layers 224 are silicon allowing for the selective etching of the sacrificial layers 222. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 224 is not significantly etched by the process of laterally recessing the sacrificial layers 222. As a result, the channel layers 224 laterally extend past opposite end surfaces of the sacrificial layers 222.

Figure 27A:
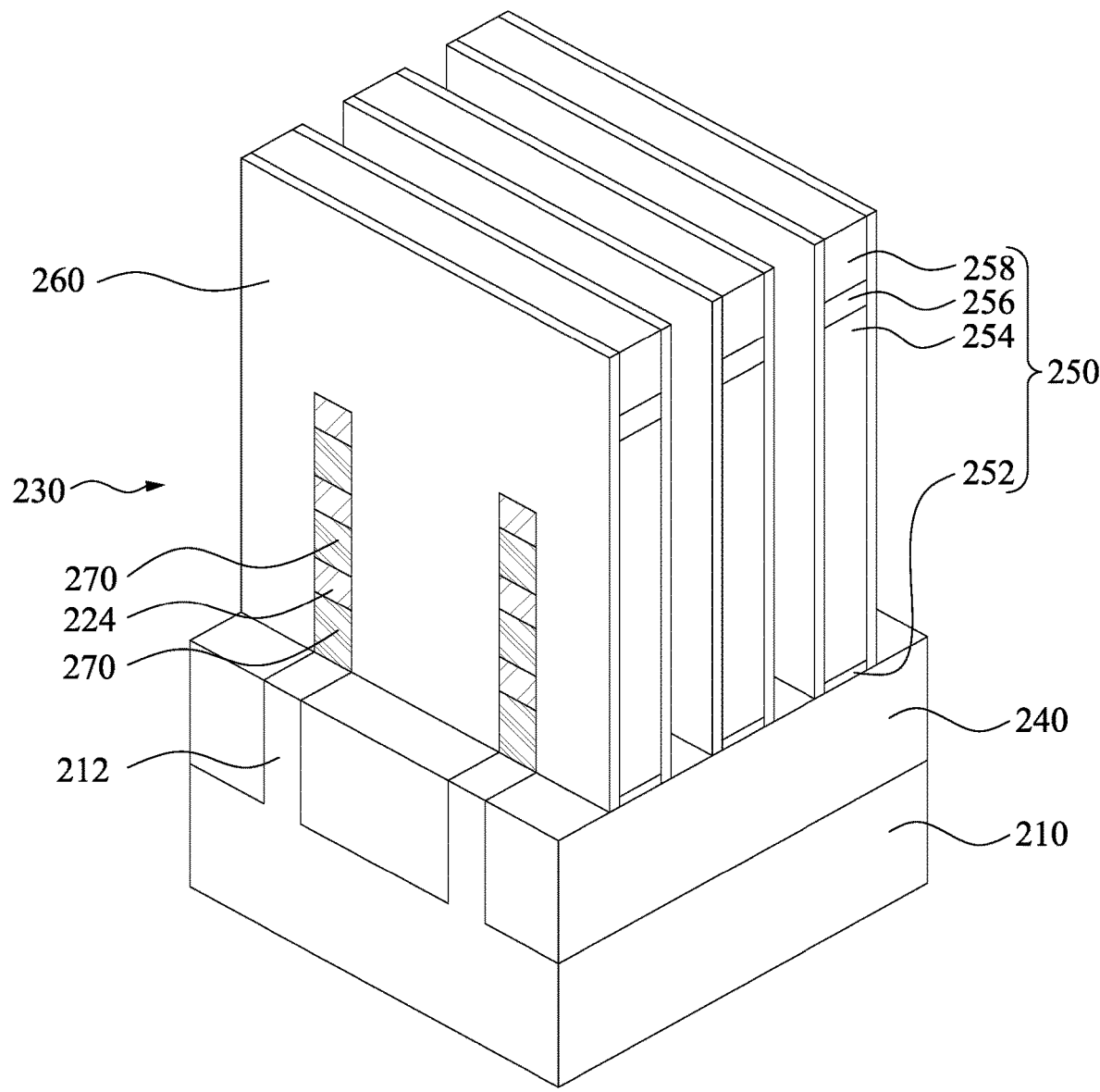
Figure 27B:
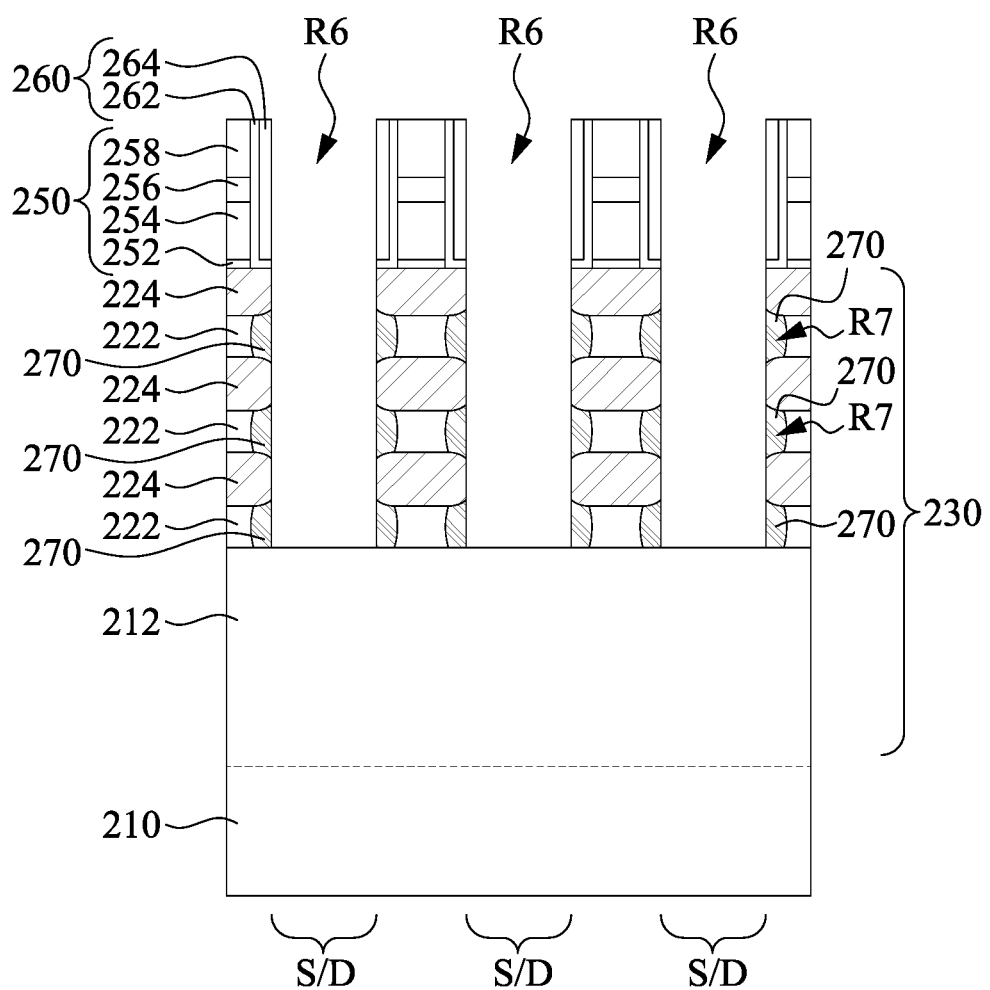

In FIGS. 27A and 27B, an inner spacer material layer 270 is formed to fill the recesses R7 left by the lateral etching of the sacrificial layers 222 discussed above with reference to FIGS. 26A and 26B. The inner spacer material layer 270 may be a low-k dielectric material, such as $SiO_2$, SiN, SiCN, or SiOCN, and may be formed by a suitable deposition method, such as ALD. After the deposition of the inner spacer material layer 270, an anisotropic etching process may be performed to trim the deposited inner spacer material 270, such that only portions of the deposited inner spacer material 270 that fill the recesses R7 left by the lateral etching of the sacrificial layers 222 are left. After the trimming process, the remaining portions of the deposited inner spacer material are denoted as inner spacers 270, for the sake of simplicity. The inner spacers 270 serve to isolate metal gates from source/drain epitaxial structures formed in subsequent processing. In the example of FIGS. 27A and 27B, outermost sidewalls of the inner spacers 270 are substantially aligned with sidewalls of the channel layers 224.

Figure 28:
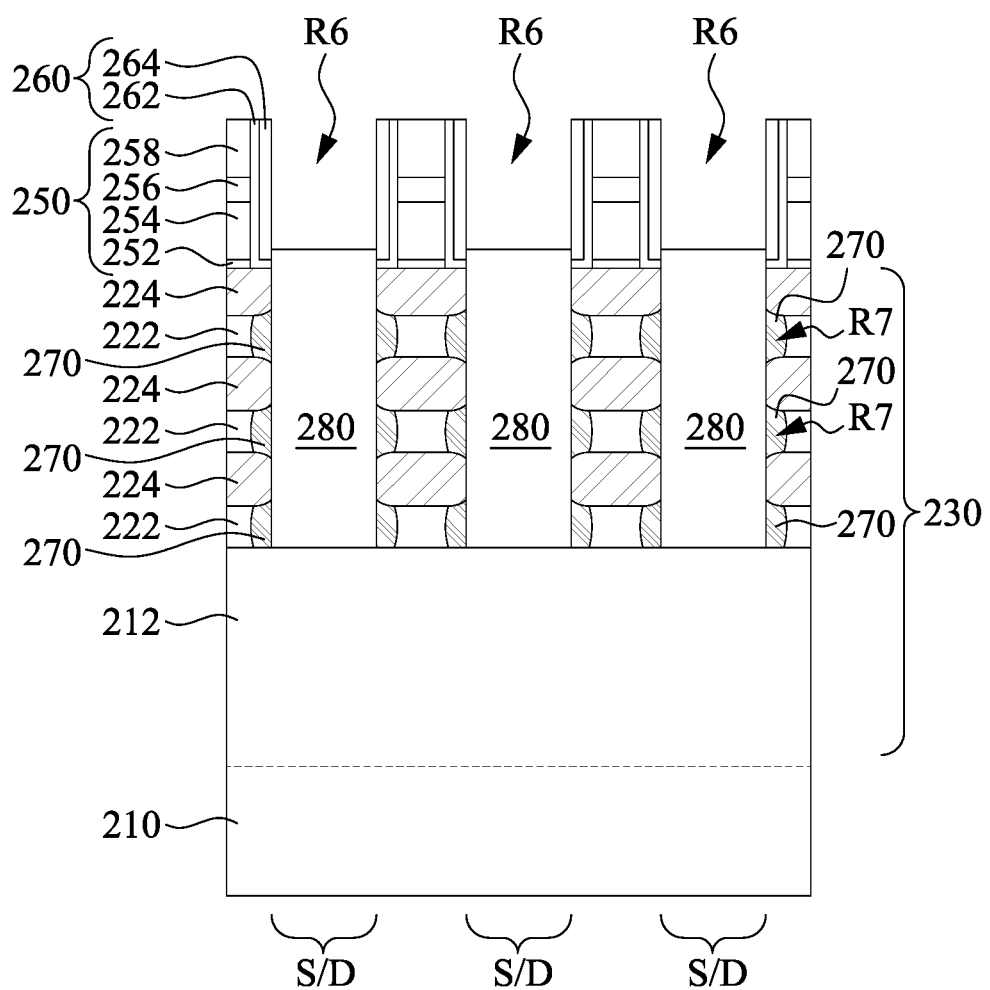

In FIG. 28, source/drain epitaxial structures 280 are formed over the source/drain regions S/D of the semiconductor fins 230. The source/drain epitaxial structures 280 may be formed by performing an epitaxial growth process that provides an epitaxial material on the fins 230. During the epitaxial growth process, the gate sidewall spacers 260 and the inner spacers 270 limit the source/drain epitaxial structures 280 to the source/drain regions S/D. Materials and process details about the source/drain epitaxial structures 280 of GAA FETs are similar to that of the source/drain epitaxial structures 122 of FinFETs discussed previously, and thus they are not repeated for the sake of brevity.

Figure 29:
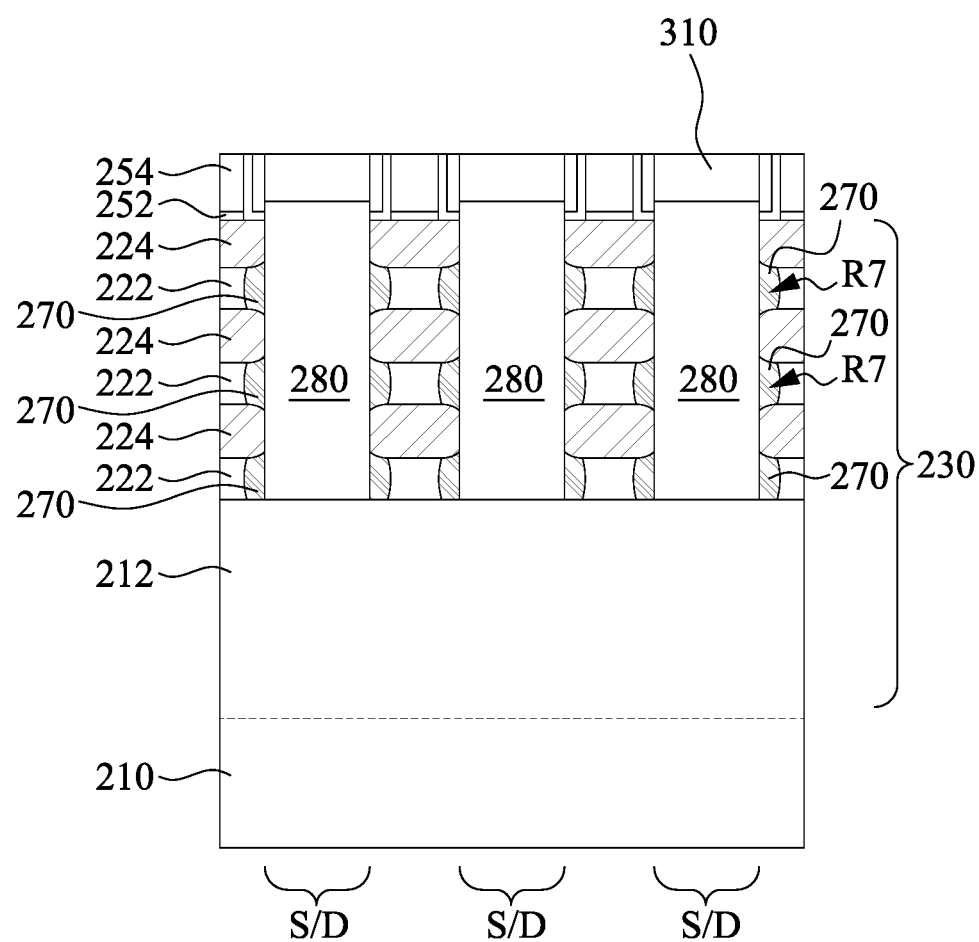
Figure 30:
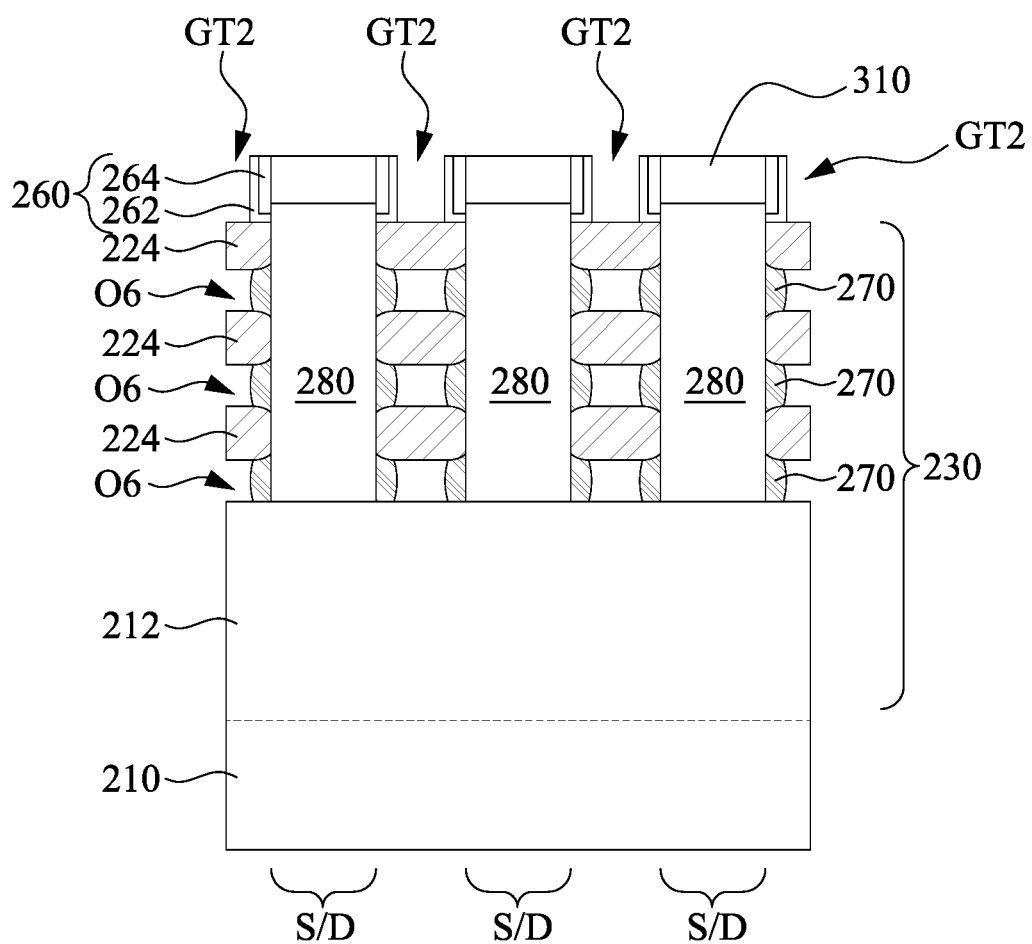

In FIG. 29, an interlayer dielectric (ILD) layer 310 is formed on the substrate 210. In some embodiments, a CESL is optionally formed prior to forming the ILD layer 310. In some examples, after depositing the ILD layer 310, a planarization process may be performed to remove excessive materials of the ILD layer 310. For example, a planarization process includes a chemical mechanical planarization (CMP) process which removes portions of the ILD layer 310 (and CESL layer, if present) overlying the dummy gate structures 250 and planarizes a top surface of the integrated circuit structure 200. In some embodiments, the CMP process also removes hard mask layers 256, 258 (as shown in FIG. 28) and exposes the dummy gate electrode layer 254.

Thereafter, dummy gate structures 250 are removed first, and then the sacrificial layers 222 are removed. The resulting structure is illustrated in FIG. 30. In some embodiments, the dummy gate structures 250 are removed by using a selective etching process (e.g., selective dry etching, selective wet etching, or a combination thereof) that etches the materials in dummy gate structures 250 at a faster etch rate than it etches other materials (e.g., gate sidewall spacers 260 and/or ILD layer 310), thus resulting in gate trenches GT2 between corresponding gate sidewall spacers 260, with the sacrificial layers 222 exposed in the gate trenches GT2. Subsequently, the sacrificial layers 222 in the gate trenches GT2 are removed by using another selective etching process that etches the sacrificial layers 222 at a faster etch rate than it etches the channel layers 224, thus forming openings O6 between neighboring channel layers 224. In this way, the channel layers 224 become nanosheets suspended over the substrate 210 and between the source/drain epitaxial structures 280. This step is also called a channel release process. At this interim processing step, the openings O6 between nanosheets 224 may be filled with ambient environment conditions (e.g., air, nitrogen, etc). In some embodiments, the nanosheets 224 can be interchangeably referred to as nanowires, nanoslabs and nanorings, depending on their geometry. For example, in some other embodiments the channel layers 224 may be trimmed to have a substantial rounded shape (i.e., cylindrical) due to the selective etching process for completely removing the sacrificial layers 222. In that case, the resultant channel layers 224 can be called nanowires.

In some embodiments, the sacrificial layers 222 are removed by using a selective wet etching process. In some embodiments, the sacrificial layers 222 are SiGe and the channel layers 224 are silicon allowing for the selective removal of the sacrificial layers 222. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 224 may not be significantly etched by the channel release process. It can be noted that both the channel release step and the previous step of laterally recessing sacrificial layers (the step as shown in FIGS. 26A and 26B) use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

Figure 31A:
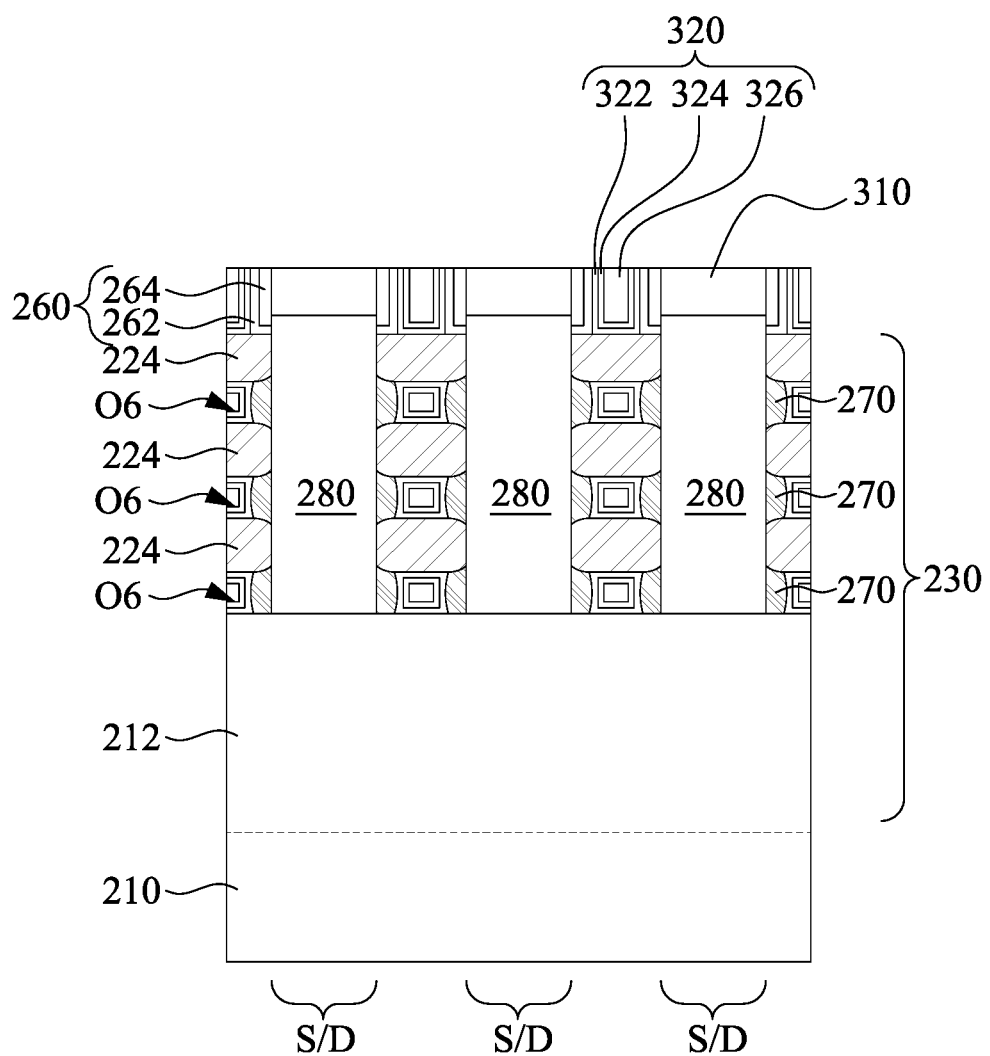
Figure 31B:
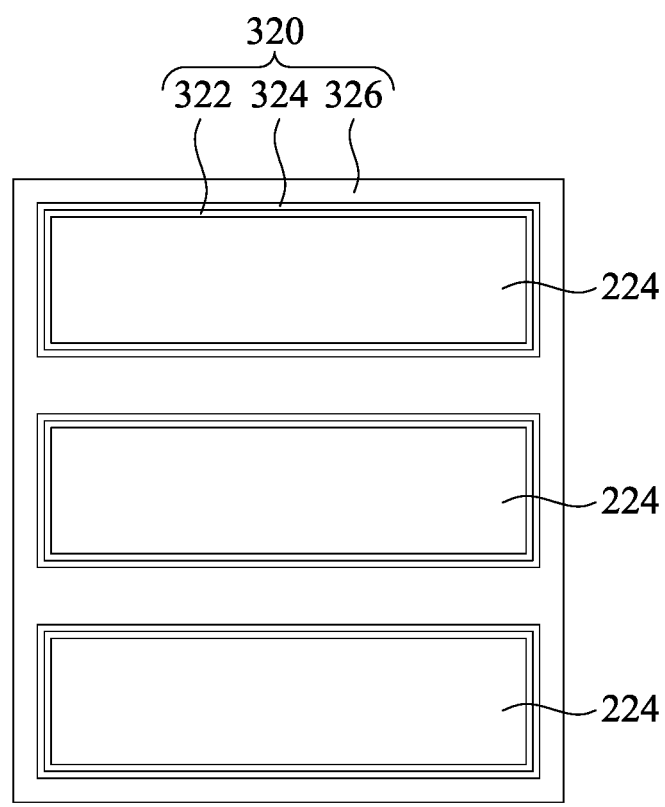

In FIGS. 31A and 31B, replacement gate structures 320 are respectively formed in the gate trenches GT2 to surround each of the nanosheets 224 suspended in the gate trenches GT2. The gate structures 320 may be final gates of GAA FETs. The final gate structure may be a high-k/metal gate stack, however other compositions are possible. In some embodiments, each of the gate structures 320 forms the gate associated with the multi-channels provided by the plurality of nanosheets 224. For example, high-k/metal gate structures 320 are formed within the openings O6 (as illustrated in FIG. 30) provided by the release of nanosheets 224. In various embodiments, the high-k/metal gate structure 320 includes a gate dielectric layer 322 formed around the nanosheets 224, a work function metal layer 324 formed around the gate dielectric layer 322, and a fill metal 326 formed around the work function metal layer 324 and filling a remainder of gate trenches GT2. The gate dielectric layer 332 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 324 and/or fill metal layer 326 used within high-k/metal gate structures 320 may include a metal, metal alloy, or metal silicide. Formation of the high-k/metal gate structures 320 may include depositions to form various gate materials, one or more liner layers, and one or more CMP processes to remove excessive gate materials. As illustrated in a cross-sectional view of FIG. 31B that is taken along a longitudinal axis of a high-k/metal gate structure 320, the high-k/metal gate structure 320 surrounds each of the nanosheets 224, and thus is referred to as a gate of a GAA FET. Materials and process details about the gate structures 320 of GAA FETs are similar to the gate structures 130 of FinFETs, and thus they are not repeated for the sake of brevity.

Figure 32:
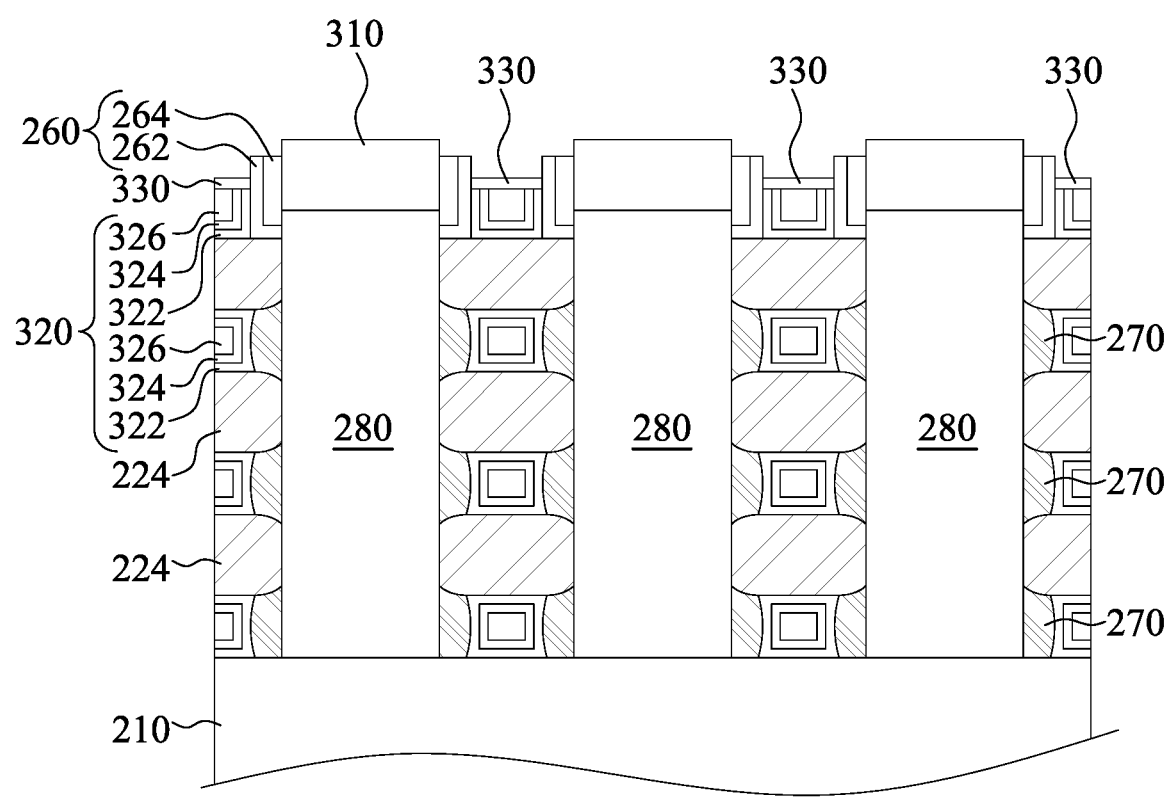

In FIG. 32, an etching back process is performed to etch back the replacement gate structures 320 and the gate spacers 260, resulting in recesses over the etched-back gate structures 320 and the etched-back gate spacers 260. In some embodiments, because the materials of the replacement gate structures 320 have a different etch selectivity than the gate spacers 260, the top surfaces of the replacement gate structures 320 may be at a different level than the top surfaces of the gate spacers 260. For example, in the depicted embodiment as illustrated in FIG. 32, the replacement gate structures 320's top surfaces are lower than the top surfaces of the gate spacers 260. However, in some other embodiments, the top surfaces of the replacement gate structures 320 may be level with or higher than the top surfaces of the gate spacers 260.

Then, gate metal caps 330 are optionally formed respectively atop the etched-back replacement gate structures 320 by suitable process, such as CVD or ALD. The metal caps 330 may be, by way of example and not limitation, substantially fluorine-free tungsten (FFW) films having an amount of fluorine contaminants less than 5 atomic percent and an amount of chlorine contaminants greater than 3 atomic percent. Process Detail about FFW formation is discussed previously with respect to the gate metal caps 138, and thus they are not repeated for the sake of brevity.

Figure 33:
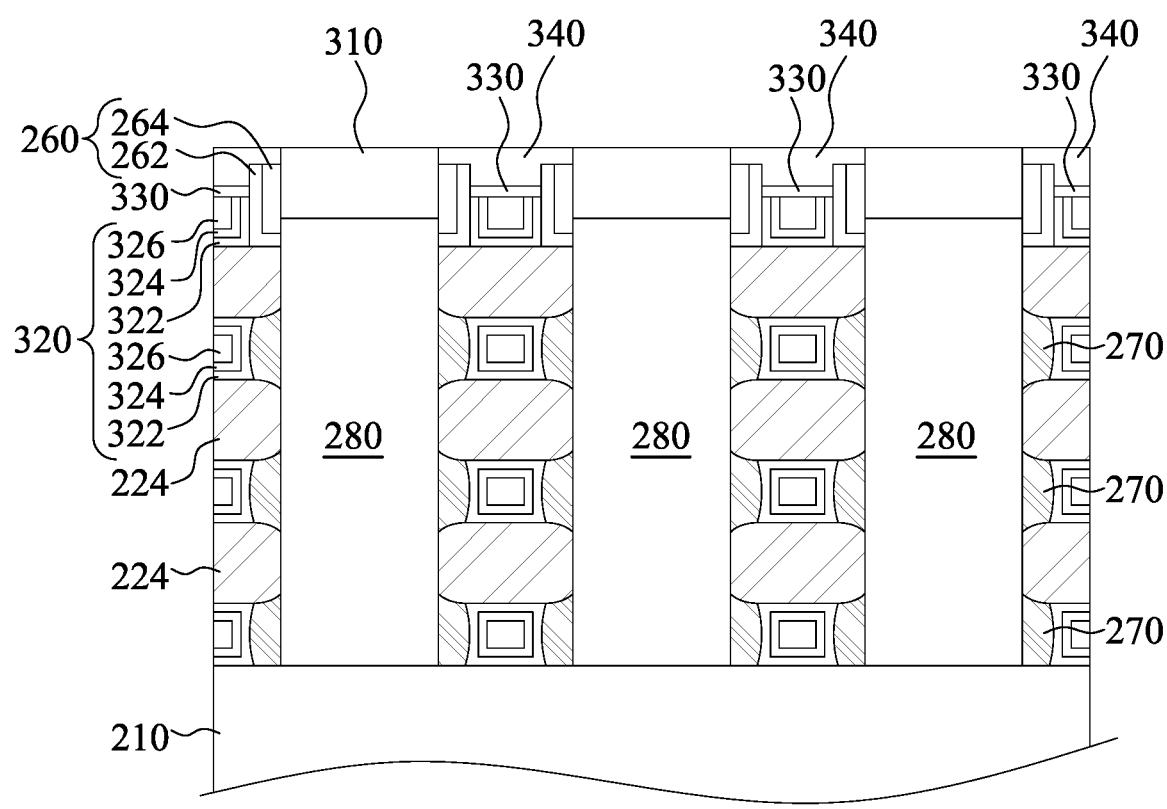

In FIG. 33, gate dielectric caps 340 are formed over the gate metal caps 330 and the gate spacers 260. Because the gate metal caps 330 have top surfaces lower than top surfaces of the gate spacers 260, each of the gate dielectric caps 340 has a stepped bottom surface with a lower step contacting a top surface of a gate metal cap 330 and an upper step contacting a top surface of the gate spacer 260. Materials and process details about the dielectric caps are similar to that of the gate dielectric caps 142 discussed previously, and thus they are not repeated for the sake of brevity.

Figure 34:
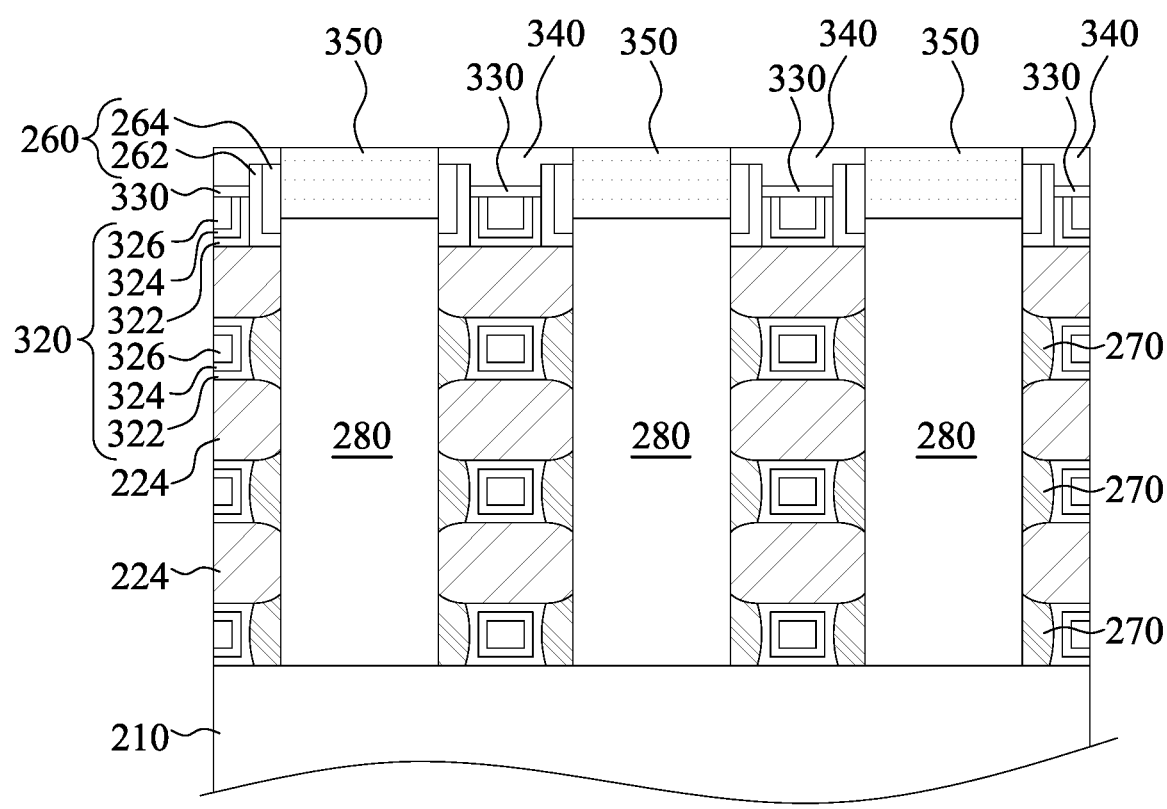

In FIG. 34, source/drain contacts 350 are formed extending through the ILD layer 310. Formation of the source/drain contacts 350 includes, by way of example and not limitation, performing one or more etching processes to form contact openings extending through the ILD layer 310 to expose the source/drain epitaxial structures 280, depositing one or more metal materials overfilling the contact openings, and then performing a CMP process to remove excessive metal materials outside the contact openings. In some embodiments, the one or more etching processes are selective etching that etches the ILD layer 310 at a faster etch rate than etching the gate dielectric caps 340 and the gate spacers 260. As a result, the selective etching is performed using the gate dielectric caps 340 and the gate spacers 260 as an etch mask, such that the contact openings and hence source/drain contacts 350 are formed self-aligned to the source/drain epitaxial structures 280 without using an additional photolithography process. In that case, the source/drain contacts 350 can be called self-aligned contacts (SAC), and the gate dielectric caps 340 allowing for forming the self-aligned contacts 350 can be called SAC caps 340.

Figure 35:
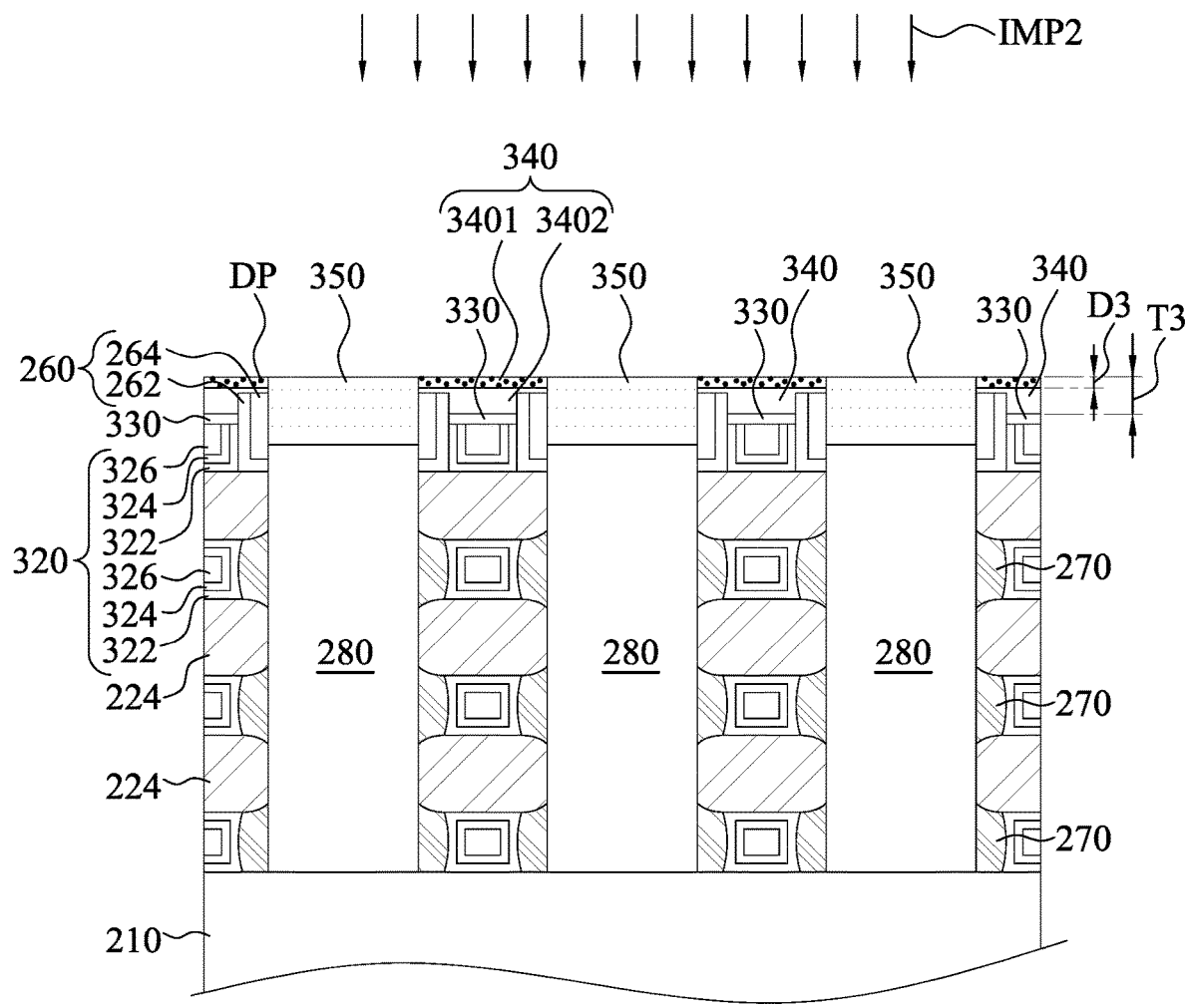

In FIG. 35, an ion implantation process IMP2 is performed to dope one or more impurities (e.g., dopant ions) into the gate dielectric caps 340. For example, ionized dopants DP (e.g., oxygen, germanium, argon, xenon, boron and/or other suitable species that is able to create a different etch selectivity than a material of gate dielectric caps 340) can be implanted into the gate dielectric caps 340, thus forming doped regions 3401 in the gate dielectric caps 340. In some embodiments, a patterned mask (e.g., patterned photoresist) may be formed by using suitable photolithography processes to cover the exposed surfaces of the source/drain contacts 350 before performing the ion implantation process IMP2, the ion implantation process IMP2 is performed with the patterned mask in place, and the patterned mask is then removed (e.g., by ashing) after the ion implantation process IMP2 is completed. In this scenario, the source/drain contacts 350 are substantially free of the dopants DP. Alternatively, the ion implantation process IMP2 may also implant some ionized dopants DP into the source/drain contacts 350 and thus form doped regions in the source/drain contacts 350. In this scenario, the doped regions in the source/drain contacts 350 may then be punched through in a subsequent etching process for forming source/drain vias over the source/drain contacts 350. Process details about the ion implantation process IMP2 is similar to that of the ion implantation process IMP1 discussed previously, and thus they are not repeated for the sake of brevity.

In some embodiments, the ion implantation process implants molecular oxygen ions ($O_2^+$) or atomic oxygen ions ($O^+$) into the gate dielectric caps 340, and thus the oxygen-doped regions 3401 have a higher oxygen concentration than un-doped regions 3402 of the gate dielectric caps 340. By way of example and not limitation, the oxygen-doped regions 3401 have an oxygen concentration in a range from about 1E18 atoms/cm$^3$ to about 5E23 atoms/cm$^3$, and the un-doped regions 3402 have a substantial zero oxygen concentration. If the oxygen-doped regions 3401 have an excessively high oxygen concentration, an etch rate of the oxygen-doped regions 3401 may be too slow to be punched through within an expected duration time in the subsequent LRM etching process. If the oxygen-doped regions 3401 have an excessively low oxygen concentration, an etch rate of the oxygen-doped regions 3401 may be too fast to slow down the subsequent LRM etching process.

In some embodiments, the oxygen-doped regions 3401 have an oxygen concentration gradient due to the ion implantation process IMP2. In greater detail, the oxygen concentration of the oxygen-doped regions 3401 changes as a function of depth inside the oxygen-doped regions 3401. For example, the oxygen concentration may decrease as a distance from top surfaces of the oxygen-doped regions 3401 increases. In some embodiments where the gate dielectric caps 340 are silicon nitride, the oxygen-to-nitrogen atomic ratio in the oxygen doped regions 3401 is gradient as well. For example, the oxygen-to-nitrogen atomic ratio in the oxygen-doped regions 3401 may decrease as a distance from top surfaces of the oxygen-doped regions 3401 increases.

In some embodiments, the doped regions 3401 have a dopant depth D3 that extends from top surfaces of the gate dielectric caps 340 into the gate dielectric caps 340. In some embodiments, for 3 nm technology node the dopant depth D3 is in a range from about 1 Angstroms to about 50 Angstroms. In some further embodiments, a ratio of the dopant depth D3 to a maximal thickness T3 of the gate dielectric caps 340 is in a range from about 3% to about 60%. If the dopant depth D3 and/or the D3/T3 ratio are excessively small, the doped regions 3401 may be too thin to slow down the subsequent LRM etching process. If the dopant depth D3 and/or the D3/T3 ratio are excessively large, the doped regions 3401 may be too thick to be punched through within an expected duration time. For other technology nodes, such as 20 nm node, 16 nm node, 10 nm node, 7 nm node, and/or 5 nm node, the dopant depth D3 may be in a range from about 1 nm to about 20 nm.

In some embodiments, after the ion implantation process IMP2 is completed, an annealing process may be performed to repair implant damage in the gate dielectric caps 340 and/or the source/drain contacts 350. In some other embodiments, the annealing process can be skipped so that the doped regions 3401 may experience no annealing.

Figure 36:
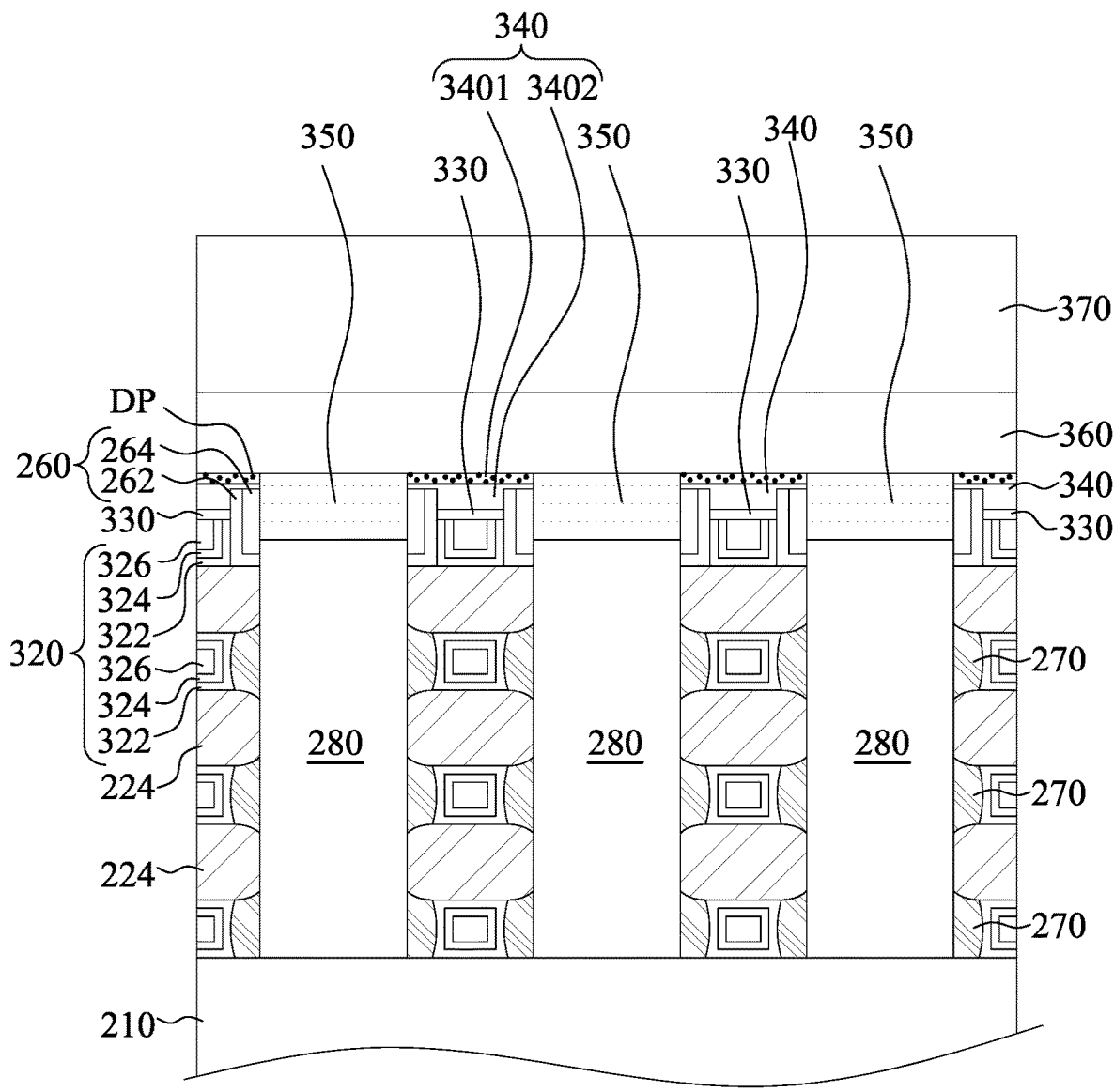

In FIG. 36, after the doped regions 3401 have been formed in the gate dielectric caps 340, a MCESL 360 is then deposited over the source/drain contacts 350 and the doped regions 3401. Subsequently, another ILD layer 370 is deposited over the MCESL 360. In some embodiments, the un-doped regions 3402 of the gate dielectric caps 340 and the MCESL 360 are both silicon nitride, and the ILD layer 370 is silicon oxide (SiO$_x$), and thus the ILD layer 370 and the doped regions 3401 (e.g., oxygen-doped regions) in the gate dielectric caps 340 have a different etch selectivity than both the un-doped regions 3402 and the MCESL 360.

Figure 37:
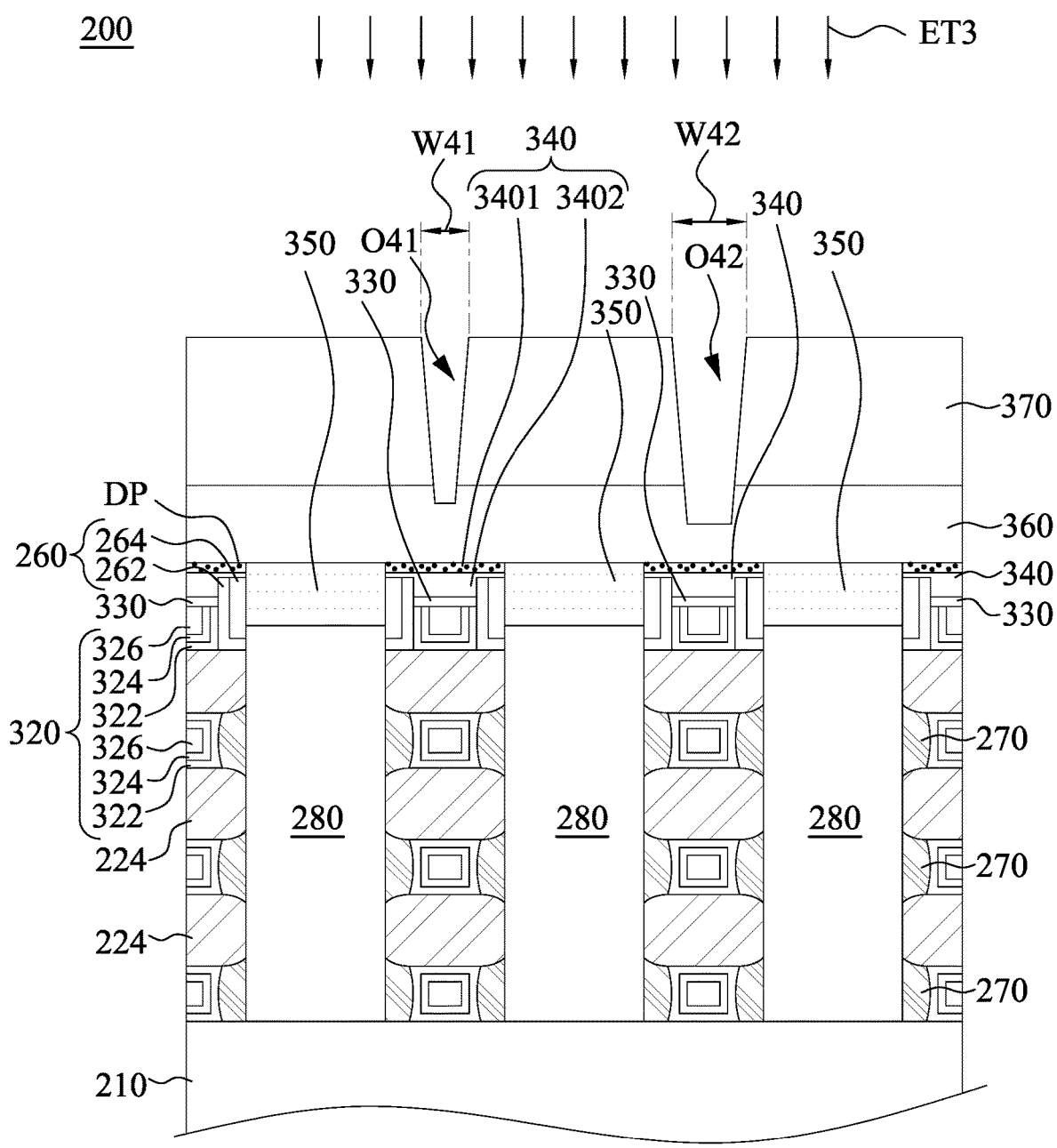

In FIG. 37, the ILD layer 370 is patterned to form gate contact openings O41 and O42 extending through the ILD layer 370 by using a first etching process (also called contact etching process) ET3. In some embodiments, the contact etching process ET3 is an anisotropic etching process, such as a plasma etching. Process details about the contact etching process ET3 is similar to that of the contact etching process ET1 discussed previously, and thus they are not repeated for the sake of brevity.

In some embodiments as illustrated in FIG. 37, a gate contact opening O41 of a first lateral dimension (e.g., first maximal width W41) and a gate contact opening O42 of a second lateral dimension (e.g., second maximal width W42) are formed simultaneously in the contact etching process ET3. The second maximal width W42 may be greater than the first maximal width W41. The width difference between the gate contact openings O41 and O42 may be intentionally formed depending on circuit functions and/or design rules. Alternatively, the width difference between the gate contact openings O41 and O42 may be inadvertently formed due to inaccuracies of the contact etching process ET3, as discussed previously with respect to the gate contact openings O21 and O22. The difference in widths of gate contact openings O41 and O42 results in that the wider gate contact opening O42 is deeper than the narrower gate contact opening O41.

Figure 38A:
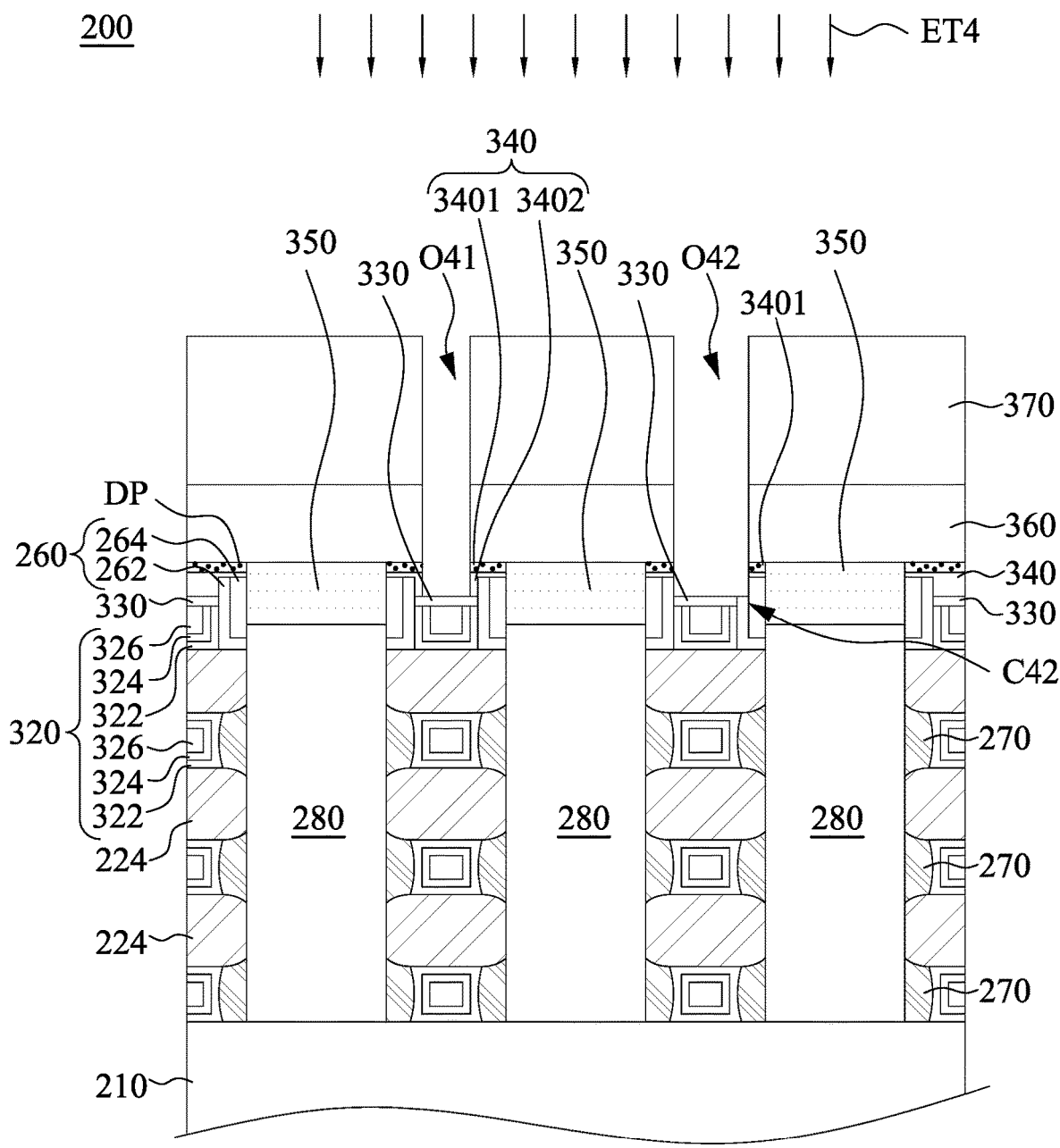

In FIG. 38A, an LRM etching process ET4 is performed to break through the MCESL 360 and the gate dielectric caps 340, thus deepening the gate contact openings O41 and O42 down to the gate metal caps 330 over the gate structures 320. As a result of the LRM etching process ET4, the gate metal caps 340 get exposed at bottoms of the deepened gate contact openings O41 and O42. The etchant and/or etching conditions of the LRM etching process ET4 are selected in such a way that the doped regions 3401 exhibit a slower etch rate than the MCESL 360 and the un-doped regions 3402. Process details about the LRM etching process ET4 are discussed previously with respect to the LRM etching process ET2, and thus they are not repeated herein for the sake of brevity.

Because the etch selectivity between the doped regions 3401 and the MCESL 360, the doped regions 3401 can slow down LRM etching process ET4 when the MCESL 360 is punched through, which in turn will slow down the vertical etch rate and the depth increasing in the gate contact openings O41 and O42 when the gate contact openings O41 and O42 reach the doped regions 3401. Therefore, the depth difference between the narrower gate contact opening O41 and the wider gate contact opening O42 can be reduced by the doped regions 3401. The reduced depth loading can thus prevent the tiger-tooth like pattern formed in the wider gate contact opening O42, which in turn reduces the risk of leakage current (e.g., leakage current from gate contacts to source/drain contacts). Moreover, because the doped regions 3401 slow down the vertical etch rate but not the lateral etch rate when the gate contact openings O41 and O42 reach the doped regions 3401, the LRM etching process ET4 can laterally expand lower portions of the gate contact openings O41 and O42 during etching the doped regions 3401, such that the bottom widths of the gate contact openings O41 and O42 can be increased, and the gate contact opening O41 and O42 can become more vertical than before doped regions 3401 are punched through.

Figure 38B:
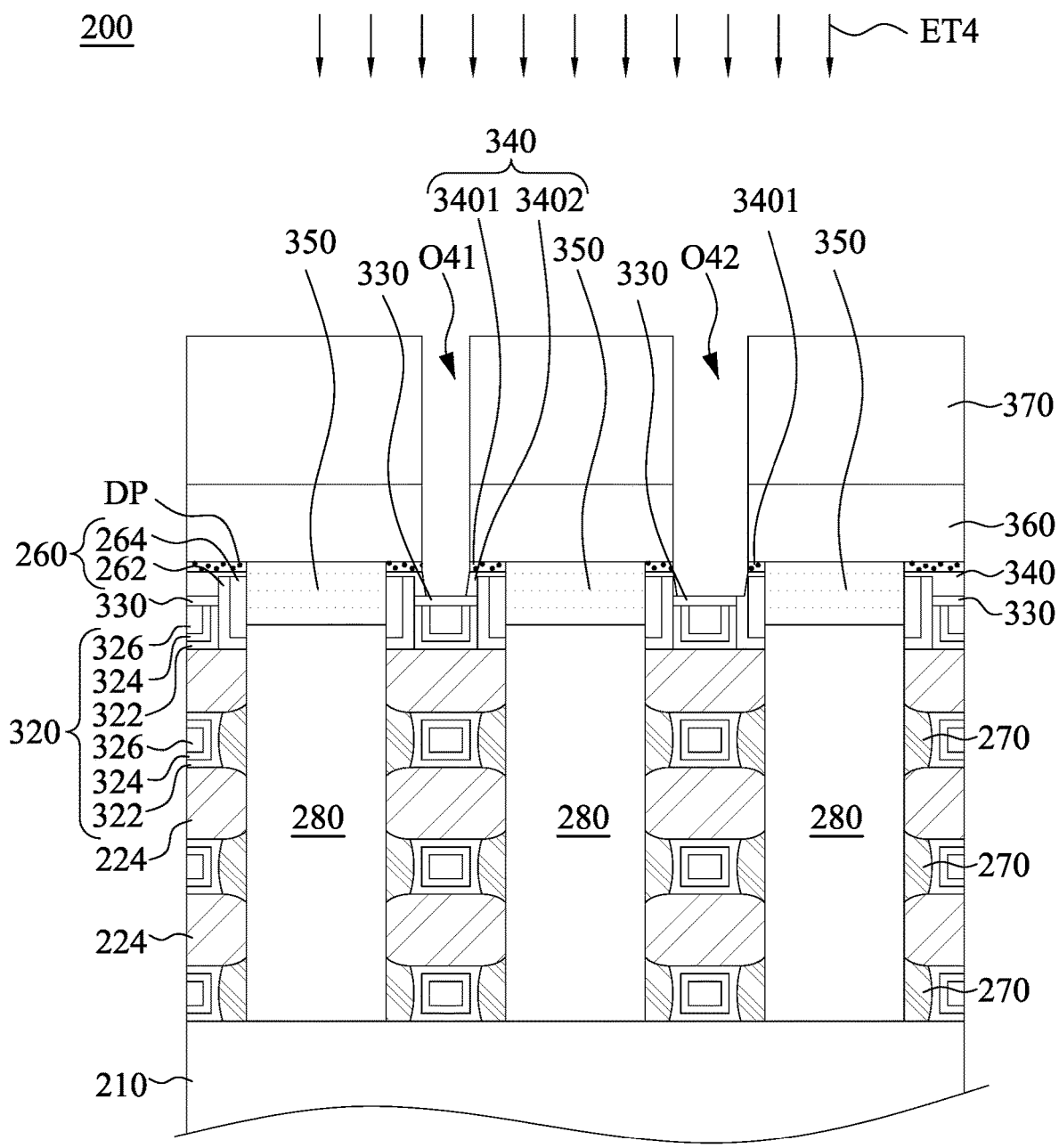

In some embodiments, the sidewalls of the gate contact openings O41 and O42 extend linearly and vertically through an entire thickness of the ILD layer 370, an entire thickness of the MCESL 360, an entire thickness of doped regions 3401 of the gate dielectric caps 340, and an entire thickness of un-doped regions 3402 of the dielectric caps 340, without a slope change. In some other embodiments as illustrated in FIG. 38B, the sidewalls of lower portions of the gate contact openings O41 and O42 may become tapered because the LRM etching process ET4 may etch the un-doped regions 3402 of the gate dielectric caps 340 at a faster vertical etch rate than etching the doped regions 3401, especially when the gate dielectric caps 340 are formed of the same material as the MCESL 360 (e.g., silicon nitride). In this scenario, sidewalls of the gate contact openings O41 and O42 may be more vertical (or steeper) within upper portions of the gate contact openings O41 and O42 than within lower portions of the gate contact openings O41 and O42, and the slope change in sidewalls of the gate contact openings O41 and O42 may be located at interfaces between the doped regions 3401 and the un-doped regions 3402.

In some embodiments as depicted in FIG. 38A, the wider gate contact opening O42 may extend into a neighboring gate spacer 260, resulting in a notched corner C42 in the gate spacer 260. This notched corner C42 may be inadvertently formed due to inaccuracies of the contact etching process ET3 and/or the LRM etching process ET4. However, even in this case, the gate spacer 260 would not be over-etched to form a tiger tooth-like recess, because the depth increasing in the wider gate contact opening O42 is slowed down during punching through the doped regions 3401 as discussed previously. Because the wider gate contact opening O42 has no or negligible tiger tooth-like recess, the risk of leakage current (e.g., leakage current between the source/drain contact and the gate contact subsequently formed in the gate contact opening O42) can be reduced. In some embodiments where the gate spacer 260 is a bi-layered structure, the notched gate spacer 260 has a stepped top surface structure, wherein a lower step of the stepped top surface structure is a top surface of the first spacer layer 262 recessed by the LRM etching process ET4, and an upper step of the stepped top surface structure is a top surface of the second spacer layer 264 not recessed by the LRM etching process ET4.

Figure 39A:
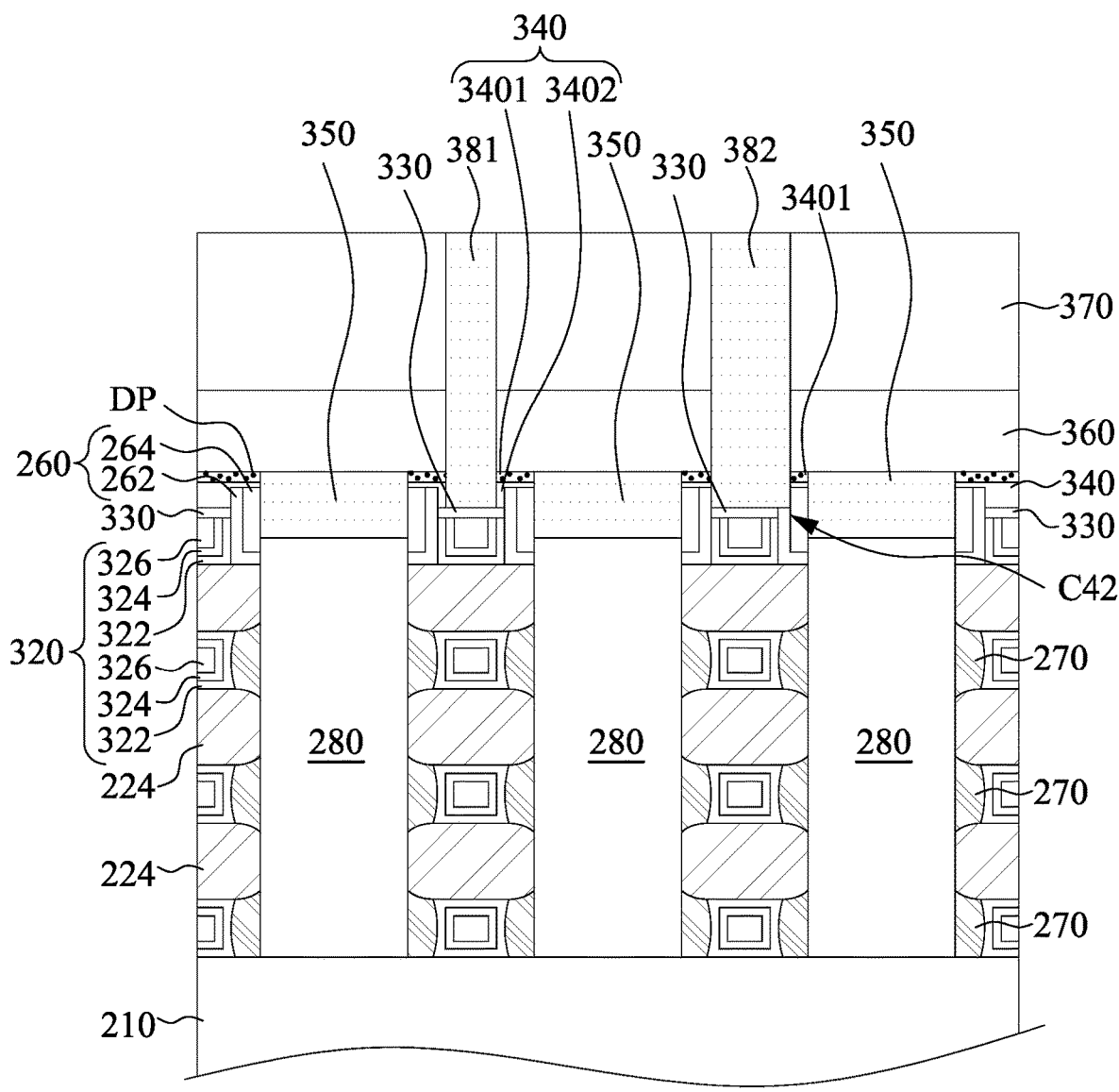

In FIG. 39A, a narrower gate contact 381 and a wider gate contact 382 are then formed respectively in the narrower gate contact opening O41 and the wider gate contact opening O42 to make electrical connection to the HKMG structures 320 through the gate metal caps 330. Materials and process details about the gate contacts 381 and 382 are similar to that of the gate contacts 151 and 152 discussed previously, and thus they are not repeated for the sake of brevity.

Figure 39B:
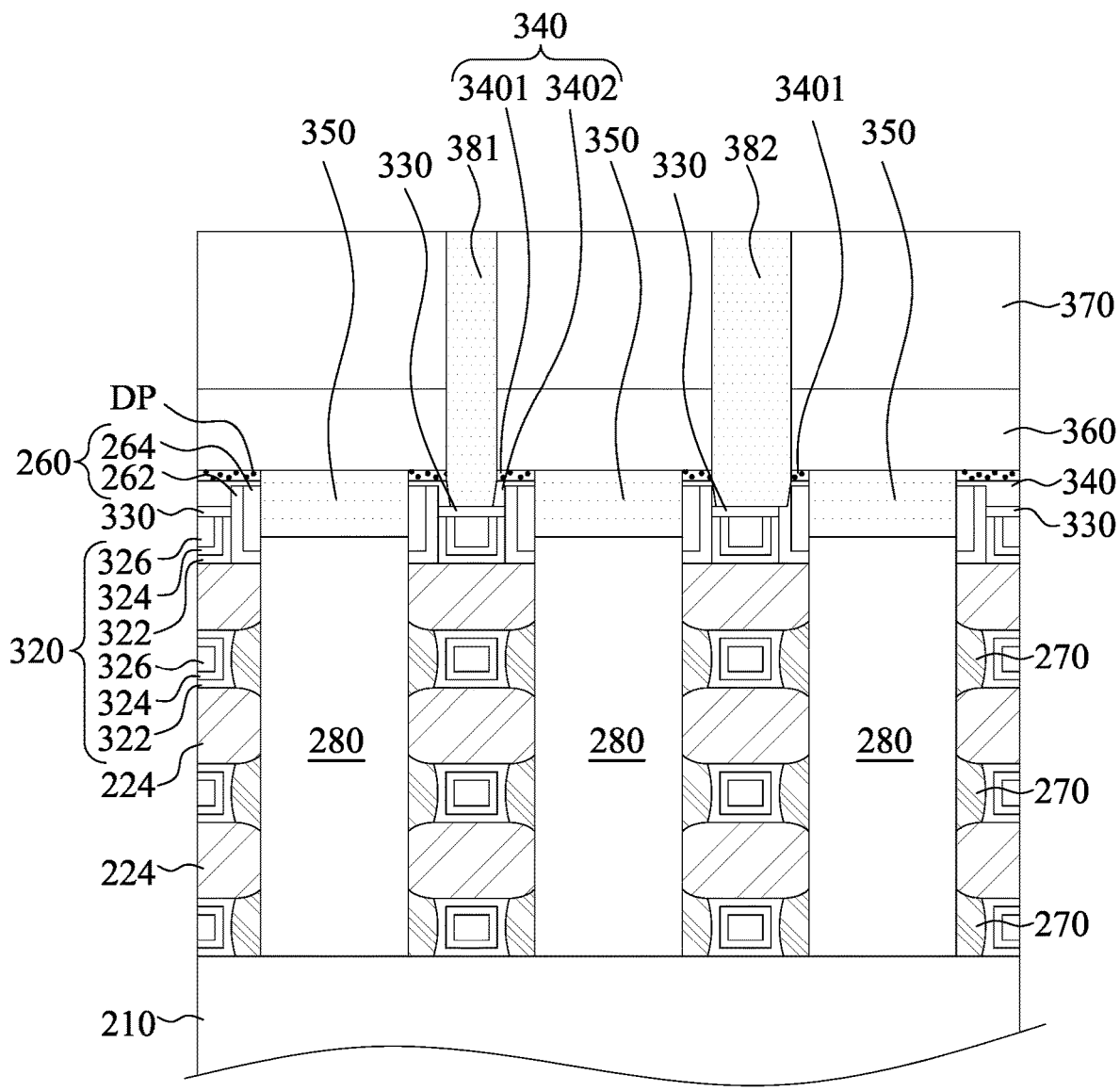

In some embodiments, the gate contacts 381 and 382 inherit the geometry of the gate contact openings O41 and O42 with vertical sidewall profile and no tiger tooth-like profile, and thus the gate contacts 381 and 382 also have vertical sidewall profile and no tiger tooth-like profile. In greater detail, the sidewalls of the gate contacts 381 and 382 extend linearly and vertically through an entire thickness of the ILD layer 370, an entire thickness of the MCESL 360, and an entire thickness of the doped regions 3401 of the dielectric caps 340, and an entire thickness of the un-doped regions 3402 of the dielectric caps 340, without a slope change. In some other embodiments as illustrated in FIG. 39B, the sidewalls of lower portions of the gate contacts 381 and 382 may become tapered because the LRM etching process ET4 may etch the un-doped regions 3402 of gate dielectric caps 340 at a faster vertical etch rate than etching the doped regions 3401, especially when the gate dielectric caps 340 are formed of the same material as the MCESL 360 (e.g., silicon nitride). In this scenario, the sidewalls of the gate contacts 381 and 382 may be more vertical (or steeper) within upper portions of the gate contacts 381 and 382 than within lower portions of the gate contacts 381 and 382, and the slope change in sidewalls of the gate contacts 381 and 382 may be located at interfaces between the doped regions 3401 and the un-doped regions 3402.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that the depth loading issue of gate contact openings can be alleviated. Another advantage is that the gate contact openings can have a more vertical sidewall profile. Another advantage is that the gate contact resistance can be reduced because the bottom surface area of the gate contact with the vertical sidewall profile can be increased as compared with a tapered gate contact. Another advantage is that the risk of leakage current (e.g., leakage current from gate contact to source/drain contact) can be reduced.

In some embodiments, a method comprises forming a gate structure between gate spacers and over a semiconductor substrate; etching back the gate structure to fall below top ends of the gate spacers; forming a gate dielectric cap over the etched back gate structure; performing an ion implantation process to form a doped region in the gate dielectric cap; depositing a contact etch stop layer over the gate dielectric cap and an ILD layer over the contact etch stop layer; performing a first etching process to form a gate contact opening extending through the ILD layer and terminating prior to reaching the doped region of the gate dielectric cap; performing a second etching process to deepen the gate contact opening, wherein the second etching process etches the doped region of the gate dielectric cap at a slower etch rate than etching the contact etch stop layer; and forming a gate contact in the deepened gate contact opening. In some embodiments, the second etching process etches an un-doped region of the gate dielectric cap at a faster etch rate than etching the doped region of gate dielectric cap. In some embodiments, the gate dielectric cap is formed of a same material as the contact etch stop layer. In some embodiments, the gate dielectric cap and the contact etch stop layer are nitride-based. In some embodiments, the ion implantation process implants oxygen germanium, argon, xenon, or boron into the gate dielectric cap. In some embodiments, the doped region in the gate dielectric cap has a higher oxygen concentration than the contact etch stop layer. In some embodiments, the doped region in the gate dielectric cap has a higher oxygen concentration than an un-doped region in the gate dielectric cap. In some embodiments, the method further comprises performing an annealing process on the gate dielectric cap after performing the ion implantation process. In some embodiments, the first etching process is a plasma etching process using a plasma generated from a hydrogen-free gaseous mixture. In some embodiments, the second etching process is a plasma etching process using a plasma generated from a hydrogen-containing gaseous mixture. In some embodiments, the hydrogen-containing gaseous mixture is a mixture of a fluorine-containing gas and a hydrogen gas. In some embodiments, the fluorine-containing gas is a $CHF_3$ gas, a $CF_4$ gas, or a combination thereof.

In some embodiments, a method comprises forming a first gate dielectric cap over a first gate structure and a second gate dielectric cap over a second gate structure; forming a first doped region in the first gate dielectric cap and a second doped region in the second gate dielectric cap; depositing a contact etch stop layer over the first and second gate dielectric caps, and an interlayer dielectric (ILD) layer over the contact etch stop layer; performing a first etching process to form a first gate contact opening and a second gate contact opening extending through the ILD layer such that the contact etch stop layer is exposed, wherein the first gate contact opening has a smaller width than the second gate contact opening; performing a second etching process on the contact etch stop layer to extend the first and second gate contact openings toward the first and second gate structures, wherein after the second etching process etches through the first doped region in the first gate dielectric cap, a sidewall profile of the first gate contact opening becomes more vertical than before etching the first doped region; and after performing the second etching process, forming a first gate contact in the first gate contact opening and a second gate contact in the second gate contact opening. In some embodiments, the first etching process results in the first gate contact opening having a smaller depth than the second gate contact opening. In some embodiments, after the second etching process etches through the first and second doped regions, a depth difference between the first and second gate contact openings becomes less than before etching the first and second doped regions. In some embodiments, the second etching process uses a gas mixture with a hydrogen gas, and the first etching process is free of the hydrogen gas.

In some embodiments, a device comprises source/drain epitaxial structures over a substrate, source/drain contacts respectively over the source/drain epitaxial structures, a gate structure laterally between the source/drain contacts, a gate dielectric cap over the gate structure and having opposite sidewalls respectively contacting the source/drain contacts, the gate dielectric cap having a doped region extending from a top surface of the gate dielectric cap into the gate dielectric cap, a contact etch stop layer extending across the source/drain contacts and the gate dielectric cap, an ILD layer over the contact etch stop layer, and a gate contact extending through the ILD layer, the contact etch stop layer, and the doped region of the gate dielectric cap to electrically connect with the gate structure. In some embodiments, the doped region of the gate dielectric cap has a higher oxygen-to-nitrogen atomic ratio than an un-doped region of the gate dielectric cap. In some embodiments, the doped region of the gate dielectric cap has an oxygen concentration gradient. In some embodiments, the doped region of the gate dielectric cap is thinner than the contact etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate structure between gate spacers and over a semiconductor substrate;
   etching back the gate structure to fall below top ends of the gate spacers;
   forming a gate dielectric cap over the etched back gate structure;
   performing an ion implantation process to form a doped region in the gate dielectric cap;
   depositing a contact etch stop layer over the gate dielectric cap and an interlayer dielectric (ILD) layer over the contact etch stop layer;
   performing a first etching process to form a gate contact opening extending through the ILD layer and terminating prior to reaching the doped region of the gate dielectric cap;
   performing a second etching process to deepen the gate contact opening, wherein the second etching process etches the doped region of the gate dielectric cap at a slower etch rate than etching the contact etch stop layer; and
   forming a gate contact in the deepened gate contact opening.

2. The method of claim 1, wherein the second etching process etches an un-doped region of the gate dielectric cap at a faster etch rate than etching the doped region in the gate dielectric cap.

3. The method of claim 1, wherein the gate dielectric cap is formed of a same material as the contact etch stop layer.

4. The method of claim 1, wherein the gate dielectric cap and the contact etch stop layer are nitride-based.

5. The method of claim 1, wherein the ion implantation process implants oxygen germanium, argon, xenon, or boron into the gate dielectric cap.

6. The method of claim 1, wherein the doped region in the gate dielectric cap has a higher oxygen concentration than the contact etch stop layer.

7. The method of claim 1, wherein the doped region in the gate dielectric cap has a higher oxygen concentration than an un-doped region in the gate dielectric cap.

8. The method of claim 1, further comprising:
   performing an annealing process on the gate dielectric cap after performing the ion implantation process.

9. The method of claim 1, wherein the first etching process is a plasma etching process using a plasma generated from a hydrogen-free gaseous mixture.

10. The method of claim 1, wherein the second etching process is a plasma etching process using a plasma generated from a hydrogen-containing gaseous mixture.

11. The method of claim 10, wherein the hydrogen-containing gaseous mixture is a mixture of a fluorine-containing gas and a hydrogen gas.

12. The method of claim 11, wherein the fluorine-containing gas is a CHF3 gas, a CF4 gas, or a combination thereof.

13. A method comprising:
   forming a first gate dielectric cap over a first gate structure and a second gate dielectric cap over a second gate structure;
   forming a first doped region in the first gate dielectric cap and a second doped region in the second gate dielectric cap;
   depositing a contact etch stop layer over the first and second gate dielectric caps, and an interlayer dielectric (ILD) layer over the contact etch stop layer;
   performing a first etching process to form a first gate contact opening and a second gate contact opening extending through the ILD layer such that the contact etch stop layer is exposed, wherein the first gate contact opening has a smaller width than the second gate contact opening;
   performing a second etching process on the contact etch stop layer to extend the first and second gate contact openings toward the first and second gate structures, wherein after the second etching process etches through the first doped region in the first gate dielectric cap, a sidewall profile of the first gate contact opening becomes more vertical than before etching the first doped region; and
   after performing the second etching process, forming a first gate contact in the first gate contact opening and a second gate contact in the second gate contact opening.

14. The method of claim 13, wherein the first etching process results in the first gate contact opening having a smaller depth than the second gate contact opening.

15. The method of claim 13, wherein after the second etching process etches through the first and second doped regions, a depth difference between the first and second gate contact openings becomes less than before etching the first and second doped regions.

16. The method of claim 13, wherein the second etching process uses a gas mixture with a hydrogen gas, and the first etching process is free of the hydrogen gas.

17. A device comprising:
   source/drain epitaxial structures over a substrate;
   source/drain contacts over the source/drain epitaxial structures, respectively;
   a gate structure laterally between the source/drain contacts;
   a gate dielectric cap over the gate structure and having opposite sidewalls respectively contacting the source/drain contacts, wherein the gate dielectric cap has a doped region extending from a top surface of the gate dielectric cap into the gate dielectric cap, and wherein the doped region of the gate dielectric cap has a higher oxygen-to-nitrogen atomic ratio than an un-doped region of the gate dielectric cap;
   a contact etch stop layer extending across the source/drain contacts and the gate dielectric cap;
   an interlayer dielectric (ILD) layer over the contact etch stop layer; and
   a gate contact extending through the ILD layer, the contact etch stop layer, and the doped region of the gate dielectric cap to electrically connect with the gate structure.

18. The device of claim 17, wherein the doped region of the gate dielectric cap has an oxygen concentration gradient.

19. The device of claim 17, wherein the doped region of the gate dielectric cap is thinner than the contact etch stop layer.

20. The device of claim 17, wherein the doped region of the gate dielectric cap is silicon nitride doped with oxygen.

* * * * *